(12) United States Patent
Reohr et al.

(10) Patent No.: US 12,744,079 B2
(45) Date of Patent: Sep. 22, 2026

(54) METHODS AND SYSTEMS FOR WRITING STATE INTO SUPERCONDUCTING CIRCUITS WITH INTEGRATED SEMICONDUCTOR-BASED CIRCUITS

(71) Applicant: William Robert Reohr, Severna Park, MD (US)

(72) Inventors: William Robert Reohr, Severna Park, MD (US); Oliver Timothy Oberg, Elkridge, MD (US)

(73) Assignee: William Robert Reohr, Severna Park, MD (US)

( * ) Notice: Subject to any disclaimer, the term of this patent is extended or adjusted under 35 U.S.C. 154(b) by 100 days.

(21) Appl. No.: 18/840,616

(22) PCT Filed: Mar. 22, 2023

(86) PCT No.: PCT/US2023/015910
§ 371 (c)(1),
(2) Date: Aug. 22, 2024

(87) PCT Pub. No.: WO2023/183391
PCT Pub. Date: Sep. 28, 2023

(65) Prior Publication Data

US 2025/0174270 A1 May 29, 2025

Related U.S. Application Data

(60) Provisional application No. 63/425,160, filed on Nov. 14, 2022, provisional application No. 63/322,694, filed on Mar. 23, 2022.

(51) Int. Cl.

| | |
|---|---|
| ***G11C 11/44*** | (2006.01) |
| ***G11C 8/10*** | (2006.01) |
| ***G11C 11/063*** | (2006.01) |

(52) U.S. Cl.
CPC ................ *G11C 11/44* (2013.01); *G11C 8/10* (2013.01); *G11C 11/063* (2013.01)

(58) Field of Classification Search
CPC ......... G11C 11/44; G11C 8/10; G11C 11/063; G11C 7/1096; G11C 8/08
(Continued)

(56) References Cited

U.S. PATENT DOCUMENTS

| | | |
|---|---|---|
| 5,253,199 A | 10/1993 | Gibson |
| 5,388,068 A | 2/1995 | Ghoshal et al. |

(Continued)

FOREIGN PATENT DOCUMENTS

| | | |
|---|---|---|
| JP | 2005039038 A * | 2/2005 |
| JP | 2010033620 A | 2/2010 |

(Continued)

OTHER PUBLICATIONS

Burnett et al. "Demonstration of Superconducting Memory for an RQL CPU" Proceedings of the International Symposium on Memory Systems (pp. 321-323) (2018).

(Continued)

*Primary Examiner* — Michael T Tran
(74) *Attorney, Agent, or Firm* — Myers Bigel, P.A.

(57) ABSTRACT

A write circuit for writing state into a plurality of superconducting memory cells includes a control circuit, a plurality of write lines, each of the write lines being associated with a corresponding column of the superconducting memory cells and being configured to convey a write column current, and a first plurality of non-superconducting switch devices. Each of the non-superconducting switch devices are integrated with a corresponding one of the write lines and are configured to receive a first control signal supplied by the control circuit for enabling the write column current to flow through the corresponding one of the write lines for writing (Continued)

state into a selected one of the superconducting memory cells associated with the corresponding one of the write lines.

22 Claims, 31 Drawing Sheets

(58) Field of Classification Search
USPC .................................................. 365/160, 170
See application file for complete search history.

(56) References Cited

U.S. PATENT DOCUMENTS

| | | | | |
|---|---|---|---|---|
| 9,520,181 | B1 | 12/2016 | Miller et al. | |
| 9,595,970 | B1 | 3/2017 | Reohr et al. | |
| 9,613,699 | B1 | 4/2017 | Reohr et al. | |
| 9,627,045 | B1 * | 4/2017 | Mukhanov | G11C 11/44 |
| 10,122,351 | B1 | 11/2018 | Naaman et al. | |
| 10,204,677 | B1 * | 2/2019 | Luo | G11C 11/44 |
| 10,262,727 | B2 * | 4/2019 | Przybysz | G01R 1/28 |
| 10,417,136 | B2 * | 9/2019 | Horner | G11C 7/1015 |
| 10,554,207 | B1 * | 2/2020 | Herr | H03K 19/195 |
| 10,622,977 | B2 | 4/2020 | Naaman et al. | |
| 10,650,884 | B2 | 5/2020 | Naaman | |
| 11,120,869 | B2 | 9/2021 | Naaman et al. | |
| 11,800,814 | B1 * | 10/2023 | Nevirkovets | G11C 11/161 |
| 2002/0014938 | A1 * | 2/2002 | Westphal | G01R 33/421 335/301 |
| 2002/0105948 | A1 * | 8/2002 | Glomb | H04L 49/25 370/386 |
| 2002/0176272 | A1 * | 11/2002 | DeBrosse | G11C 11/15 365/97 |
| 2005/0058128 | A1 * | 3/2005 | Carson | G06T 9/004 370/388 |
| 2010/0157552 | A1 * | 6/2010 | Thom | H01F 41/048 336/200 |
| 2011/0167241 | A1 | 7/2011 | Kirichenko et al. | |
| 2017/0229167 | A1 | 8/2017 | Reohr et al. | |
| 2018/0089102 | A1 | 3/2018 | Rozario et al. | |
| 2018/0189192 | A1 | 7/2018 | Diamand et al. | |
| 2019/0188596 | A1 | 6/2019 | Ipek et al. | |
| 2020/0028512 | A1 * | 1/2020 | Reohr | H03K 19/17736 |
| 2020/0090738 | A1 | 3/2020 | Naaman et al. | |
| 2020/0176662 | A1 * | 6/2020 | Dayton | H10N 60/35 |
| 2021/0397488 | A1 | 12/2021 | Hebbache et al. | |
| 2022/0102611 | A1 * | 3/2022 | Ambrose | H10N 69/00 |
| 2023/0037252 | A1 * | 2/2023 | Chen | G11C 11/161 |
| 2023/0136455 | A1 | 5/2023 | Reohr | |
| 2024/0005986 | A1 | 1/2024 | Reohr | |

FOREIGN PATENT DOCUMENTS

| | | | | |
|---|---|---|---|---|
| JP | 2018536250 A | 12/2018 | | |
| JP | 2021500694 A | 1/2021 | | |
| WO | WO-0230069 A1 * | 4/2002 | | H04L 45/583 |
| WO | 2008053677 A1 | 5/2008 | | |

OTHER PUBLICATIONS

Dayton et al. "Experimental Demonstration of a Josephson Magnetic Memory Cell With a Programmable π-Junction" IEEE Magnetics Letters, vol. 9 (Feb. 8, 2018).

Katam et al. "Superconducting Magnetic Field Programmable Gate Array" IEEE Transactions on Applied Superconductivity 28(2) (Mar. 2018).

Notification of Transmittal of the International Search Report and the Written Opinion of the International Searching Authority, or the Declaration, in corresponding PCT Application No. PCT/US2023/015910 (Aug. 14, 2023).

* cited by examiner

2100

Step 2101: An initialization may be performed, wherein at least one memory circuit is selected from a set of memory circuits for subsequent writing;

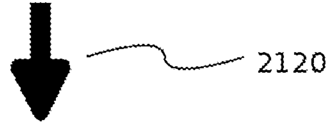

Step 2102: Move into place the (Bi)CMOS control signals for selecting the at least one memory circuit for a write operation;

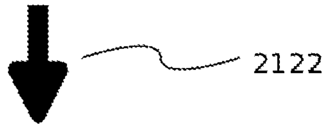

Step 2104: Source at least one current to write the selected at least one memory circuit to at least one state;

Step 2106: Read the at least one memory circuit using its superconducting circuits and transfer at least one read result into a different thermal layer;

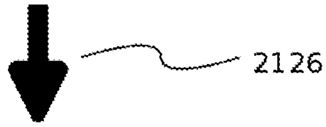

Step 2108: Verify stored state of the at least one memory cell is the at least one state. If identical (passed), move to final step 2112 in the case that the at least one memory cell is the final memory cell intended for a write operation or return to step 2102, choosing a next at least one memory cell for writing. If not identical (failed), move to step 2110;

2130 (passed)

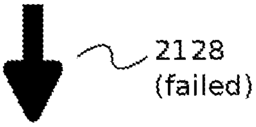

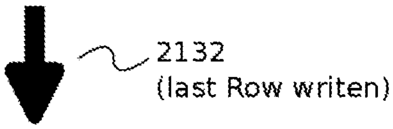

Step 2110: Failure options; and

Step 2112: Entity/entities ready for operation.

FIG. 21

METHODS AND SYSTEMS FOR WRITING STATE INTO SUPERCONDUCTING CIRCUITS WITH INTEGRATED SEMICONDUCTOR-BASED CIRCUITS

CROSS-REFERENCE TO RELATED APPLICATIONS

This application is a 35 U.S.C. § 371 national stage application of PCT Application No. PCT/US2023/015910, filed on Mar. 22, 2023, which claims the benefit of and priority to U.S. Provisional Patent Application No. 63/425,160, filed Nov. 14, 2022, entitled "Superconducting Memory, Programmable Logic Arrays, and Fungible Arrays," and U.S. Provisional Patent Application No. 63/322,694, filed Mar. 23, 2022, entitled "Control Logic, Buses, Memory and Support Circuitry for Reading and Writing Large Capacity Memories Within Superconducting Systems," the disclosures of which are incorporated by reference herein in their entirety for all purposes. The above-referenced PCT Application was published in the English language as International Publication No. WO 2023/183391A1 on Sep. 28, 2023.

BACKGROUND

The present invention relates generally to quantum and classical digital superconducting circuits and systems, and more particularly to circuits for writing superconducting memory circuits.

Superconducting digital technology has provided computing and/or communications resources that benefit from high speed and low power dissipation. For decades, superconducting digital technology has lacked random-access memory (RAM) with adequate capacity and speed relative to logic circuits. This has been a major obstacle to industrialization for current applications of superconducting technology in telecommunications and signal intelligence and can be especially forbidding for high-end and quantum computing.

Superconducting Josephson junctions with magnetic barriers, also referred to as magnetic Josephson junctions (MJJs), can serve as memory elements within MJJ-based RAMs, programmable logic arrays (PLAs), and field programmable gate arrays (FPGAs) of various types. MJJs rely on the oscillation of the relative Cooper pair phase with magnetic layer thickness to produce junctions that exhibit a Josephson phase of either zero or π, depending on the relative magnetic layer orientation. This binary phase switching characteristic of an MJJ can be exploited to create superconducting memory elements capable of storing a first logical state or a second logical state, which are associated with an appropriate choice of circulating currents in a first or second direction, or the lack of a circulating current, with the MJJ in the zero and/or π Josephson phase. Memory unit elements can be arranged in arrays with read and write lines to create an addressable memory fabricated, for example, on an integrated circuit (IC) chip that can be cooled to cryogenic temperatures (e.g., around four degrees Kelvin).

MJJ-based RAM appears to be one important approach to making cost-sensitive memory (i.e., dense, high-capacity memory) for superconducting systems commercially viable and is thus being actively developed. No functional demonstration of MJJ-based RAM, in its entirety, has been reported to date. Instead, one-off demonstrations of core circuits are being gradually revealed. The highest level of technology integration of it currently reported appears in a paper entitled, "Experimental Demonstration of a Josephson Magnetic Memory Cell With a Programmable π-Junction," by Ian Dayton et. al., *IEEE Magnetics Letters*, Vol. 9, Feb. 8, 2018 (hereinafter "Dayton 2018"), the disclosure of which is incorporated by reference herein in its entirety.

Another exclusively Josephson junction-based memory is described in "Superconducting Non-destructive Readout Circuits," U.S. Pat. No. 10,554,207 by Herr, A. Many other forms of memory exist. All these memories could benefit if the reliability of their write operation increased, or the chip area devoted to their write circuitry decreased.

SUMMARY

The present invention, as manifested in one or more embodiments, is directed to illustrative systems, circuits, devices and/or methods for enabling the reliable writing of superconducting memory circuits containing both magnetic Josephson junctions (MJJs) and Josephson junctions or memory circuits containing Josephson junctions exclusively which, along with non-superconducting (e.g., bipolar and/or complementary metal-oxide semiconductor (Bi)CMOS) write circuits, form an underlying hybrid circuit and methods for writing random-access memories (RAMs), and programming and/or enabling one or more functions of superconducting programmable logic arrays (PLAs), field-programmable gate arrays (FPGAs), and π-junction circuits, among other applications.

In accordance with an embodiment of the present invention, a write circuit for writing state into a plurality of superconducting memory cells includes a control circuit, a plurality of write lines, each of the write lines being associated with a corresponding column of the superconducting memory cells and being configured to convey a write column current, and a first plurality of non-superconducting switch devices. Each of the non-superconducting switch devices are integrated with a corresponding one of the write lines and are configured to receive a first control signal supplied by the control circuit for enabling the write column current to flow through the corresponding one of the write lines for writing state into a selected one of the superconducting memory cells associated with the corresponding one of the write lines.

In accordance with another embodiment of the invention, a write circuit for writing state into a superconducting memory cell includes a first non-superconducting switch, a second non-superconducting switch, a first radio frequency (RF) superconducting quantum interference device (SQUID) connected in series with the first non-superconducting switch, and a second RF SQUID connected in series with the second non-superconducting switch. The write circuit further includes a first Josephson transmission line (JTL) having an input connected to the first RF SQUID and an output connected to the superconducting memory cell, and a second JTL having an input connected to the second RF SQUID and an output connected to the superconducting memory cell. The first non-superconducting switch and the first RF SQUID are connected between first and second terminals of a first write current source via first and second interconnections, respectively, and the second non-superconducting switch and the second RF SQUID are connected between first and second terminals of a second write current source via third and fourth interconnections.

In accordance with yet another embodiment of the invention, a superconducting memory circuit for reading and writing a plurality of MJJ-based memory cells includes at least one superconducting read circuit operatively coupled to the plurality of MJJ-based memory cells. The superconducting read circuit comprises at least a first current source and at least a first non-superconducting switch circuit connected to one or more corresponding row lines and column lines associated with the memory cells. The read circuit is configured to selectively apply, via the first non-superconducting switch circuit, a read current generated by the first current source along at least one of the row and column lines for reading a state of at least one of the MJJ-based memory cells during a read operation. The superconducting memory circuit further includes a non-superconducting write circuit operatively coupled to the plurality of MJJ-based memory cells, the non-superconducting write circuit including at least a second current source and at least a second non-superconducting switch circuit connected to the one or more corresponding row lines and column lines associated with the memory cells. The write circuit is configured to selectively apply, via the second non-superconducting switch circuit, a write current generated by the second current source along at least one of the row and column lines for writing state into at least one of the MJJ-based memory cells during a write operation.

In accordance with still another embodiment of the invention, a write circuit for selectively writing state into a plurality of superconducting memory cells in a random-access memory comprises at least one superconducting column write circuit, the superconducting column write circuit being connected to one or more write column lines, each of the write column lines being configured to convey a write column line current. The column write circuit includes at least one superconducting switch circuit configured to selectively apply the write column current to at least a given one of the write column lines for writing state into one or more corresponding memory cells of the plurality of superconducting memory cells associated with the given one of the write column lines in response to at least a first control signal. The write circuit further comprises at least one non-superconducting row write circuit, the non-superconducting row write circuit being connected to one or more write row lines, each of the write row lines being configured to convey a write row line current. The row write circuit includes at least one non-superconducting switch circuit configured to selectively apply the write row current to at least a given one of the write row lines for selecting one or more corresponding memory cells of the plurality of superconducting memory cells associated with the given one of the write row lines in response to at least a second control signal.

In accordance with an embodiment of the invention, a write circuit for selectively writing state into a plurality of superconducting memory cells in a random-access memory comprises at least one non-superconducting column write circuit, the non-superconducting column write circuit being connected to one or more write column lines, each of the write column lines being configured to convey a write column line current. The column write circuit includes at least a first non-superconducting switch circuit configured to selectively apply the write column current to at least a given one of the write column lines for writing state into one or more corresponding memory cells of the plurality of superconducting memory cells associated with the given one of the write column lines in response to at least a first non-superconducting control signal. The write circuit further comprises at least one non-superconducting row write circuit, the non-superconducting row write circuit being connected to one or more write row lines, each of the write row lines being configured to convey a write row line current. The row write circuit includes at least a second non-superconducting switch circuit configured to selectively apply the write row current to at least a given one of the write row lines for selecting one or more corresponding memory cells of the plurality of superconducting memory cells associated with the given one of the write row lines in response to at least a second non-superconducting control signal.

First and second conversion circuits are further included in the write circuit. The first conversion circuit is configured to receive a superconducting encoded write address and to generate the first non-superconducting control signal(s) as a function of the superconducting encoded write address. The second conversion circuit is configured to receive a superconducting data signal and to generate the second non-superconducting control signal(s) as a function of the superconducting data signal.

Techniques of the present invention can provide substantial beneficial technical effects. These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 21 is a flow diagram depicting at least a portion of an exemplary method for writing MJJs, according to one or more embodiments of the present invention;

Figure 1:
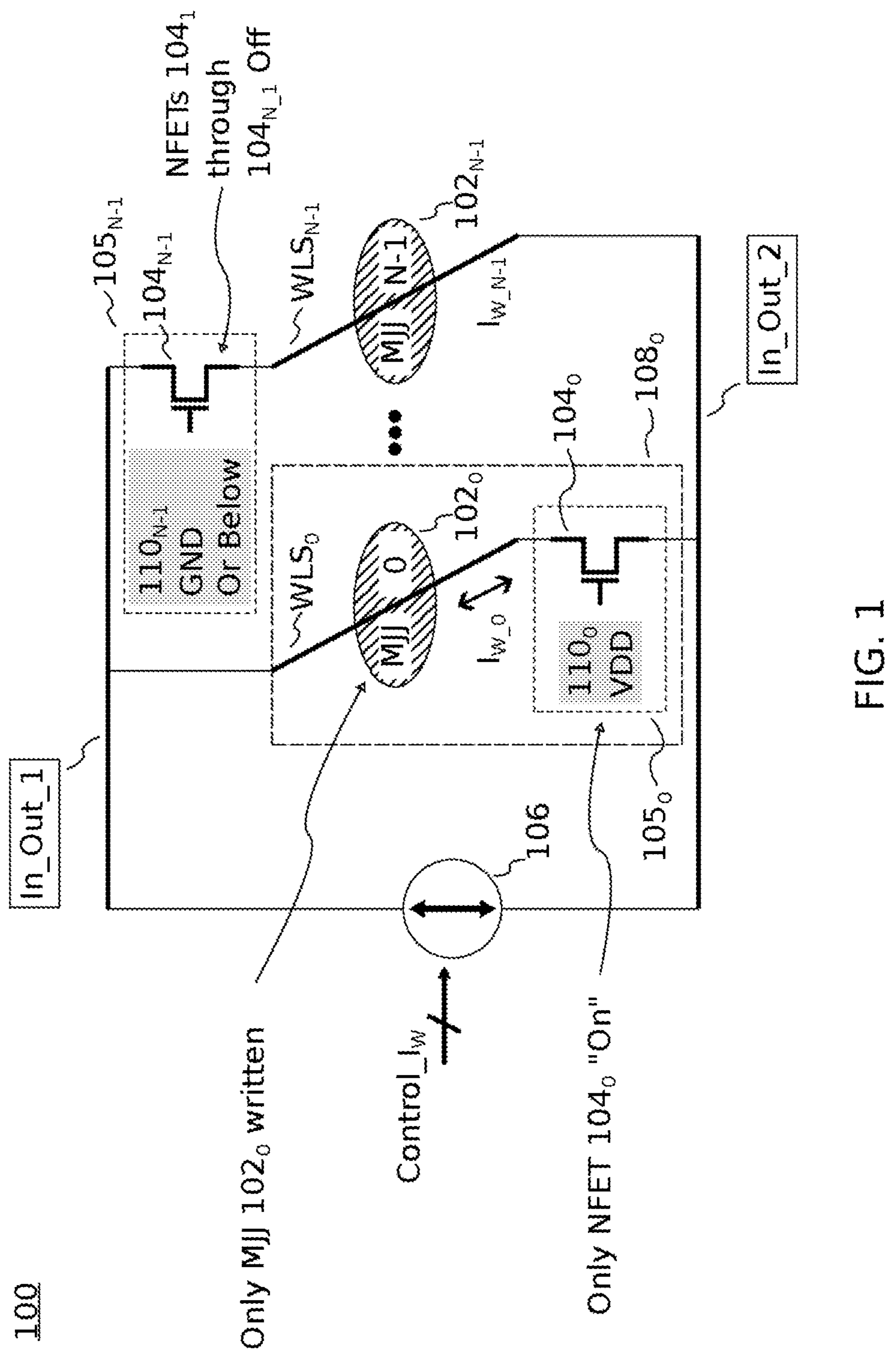
FIG. 1 is a schematic diagram conceptually depicting at least a portion of an exemplary MJJ write circuit, according to one or more embodiments of the present invention.

It is to be appreciated that elements in the figures are illustrated for simplicity and clarity. Common but well-understood elements that may be useful or necessary in a commercially feasible embodiment are not necessarily shown in order to facilitate a less hindered view of the illustrated embodiments.

DETAILED DESCRIPTION

Principles of the present invention, as manifested in one or more embodiments, will be described herein in the context of illustrative systems, circuits, devices and/or methods for enabling the reliable writing of superconducting memory circuits (i.e., memory cells) containing both magnetic Josephson Junctions (MJJs) and Josephson junctions or ones containing Josephson junctions exclusively which, along with complementary metal-oxide semiconductor (Bi) CMOS write circuits, form an underlying hybrid circuit and methods for writing random-access memories (RAMs), and programming and/or enabling one or more functions of superconducting programmable logic arrays (PLAs), field-programmable gate arrays (FPGAs), and π-junction circuits, among other applications. It is to be appreciated, however, that the invention is not limited to the specific devices, circuits and/or methods illustratively shown and described herein. Rather, it will become apparent to those skilled in the art given the teachings herein that numerous modifications can be made to the embodiments shown that are within the scope and spirit of the present disclosure. That is, no limitations with respect to the embodiments shown and described herein are intended or should be inferred.

In this detailed description, the term "MJJ" (magnetic Josephson junction) as used herein can refer to a programmable junction containing a magnetic spin valve having a free magnetic layer and a fixed magnetic layer, while the term "π-Junction" as used herein can refer broadly to a junction containing only a single magnetic layer, with a fixed π phase shift. Furthermore, the terms "0-state," "positive π-state," and "negative π-state" as used herein are intended to refer broadly to the respective states of MJJ layer orientations and circulating or non-circulating states of the circuit, which may be used to store a first logical state and a second logical state in some combination appropriate to the use and operation of a memory cell incorporating such MJJ device(s); to the degree that such states are intentional/stable states of the circuit, any pair of states can be used to represent the first and second logical states.

In general, microwave signals, such as, for example, single flux quantum (SFQ) pulses, may be used to control the state of a memory cell in a memory array. During read/write operations, word-lines and bit-lines may be selectively activated by SFQ pulses, or reciprocal quantum logic (RQL) pulses arriving via an address bus and via independent read and write control signals. These pulses may, in turn, control word-line and bit-line driver circuits adapted to selectively provide respective word-line and bit-line currents to the relevant memory cells in the memory array.

The embodiments of the present invention are directed to reliable write operations of (i) MJJ-based circuits, which include both Josephson junctions (JJs) and magnetic Josephson junctions, and (ii) JJ-only circuits, which include Josephson junctions but not magnetic Josephson junctions. The write circuits for MJJ-based circuits will be discussed first and more extensively than the JJ-only circuits. Circuit topologies underlying write circuits for MJJ-based circuits can, with minimal modification, also be applied to write circuits for JJ-only circuits (e.g., as can be contemplated for a revision of FIG. 20), as will be described in further detail below, to write JJ-only memory cells.

The terms "memory cell" and "memory circuit," as used herein, are intended to broadly describe partially or fully superconducting memory cells; these terms are essentially synonymous with one another and therefore may be used interchangeably herein. As known in the art, a "memory cell" can perform logic or other circuit functions, or can become an integral part of a logic operation.

Where a distinction may be made between a memory element and a memory circuit, the memory circuit always includes additional elements (e.g., field-effect transistors (FETs), inductors, etc.) relative to the memory element (e.g., an MJJ), which just records state.

Many alternative MJJs and corresponding write operations (e.g., involving the application of magnetic fields, seeding of π-currents, or spin injection) have been devised for MJJs since their discovery. The illustrative circuits according to one or more embodiments described herein deliver currents in various ways to support these write operations (but not single flux quantum. Thus, the write operations themselves, being known in the art, will be supported principally by reference. Only the flexibility of aspects of the present disclosure in reliably writing MJJ-based superconducting circuits will be described with reference to exemplary embodiments.

It should be noted that read operations of the exemplary memory cells discussed herein are generally known by those skilled in the art and therefore will not be discussed in detail herein. It is be appreciated that memory cells suitable for use with embodiments of the present disclosure have evolved based at least in part on certain references, some of which are identified and incorporated by reference herein, as well as other references not explicitly mentioned.

While many figures may display a regular array of memory cells, such arrangement(s) of memory cells are not intended to be limiting. Other superconducting circuits can occupy regions, having locations within a region containing the memory cells (e.g., rows and columns), where memory cells have been omitted.

The term "bipolar CMOS ((Bi)CMOS)" is generally used in the art to refer to the integration of two semiconductor technologies; namely, bipolar technology, used to form bipolar junction transistors (BJTs), and CMOS technology, used to form CMOS logic gates, etc. Thus, by using (Bi) CMOS technology, BJTs and CMOS logic gates can be integrated into a single integrated circuit (IC) device. However, the term "(Bi)CMOS" as used herein throughout the present disclosure is intended to refer more broadly to the inclusion of any non-superconducting semiconductor device component, including, but not limited to, field-effect transistors (FETs), BJTs, resistors, inductors, capacitors, diodes, etc., rather than referring only to a mixed CMOS and BJT circuit integration technology.

In general, the ability to generate signals within superconducting circuits using room temperature electronics is known. Such room temperature electronics commonly utilize CMOS circuitry to generate and control signals, which are driven into a cold/superconducting environment. Certain embodiments will describe a utilization of (Bi)CMOS circuitry in a cold superconducting space. A write circuit according to one or more embodiments of the present disclosure may involve both room temperature electronics and (Bi)CMOS circuitry co-located (integrated) with superconducting circuits on a chip/die for writing an array of superconducting memory circuits or superconducting memory cells. This write circuit can be useful for read-only superconducting memory arrays (ROMs) which would utilize a (Bi)CMOS write mechanism infrequently, after which a large number of reads are performed within the superconducting domain.

A Josephson magnetic random-access memory (JMRAM) circuit can include an array of JMRAM memory cells that each includes a phase hysteretic MJJ that can be configured as comprising ferromagnetic materials in an associated barrier. As an example, the MJJ can be configured as a junction switchable between a zero-phase state and a π-phase state that is configured to generate a superconducting phase based on the digital state stored therein. The JMRAM memory cells can also each include at least one Josephson junction (e.g., a pair of Josephson junctions in parallel with the MJJ). The basic element in SFQ, RQL, and JMRAM circuits is the Josephson junction, which emits a voltage-time spike with an integrated amplitude equal to the flux quantum ($\Phi_0$) when the current through the Josephson junction exceeds a critical current, wherein the developed voltage opposes the current flow.

Illustrative embodiments of the present invention are beneficially suitable for use with conventional MJJs (e.g., of conventional memory cells) switched/written (i) exclusively with magnetic fields, and (ii) with a combination of a magnetic field selection and phase-based torque.

The MJJ can be configured to store a digital state corresponding to one of a first logical state (e.g., logic-1) or a second logical state (e.g., logic-0) in response to a write-word current and a write-bit current associated with the MJJ. For instance, the first logical state may correspond to a positive π-state, in which a superconducting phase is exhibited. As an example, the write-word and write-bit currents can each be provided on an associated (e.g., coupled to the MJJ) write-word line (abbreviated WWL; synonymous terms include "write row line" or "row write line") and an associated write-bit line (abbreviated WBL; synonymous terms include "write column line" or "write column line") and together can set the logical state of a selected MJJ. As the term is used herein, a "selected" MJJ is intended to refer broadly to an MJJ selected for writing among a plurality of MJJs by activating current flow in its associated write-bit line WBL. Its digital state is written by a positive or negative current flow within its associated write-bit line (for all known/postulated MJJs except a "toggle" MJJ). Moreover, to prevent the MJJ being set to an undesired negative π-state, the MJJ may include a directional write element that is configured to generate a directional bias current through the MJJ during a data-write operation. Thus, the MJJ can be forced into the positive z-state to provide the superconducting phase in a predetermined direction.

In addition, the MJJ in each of the JMRAM memory cells in the array can provide an indication of the stored digital state in response to a read-word current and a read-bit current. The superconducting phase can thus lower a critical current associated with at least one Josephson junction of each of the JMRAM memory cells of a row in the array. Therefore, the read-bit current and a derivative of the read-word current (induced by the read-word current flowing through a transformer) can be provided, in combination, (i) to trigger the Josephson junction(s) to change a voltage on an associated read-bit line if the MJJ stores a digital state corresponding to the first logical state, and (ii) not to trigger if the MJJ stores a digital state corresponding to the second logical state. Thus, the read-bit line can have a voltage present the magnitude of which varies based on whether the digital state of the MJJ corresponds to the first logical state logic-1 or the second logical state logic-0 (e.g., between a non-zero and a zero amplitude). As used herein, the term “trigger” with respect to Josephson junctions is intended to refer broadly to the phenomenon of the Josephson junction generating a discrete voltage pulse in response to current flow through the Josephson junction exceeding a prescribed critical current level.

Singular Cell to Twin/Few Cells Write Circuit

FIG. 1 is a schematic diagram conceptually depicting at least a portion of an exemplary MJJ write circuit 100, according to one or more embodiments of the present disclosure. The MJJ write circuit 100 beneficially provides a reliable, process variation-resistant mechanism for programming (i.e., writing) the phases (e.g., states) of MJJs in MJJ-based circuits. With reference to FIG. 1, the MJJ write circuit 100 includes a plurality of MJJ cells, $\mathbf{102}_0$ through $\mathbf{102}_{N-1}$, each MJJ cell being associated with a unique corresponding write line segment (WLS) line, $WLS_0$ through $WLS_{N-1}$, respectively, where N is an integer greater than one. The WLS associated with a given MJJ is preferably oriented at an angle with respect to a major axis of the MJJ, rather than arranged orthogonally relative to the major axis, as the WLS passes over and proximate to a free layer of the MJJ. As will be known by those skilled in the art, an MJJ is generally formed in the shape of an ellipse having a major axis and a minor axis, with the major axis being longer than, and perpendicular to, the minor axis of the ellipse.

Each MJJ-based memory circuit 100 preferably includes, at least one MJJ, MJJ_0 through MJJ_N−1, at least one WLS, $WLS_0$ through $WLS_{N-1}$, and at least one transistor, which may be an π-channel FET (NFET) device (e.g., an π-channel metal-oxide semiconductor field-effect transistor (MOSFET)), NFET $\mathbf{104}_0$ through $\mathbf{104}_{N-1}$, respectively, connected in series with the corresponding WLS to selectively connect the WLS to a current source 106. In one or more embodiments, the current source 106 is an analog current source programmable to generate a positive or a negative current (i.e., bidirectional) of a prescribed amplitude, $I_W$, which determines the state—zero-phase state or π-phase state—of a selected MJJ, through wires into and out of a bus or other interconnect (e.g., In_Out_1, In_Out_2) of the selected WLS and corresponding selected FET $\mathbf{104}_0$, $\mathbf{104}_{N-1}$.

In one or more alternative embodiments, the current source 106 may be configured to generate a current in one direction only, and a control circuit, such as an H-bridge or the like, may be employed in conjunction with the current source 106 to selectively change a direction of the current $I_W$ flowing through the WLS, as will become apparent to those skilled in the art. In some embodiments, an H-bridge circuit may be incorporated into the current source 106 to form a bidirectional current source. Furthermore, the transistors $\mathbf{104}_0$ through $\mathbf{104}_{N-1}$ used to selectively connect the WLS lines to the interconnects In_Out_1 and/or In_Out_2 may include a first subset of top transistors (e.g., $\mathbf{104}_{N-1}$), each connecting a first one of the interconnects In_Out_1 to a corresponding WLS, and a second subset of bottom transistors (e.g., $\mathbf{104}_0$), each connecting a second one of the interconnects In_Out_2 to a corresponding WLS. In other embodiments, a given WLS may include both top and bottom transistors. The dashed lines $\mathbf{105}_0$ through $\mathbf{105}_{N-1}$ are included to indicate a generalized current switch that can be implemented with (Bi)CMOS circuit elements, such as BJTs or a combination of FETs and BJTs, and may include the first and second subset of transistors along with the corresponding WLS lines in the MJJ-based circuit 100. For clarity, only one MJJ write circuit is shown in FIG. 1, although it is to be appreciated that embodiments of the invention are not limited to the specific arrangement shown. When one of the transistors is active (i.e., turned on or enabled), such as transistor $\mathbf{104}_0$, the remaining N−1 transistors are preferably inactive (i.e., turned off or disabled), such as transistors $\mathbf{104}_1$ through $\mathbf{104}_{N-1}$.

For experienced magnetic random-access memory (MRAM) researchers/designers, the illustrative MJJ write circuit 100 conceptualizes a circuit for, and a novel approach to, writing one MJJ at a time with the assistance of at least a magnetic field defined by a room temperature analog current source 106, according to one or more embodiments. The current source 106 can be programmed to supply a specific positive or a specific negative current—unique with respect to the positive one—that generates positive and negative fields, respectively, on a free layer of a selected MJJ to selectively write a logical state of “1” or “0” to the MJJ (defined by π-phase and zero-phase states of the MJJ, respectively).

By way of example only and without limitation, in the exemplary MJJ write circuit 100, a first end of $WLS_0$ is connected to a first interconnect In_Out_1, a second end of $WLS_0$ is connected to a first drain/source of corresponding FET $\mathbf{104}_0$, and a second source/drain of FET $\mathbf{104}_0$ is connected to a second interconnect In_Out_2. Similarly, a first end of $WLS_{N-1}$ is connected to a first source/drain of corresponding FET $\mathbf{104}_{N-1}$, a second end of $WLS_{N-1}$ is connected to the second interconnect In_Out_2, and a second source/drain of FET $\mathbf{104}_{N-1}$ is connected to the first interconnect In_Out_1. It is to be understood that embodiments of the invention are not restricted to the specific arrangement of WLS and MJJ connections shown in FIG. 1. For example, although the MJJ write circuit 100 is shown having alternating top and bottom switches (e.g., FETs) for connecting the first and second interconnects to corresponding WLS lines, other embodiments may employ only bottom switches, or only top switches, or both top and bottom switches for connecting the WLS lines with the first and second interconnects.

Only one MJJ is selected for writing at a given time in the exemplary MJJ write circuit 100. Thus, when one FET is active (i.e., turned “on”) to thereby direct the current $I_W$ nearby a selected MJJ associated with that WLS, the remaining FETs in the MJJ write circuit 100 are inactive (i.e., turned off). Each of the FETs $\mathbf{104}_1$ through $\mathbf{104}_{N-1}$ is selectively activated by the application of a corresponding control signal, $\mathbf{110}_0$ through $\mathbf{110}_{N-1}$, respectively, to a gate of the corresponding FET. For example, during a write operation directed to MJJ $\mathbf{102}_0$, the corresponding FET $\mathbf{104}_0$ is turned on by application of an appropriate control signal to the gate of FET $\mathbf{104}_0$ while the remaining FETs $\mathbf{104}_1$ through $\mathbf{104}_{N-1}$ are turned off. Thus, assuming n-type FETs (NFETs) are employed, the control signal $110_0$ applied to the gate of FET $104_0$ for writing $MJJ_0$ may be VDD, while the control signals $110_1$ through $110_{N-1}$ applied to the gates of FETs $104_1$ through $104_{N-1}$, respectively, may be ground (GND). The control signals $110_0$ through $110_{N-1}$ used to drive the gates of the FETs $104_0$ through $104_{N-1}$ can be generated by any known CMOS circuit (e.g., logic gate, shift register latch, etc.).

It is to be appreciated that the location of the FET in series with a given WLS is not critical; that is, the FET may be connected below (i.e., downstream of) the corresponding MJJ, as in the case for FET $104_0$, or the FET may be connected above (i.e., upstream of) the corresponding MJJ, as in the case for FET $104_{N-1}$. Moreover, although only one FET is shown connected in series with each WLS, multiple FETs (e.g., above and below each MJJ) may also be employed for selectively connecting a given WLS line to the first and second interconnects, as will become apparent to those skilled in the art given the teachings herein.

Figure 2:
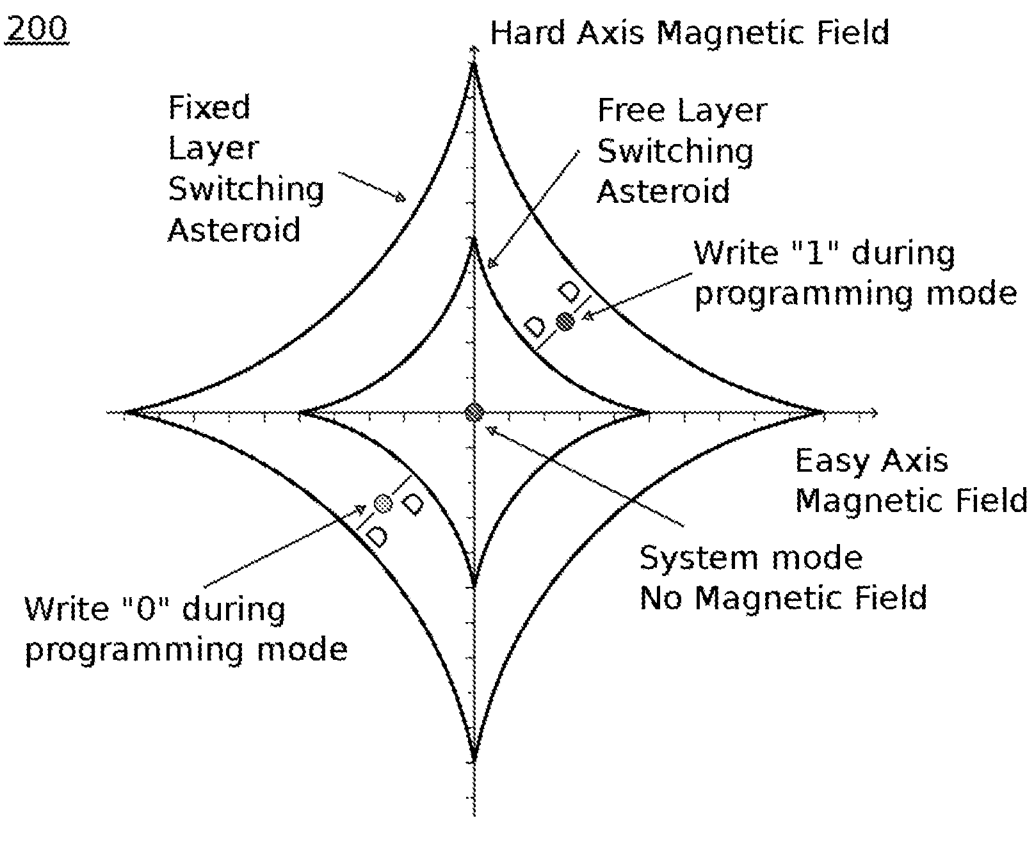
FIG. 2 conceptually depicts ideal Stoner-Wohlfarth switching asteroids associated with each of at least a subset of the MJJs in the exemplary MJJ write circuit of FIG. 1.

FIG. 2 conceptually depicts ideal Stoner-Wohlfarth switching asteroids associated with each of at least a subset of the MJJs in the exemplary MJJ write circuit 100 of FIG. 1. As known in the art, the Stoner-Wohlfarth model is the simplest model that adequately describes the magnetization reversal of nanoscale systems that are small enough to contain single magnetic domains. In FIG. 2, a hard axis magnetic field is represented by they-axis, and an easy axis magnetic field is represented by the x-axis. The Stoner-Wohlfarth asteroid is essentially a polar plot indicating the reversal magnetic field under the assumption of coherent reversal. With reference to FIG. 2, a smaller (normalized magnitude±0.5) free layer switching asteroid is shown centered about the origin, and a larger (normalized magnitude±1.0) fixed layer switching asteroid is shown centered about the origin and surrounding (i.e., concentric with) the free layer switching asteroid. The free layer and fixed layer switching asteroids shown in FIG. 2 are simplified in that they ignore interactions between free and fixed layers of the MJJ, which would otherwise create an offset of the asteroid from the origin.

A boundary line of the switching asteroid represents magnetic field points on the curve beyond which an MJJ will switch its phase (which in certain write approaches represents a switching of state, as known in the art). Thus, for the free layer of the MJJ, magnetic fields having geometrically combined hard-axis and easy-axis amplitude less than the free layer switching asteroid will not switch the state of the MJJ, and magnetic fields having a geometrically combined magnitude greater than the free layer switching asteroid boundary will switch the state of the MJJ (such as the write "1" and write "0" programming magnetic field points shown in FIG. 2). However, the write "1" and write "0" programming magnetic field points will not switch the state of the fixed layer, since the fall within the switching asteroid boundary of the fixed layer. In one or more embodiments, the write "1" and write "0" programming magnetic fields are generated by the MJJ write circuit 100 shown in FIG. 1.

In the illustration of FIG. 2, the write "1" and write "0" programming magnetic fields are disposed between the respective boundaries of the free and fixed layer switching asteroids. A distance, D, between the magnetic field point and either the free layer or fixed layer switching asteroid boundary represents a design margin of the MJJ write circuit. Thus, in order to maximize the design margin (D), the MJJ write circuit 100 is preferably configured to generate a write current $I_W$ such that the magnetic field point lies midway between the free layer and fixed layer switching asteroid boundaries.

Figure 3:
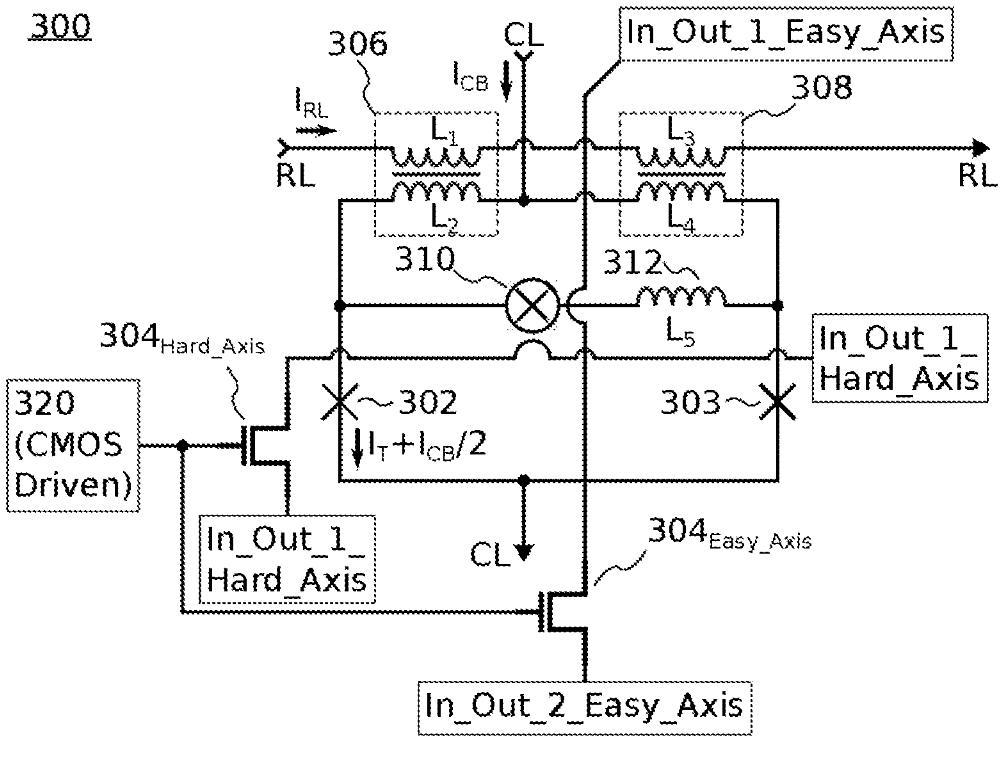
FIG. 3 shows a schematic diagram depicting at least a portion of an exemplary MJJ-based memory circuit 300 with integrated write FET(s), according to one or more embodiments of the present invention.

FIG. 3 is a schematic diagram depicting at least a portion of an exemplary MJJ-based memory circuit 300 with integrated write FET(s), according to one or more embodiments of the present disclosure. The exemplary MJJ-based memory circuit 300 includes at least one MJJ 310, a plurality of Josephson junctions 302 and 303, an inductor 312, and at least one transformer, shown here as a plurality of transformers 306 and 308 (in a preferred symmetrical arrangement). A read and write operation of a similar MJJ-based circuit is described in Dayton 2018, and thus the read and write operations will not be described in further detail herein. In contrast to the MJJ-based circuit described in Dayton 2018, however, the MJJ-based memory circuit 300 comprises a plurality of switches, which may be implemented, in some embodiments, using FETs $304_{Easy\_Axis}$, $304_{Hard\_Axis}$; more generally speaking, non-superconducting (e.g., (Bi)CMOS) switches $304_{Easy\_Axis}$, $304_{Hard\_Axis}$. An integrated write circuit portion of the MJJ-based memory circuit 300 may be implemented using the illustrative write circuit 1100 shown in FIG. 11, which will be described in further detail herein below.

With continued reference to FIG. 3, the integrated write circuit portion of the MJJ-based memory circuit 300 preferably includes an easy axis write line passing in proximity to the MJJ 310 and between a first terminal (e.g., drain) of the FET $304_{Easy\_Axis}$ and a first interconnect terminal, In_Out_1_Easy_Axis. A second terminal (e.g., source) of the FET $304_{Easy\_Axis}$ may be connected to a second interconnect terminal, In_Out_2_Easy_Axis, and a gate of the FET $304_{Easy\_Axis}$ is preferably adapted to receive a first control signal, 320, which may be CMOS driven.

The integrated write circuit portion of the MJJ-based memory circuit 300 further preferably includes a hard axis write line passing in proximity to the MJJ 310 and may be arranged orthogonal to the easy axis write line. The hard axis write line may be connected between a first terminal (e.g., drain) of the FET $304_{Hard\_Axis}$ and a third interconnect terminal, In_Out_1_Hard_Axis. A second terminal (e.g., source) of the FET $304_{Hard\_Axis}$ may be connected to a fourth interconnect terminal, In_Out_2_Hard_Axis, and a gate of the FET $304_{Easy\_Axis}$ is preferably adapted to receive the first control signal, 320.

Figure 4:
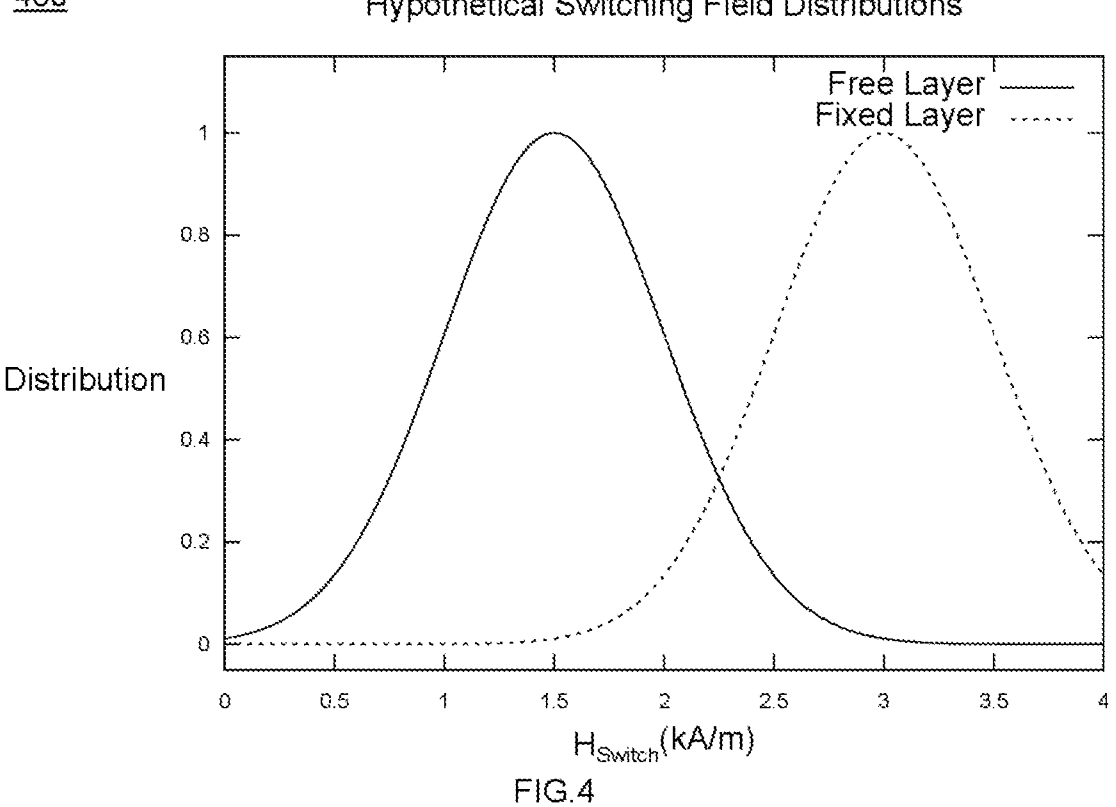
FIG. 4 is a graph conceptually depicting hypothetical switching field distributions for the fixed and free layers of MJJs in a large number of MJJ-based circuits.

FIG. 4 is a graph conceptually depicting hypothetical switching field distributions for the fixed and free layers of MJJs in a large number of MJJ-based circuits. If the distributions for MJJs in a row overlap, as is the case for the exemplary distributions shown in FIG. 4, then one cannot find a unique value of the switching field that will switch all of the free layers of the MJJs associated with the row without also switching the fixed layers of some MJJs in that row. A solution to this problem can be achieved by tailoring the switching magnetic field to each individual MJJ device.

Figure 5:
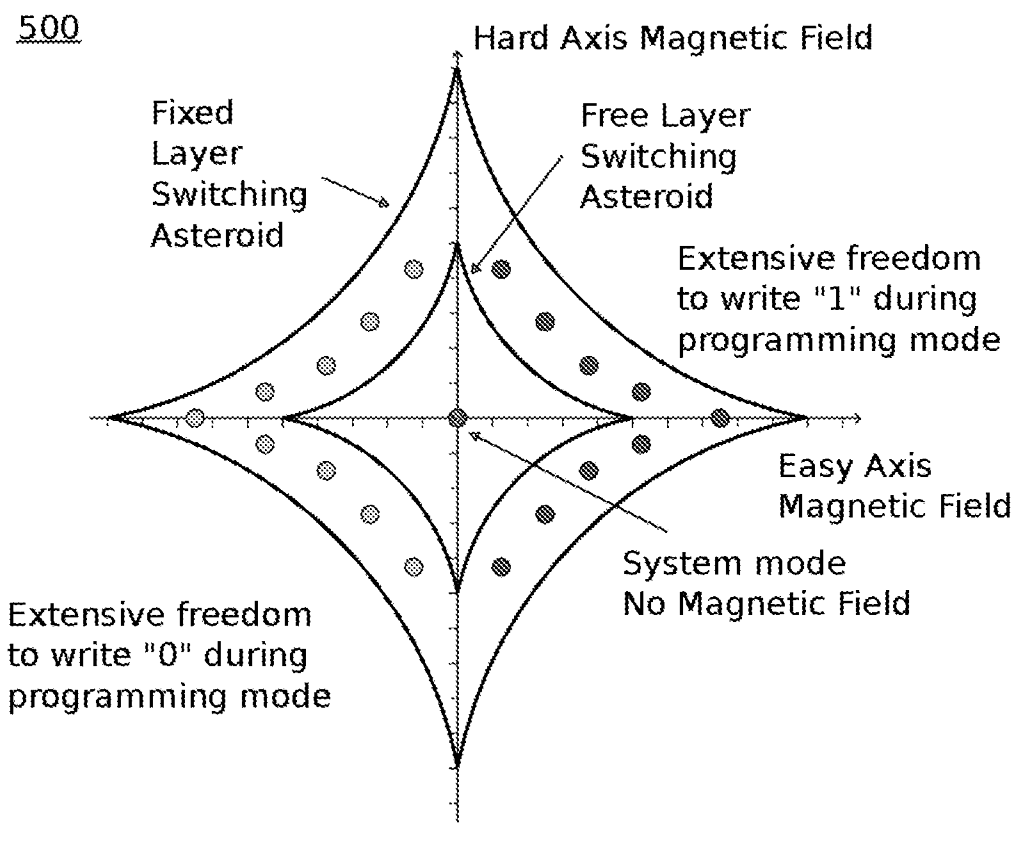
FIG. 5 conceptually depicts an ideal Stoner-Wohlfarth switching asteroids associated with each of at least a subset of the MJJs with field selection points enabled by an exemplary MJJ write circuit to be discussed with respect to FIG. 11.
Figure 11:
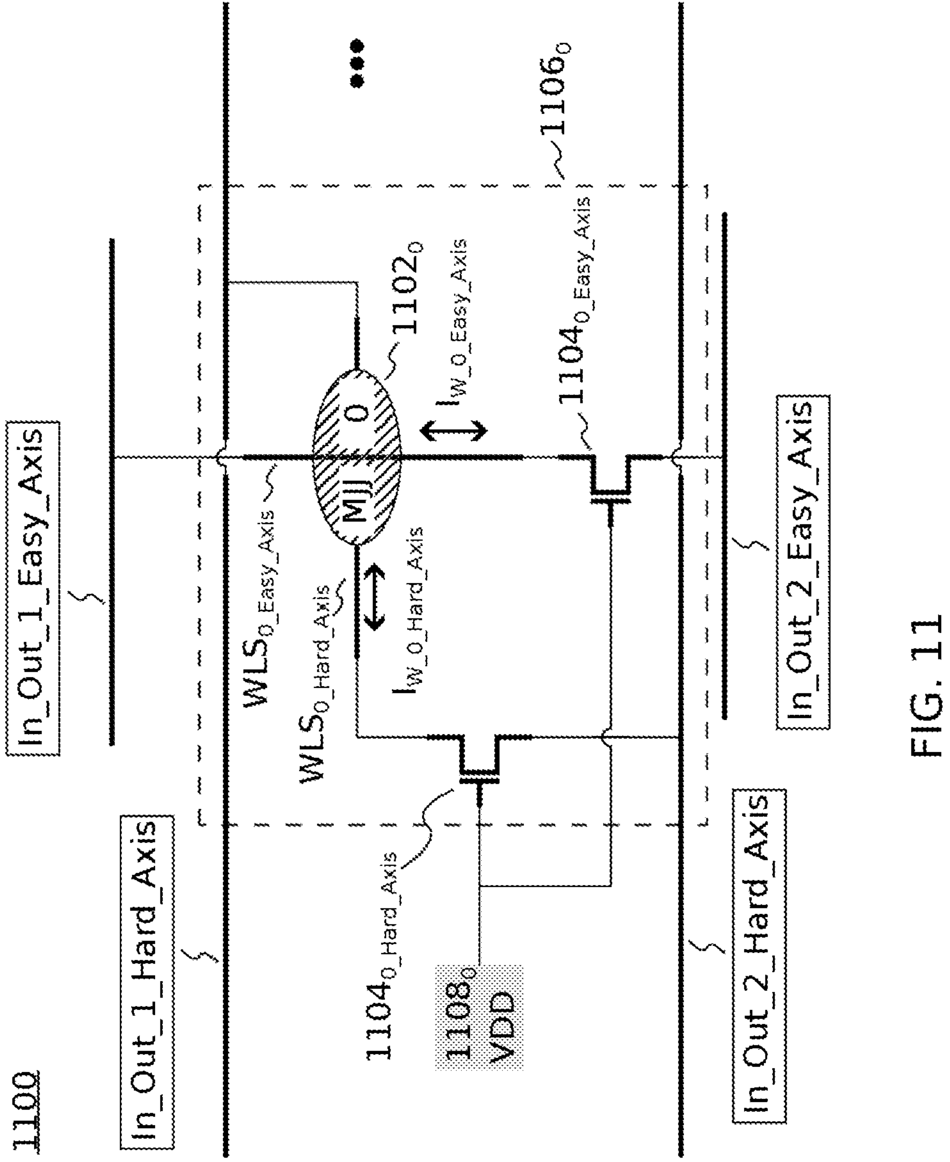
FIG. 11 is schematic diagram depicting at least a portion of an exemplary MJJ write circuit that provides individual control over both the hard and easy axis magnetic fields applied to each MJJ, according to one or more embodiments of the present invention.

FIG. 5 conceptually depicts ideal Stoner-Wohlfarth switching asteroids associated with each of at least a subset of the MJJs with field selection points enabled by an exemplary MJJ write circuit to be discussed with respect to FIG. 11. A more costly orthogonal write circuit, an example of which is shown in FIG. 11, may be required to support the write "0" and write "1" field points, which are superimposed on the asteroids of FIG. 5, compared with those field points superimposed on the asteroids of FIG. 2 (e.g., enabled by the exemplary MJJ write circuit 100 shown in FIG. 1). The integration of FET switches along with a memory element to form a memory cell is already described with respect to the illustrative MJJ-based memory circuit 300 of FIG. 3 (having the associated FET switches, a MJJ, and write line segments is depicted in FIG. 11). The new write circuit of FIG. 11 can be configured to provide more flexibility in magnitude and/or orientation of the applied magnetic field(s). As known in the art, many write "0" and write "1" field points may be possibilities for the MJJ 310 of the memory circuit 300 shown in FIG. 3, as reflected by the light gray and dark gray points, respectively, on the asteroid of FIG. 5. The principal cost of this scheme over the approach shown in FIG. 1 is the inclusion of an additional write line disposed over or under the MJJ.

Figure 6:
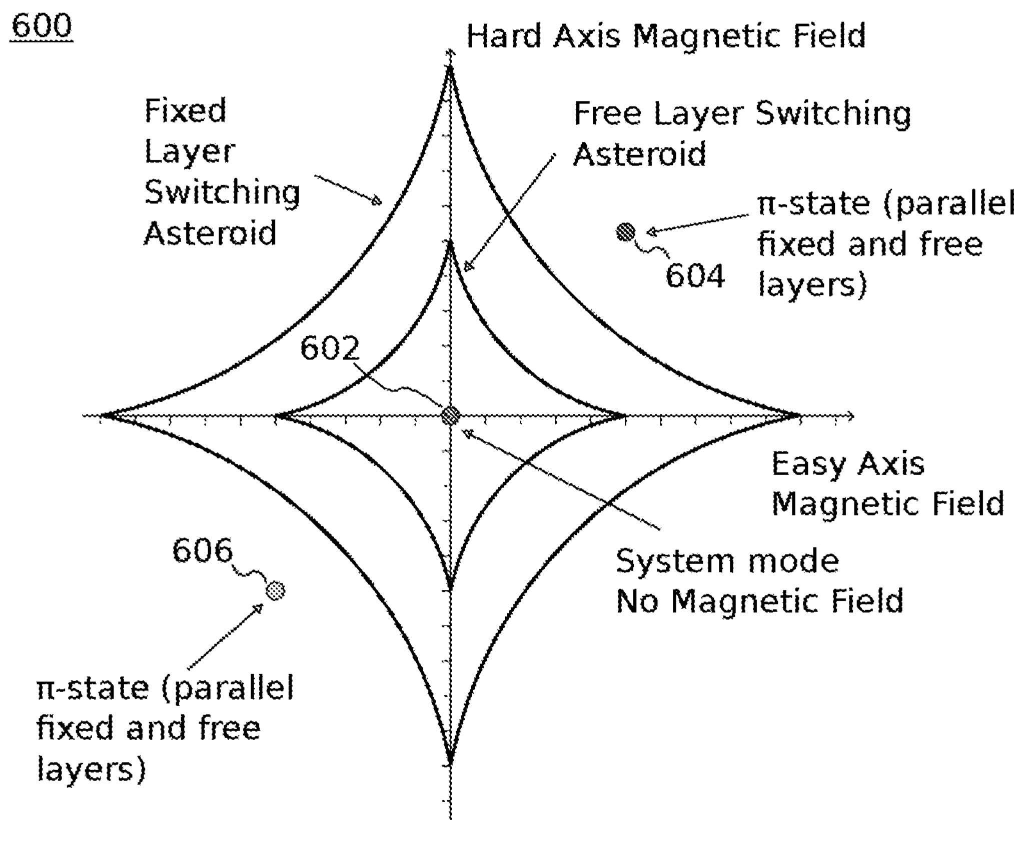
FIG. 6 conceptually depicts ideal Stoner-Wohlfarth switching asteroids associated with each of at least a subset of the MJJs in the exemplary MJJ write circuit of FIG. 1 in which the noted field points are used to set the MJJs into π-states.

FIG. 6 conceptually depicts ideal Stoner-Wohlfarth switching asteroids associated with each of at least a subset of the MJJs in the exemplary MJJ write circuit 100 of FIG. 1, in which the noted field points 604 and 606 are used to set the MJJs into π-states 604 and 606. Without an applied field, the MJJ remains in a π-state 602. In a system mode, the MJJ spontaneously supports clockwise or counter-clockwise currents in a superconducting loop containing the MJJ. The two different π-states 604 and 606, different in that their magnetic layers point in opposite directions, support circulating currents even though the orientation of their layers is different (i.e., left oriented or right oriented free and fixed magnets). Both can support persistent circulating currents of either type for changing the dynamics (operating point) of a superconducting circuit It should be noted that a π-state itself depends on a spin-valve MJJ properties (e.g., magnetic layer thicknesses), as known in the art.

Figure 7:
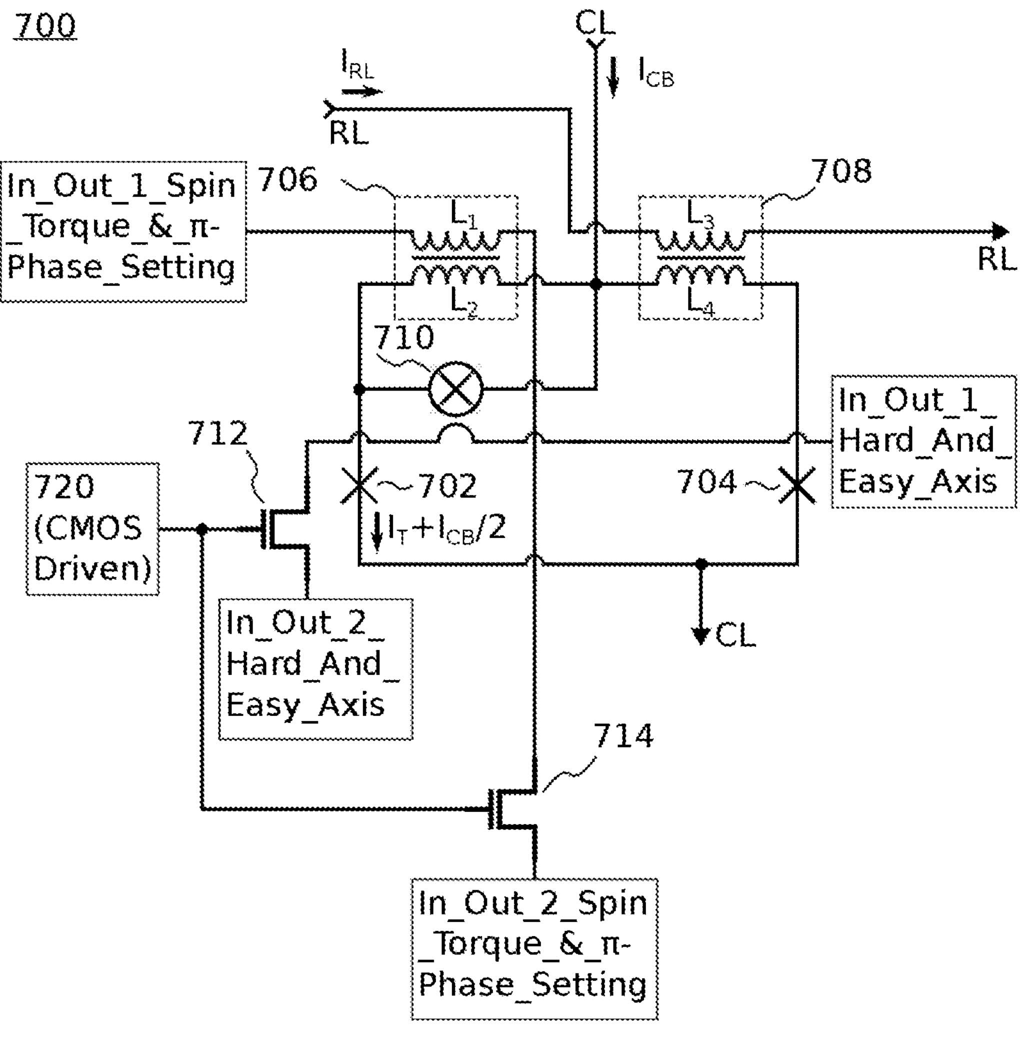
FIG. 7 is a schematic diagram depicting at least a portion of an exemplary MJJ-based memory circuit including integrated write switches, according to one or more embodiments of the present invention.

By way of illustration only and without limitation, FIG. 7 is a schematic diagram depicting at least a portion of an exemplary MJJ-based memory circuit 700 including integrated write switches, according to one or more embodiments of the present disclosure. Specifically, the MJJ-based memory circuit 700 includes at least one MJJ 710, one or more Josephson junctions, 702 and 704, and a plurality of transformers 706 and 708. The topology and exemplary read and write operations of a memory circuit, which may be similar to the illustrative MJJ-based memory circuit 700 of FIG. 7, are described in U.S. Pat. No. 10,650,884, by O. Naaman (hereinafter "Naaman"), the disclosure of which is incorporated by reference herein in its entirety. However, the memory circuit taught by Naaman excludes the use of non-superconducting (e.g., FET) switches for directing currents through the memory circuit, as will be described in further detail herein below with reference to FIG. 7.

An integrated write circuit of the MJJ-based memory circuit 700 may include one or more write switches, which in this illustrative embodiment may be implemented using FETs 712 and 714 (e.g., n-channel field-effect transistors (NFETs) or p-channel field-effect transistors (PFETs)), or other non-superconducting elements/devices. In one or more embodiments, the integrated write circuit of the MJJ-based memory circuit 700 further includes a hard and easy axis WLS line between a first terminal (e.g., drain) of a first FET switch 712 and a first interconnection terminal, In_Out_1_Hard_And_Easy_Axis, a second terminal (e.g., source) of the FET switch 712, which may be connected to a second interconnection terminal, In_Out_2_Hard_And_Easy_Axis, and a gate of the FET switch 712, which is adapted to receive a control signal 720 and which may be CMOS driven.

A second FET switch 714 in the integrated write circuit of the MJJ-based memory circuit 700 may include a first terminal (e.g., drain) connected to a first transformer 706 having a primary winding, $L_1$, connected in series with a third interconnection terminal, In_Out_1_Spin_Torque_&_π-Phase_Setting. The transformer 706 functions, at least in part, to (i) set a π-phase (positive or negative) and/or (ii) write an MJJ (or assist in the writing of an MJJ). A second terminal (e.g., source) of the FET switch 714 may be connected to a fourth interconnection terminal, In_Out_2_Spin_Torque_&_π-Phase_Setting, and a gate of the FET switch 714 may be adapted to receive the control signal 720. The integrated write circuit portion of the MJJ-based memory circuit 700 may operate, in some embodiments, in a manner consistent with the operation of the illustrative write circuit 100 shown in FIG. 1.

A second transformer 708 included in the memory circuit 700 has a primary winding, $L_3$, in series with a read line (RL) and used primarily during a read operation. Since aspects of the present disclosure are focused primarily on the write operation of memory circuits, transformer 708 will not be described in further detail herein.

The approach to writing the memory circuit taught by Naaman, or portions thereof, may also be incorporated (with or without modification) into the illustrative memory circuit 700 shown in FIG. 7; the Naaman approach will not be described in further detail herein. However, beneficial capabilities exist using the memory circuit 700 to enable a reliable and functional version of, and thereby enhance, the Naaman write approach by providing external control (i.e., non-superconducting based control) over (i) easy and hard axis field generating currents, (ii) spin torque current, and/or (iii) π-phase-setting current, which the Naaman approach cannot provide. Notably, for spin torque current and π-phase-setting current, the first transformer 706 is beneficially arranged, in one or more embodiments, in series with the second FET switch 714 and the third interconnection terminal In_Out_1_Spin_Torque_&_π-Phase_Setting, so that a tailored programing current, managed, for example, by a room temperature current source, can generate a current through the secondary winding $L_2$ of the transformer 706 (via induction). At least some of that induced current is driven through the at least one MJJ 710. The secondary current generated in the transformer 706, which is driven through the MJJ 710, may be scaled as a ratio of the number of turns in the secondary winding to the number of turns in the primary winding (or the equivalent mutual inductance between two conducting wires).

Figure 8:
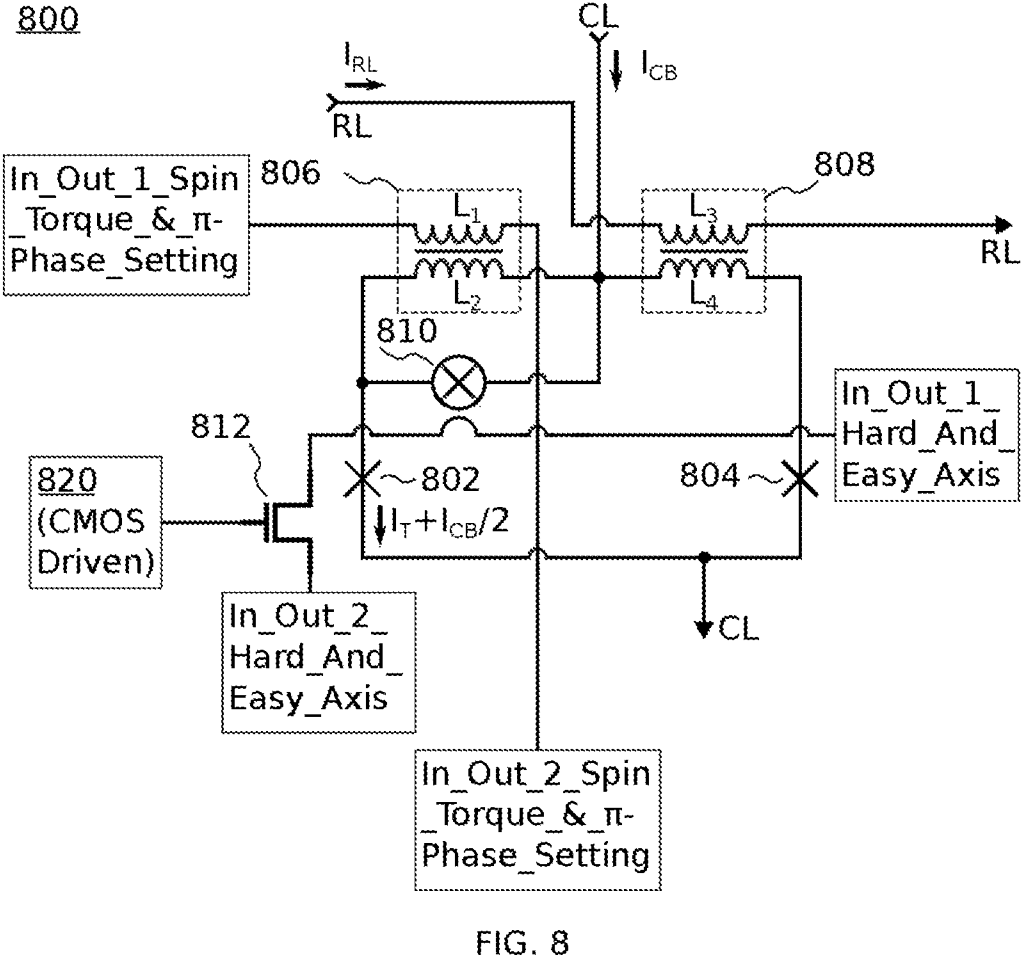
FIG. 8 is a schematic diagram illustrating at least a portion of an exemplary MJJ-based memory circuit including at least one integrated write switch, according to one or more embodiments of the present invention.

By way of example only and without limitation, FIG. 8 is a schematic diagram illustrating at least a portion of an exemplary MJJ-based memory circuit 800 including at least one integrated write switch, according to one or more embodiments of the present disclosure. Like the illustrative memory circuit 700 of FIG. 7, the exemplary MJJ-based memory circuit 800 shown in FIG. 8 includes at least one MJJ 810, one or more JJs 802 and 804, and a plurality of transformers 806 and 808. Transformer 808 is used primarily for a read operation and will therefore not be discussed in further detail herein.

An integrated write circuit of the exemplary MJJ-based memory circuit 800 includes a write switch, which may be implemented as a FET switch 812. A first terminal (e.g., drain) of the FET switch 812 may be connected to a first interconnection terminal, In_Out_1_Hard_And_Easy_Axis, via a WLS line which passes proximate to the MJJ 810 for writing a state of the MJJ. A second terminal (e.g., source) of the FET switch 812 may be connected with a second interconnection terminal, In_Out_2_Hard_And_Easy_Axis, and a gate of the FET switch 812 is adapted to receive a control signal 820, which may be CMOS driven The integrated write circuit portion of the MJJ-based memory circuit 800 may operate, in some embodiments, in a manner consistent with the operation of write circuit 100 shown in FIG. 1.

Similar to the exemplary MJJ-based memory circuit 700 of FIG. 7, capabilities exist in the illustrative memory circuit 800 shown in FIG. 8 to provide external control over easy and hard axis field generating currents, which can provide significant advantages over the approach used in Naaman. In contrast to the memory circuit 700 of FIG. 7, however, a second FET switch (714 in FIG. 7) is omitted in the memory circuit 800 of FIG. 8 and instead the first transformer 806 is connected directly in series between third and fourth interconnection terminals, In_Out_1_Spin_Torque_&_π-Phase_Setting and In_Out_2_Spin_Torque_&_π-Phase_Setting, respectively. A write circuit (relative to the size of a FET) can drive a current through the primary winding $L_1$ of the transformer 806 (of many series-connected memory circuits 800, as will be discussed in more detail below with reference to FIG. 20) that can then concurrently generate a corresponding current through the secondary winding $L_2$ of the transformer 806 which induces a current (in secondary winding $L_2$) to be driven through the MJJ 810, which can generate at least one of (i) a spin torque current and (ii) a π-phase-setting current. The secondary current generated in the transformer 806, which is driven through the MJJ 810, may be scaled as a ratio of the number of turns in the secondary winding to the number of turns in the primary winding (or the equivalent mutual inductance between two conducting wires). This primary current of the write circuit can be used to drive many series-connected MJJ-based memory circuits 800.

Figure 9:
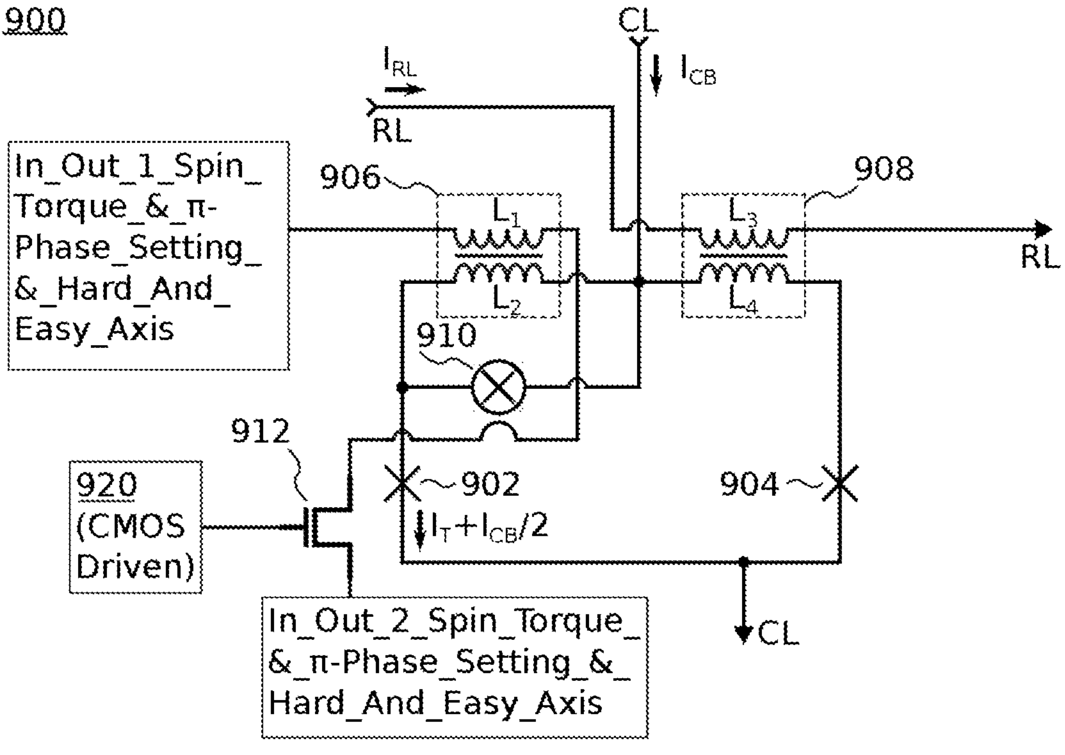
FIG. 9 is a schematic diagram depicting at least a portion of an exemplary MJJ-based memory circuit including at least one integrated write switch, according to one or more embodiments of the present invention.

By way of example only and without limitation, FIG. 9 is a schematic diagram depicting at least a portion of an exemplary MJJ-based memory circuit 900 including at least one integrated write switch, according to one or more embodiments of the present disclosure. The exemplary MJJ-based memory circuit 900, consistent with the illustrative memory circuit 800 of FIG. 8, includes at least one MJJ 910, one or more JJs, 902 and 904), and a plurality of transformers, 906 and 908. A first transformer 906 includes a primary winding, $L_1$, connected at a first end to a first interconnection terminal, In_Out_1_Spin_Torque_&_π-Phase_Setting_&_Hard_&_Easy_Axis, and having a secondary winding, $L_2$, connected to the MJJ 910 for driving a write current through the MJJ. A second transformer 908 having a secondary winding, $L_4$, is used primarily for a read operation, and therefore will not be discussed in further detail herein.

An integrated write circuit of the exemplary MJJ-based memory circuit 900 includes a write switch, which may be implemented as a FET switch 912 (e.g., NFET or PFET). A first terminal (e.g., drain) of the FET switch 912 may be connected to a second end of the primary windy L1 of the first transformer 906 via a WLS line passing proximate to the MJJ 910 for writing a state of the MJJ. A second terminal (e.g., source) of the FET switch 912 may be connected with a second interconnection terminal, In_Out_2_Spin_Torque_&_π-Phase_Setting_&_Hard_&_Easy_Axis and a gate of the FET switch 912 is adapted to receive a control signal 920, which may be CMOS driven. The integrated write circuit portion of the MJJ-based memory circuit 900 may operate, in some embodiments, in a manner consistent with the operation of exemplary write circuit 100 shown in FIG. 1.

In the MJJ-based memory circuit 900, an external current source can generate a current through the primary winding $L_1$ of the transformer 906, that can in turn cause a current to be generated through the secondary winding $L_2$ to be driven through the at least one MJJ 910. This generated current may serve as at least one of (i) a spin torque current and (ii) a a-phase-setting current. Advantageously, the first transformer 906 is arranged in series with the WLS line and the FET switch 912 so that a "tailored" programing current, managed, for example, by a room temperature current source, can simultaneously generate a magnetic field in the WLS line that is coupled into the at least one proximate MJJ 910, while also generating a current in the secondary winding $L_2$ of the transformer 906 that is driven through the MJJ 910. The secondary current generated in the transformer 906, which is driven through the MJJ 910, may be scaled as the mutual inductance of the secondary inductor, $L_2$, and the primary inductor, $L_1$.

While several illustrative embodiments of write circuits suitable for use in an MJJ-based memory circuit have been described in conjunction with FIGS. 3, 7, 8 and 9, it is to be appreciated that aspects according to the present disclosure are not limited to these embodiments. Rather, it will become apparent to those skilled in the relevant art that modifications may be made to the write circuits shown and described herein that are within the scope of embodiments of the invention. Thus, in accordance with embodiments of the present disclosure, write circuits for MJJ-based memory circuits are contemplated that incorporate (i) at least a partially field-switched MJJ, which includes a FET switch in combination with at least one WLS line, and (ii) an apparatus to assist writing an MJJ, which includes a FET switch in combination with a transformer.

Figure 10:
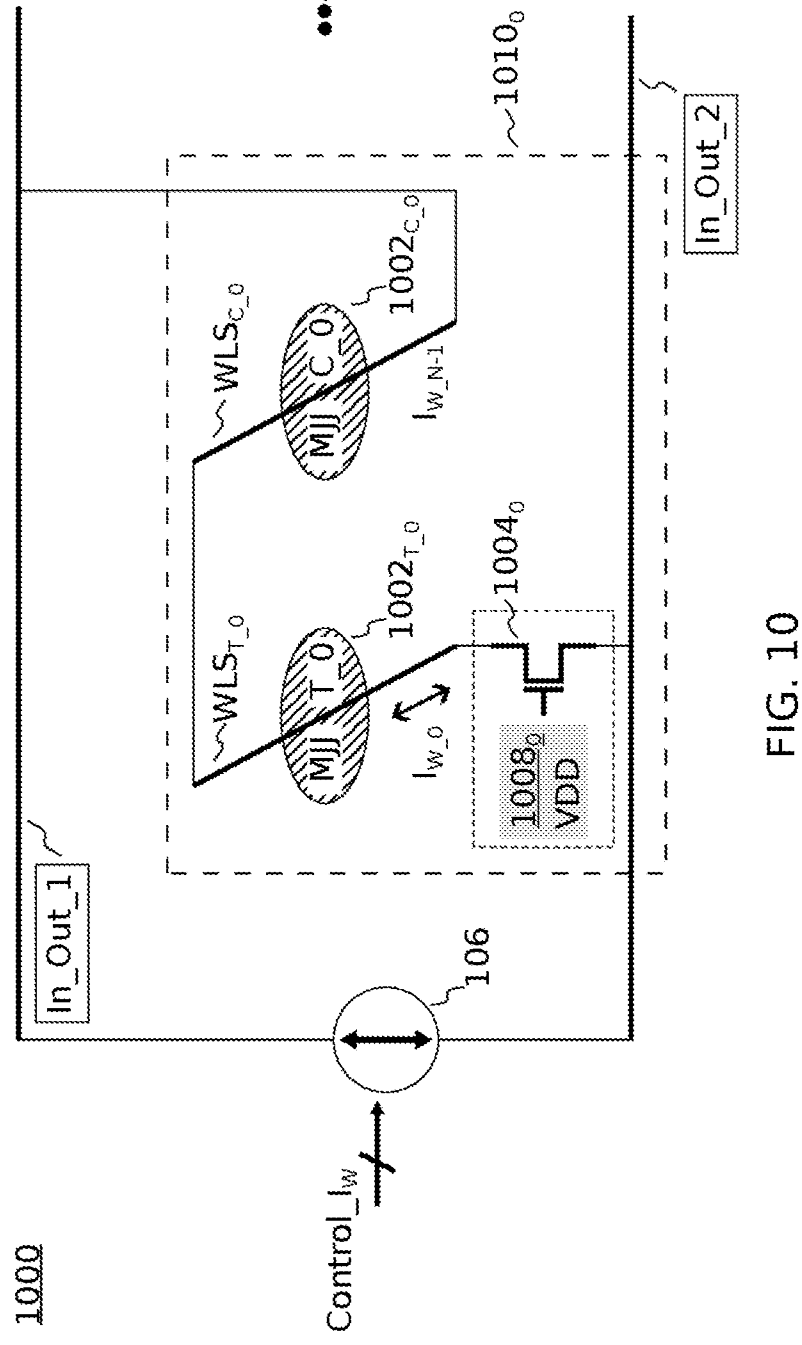
FIG. 10 is a schematic diagram depicting at least a portion of an exemplary MJJ write circuit, according to one or more embodiments of the present invention.

FIG. 10 is a schematic diagram depicting at least a portion of an exemplary MJJ write circuit 1000, according to one or more embodiments of the present disclosure. The MJJ write circuit 1000 is similar to the illustrative write circuit 100 shown in FIG. 1, except that each WLS includes one FET switch and a pair of MJJs; namely, a true (T) MJJ, $MJJ_{T\ 0}$, and a complement (C) MJJ, $MJJ_{C\_0}$. The true and complement MJJs, $MJJ_{T\_0}$ and $MJJ_{C\_0}$, together with corresponding true write line segment $WLS_{T\_0}$ line and complement write line segment $WLS_{C\_0}$ line, form a dual MJJ-based circuit 1010$_0$ of the write circuit 1000. Although only one representative MJJ-based circuit 1010$_0$ is shown in FIG. 10, it is be appreciated that the MJJ write circuit 1000 may include (N−1) MJJ-based circuits (collectively referred to as 1010), where N is an integer greater than one. The MJJ-based circuit 108 of write circuit 100 is replaced by the dual MJJ-based circuit 1010. Each MJJ in a given pair of true and complement MJJs $MJJ_{T\_0}$, $MJJ_{C\_0}$ preferably has its own corresponding WLS line associated therewith. The MJJ write circuit 1000 is beneficially suited for use with some superconducting circuits that require true (e.g., 0-state) and complement states (e.g., π-state 0-state) for operation, which are held in true and complement MJJs, respectively.

For example, with reference to FIG. 10, a given WLS line includes a first WLS segment, $WLS_{T\_0}$ (true WLS segment), passing over (or under) and proximate to the true MJJ, $MJJ_{T\_0}$, and a second WLS segment, $WLS_{C\_0}$ (complement WLS segment), passing over (or under) and proximate to the complement MJJ, $MJJ_{C\_0}$. The true and complement WLS segments $WLS_{T\_0}$, $WLS_{C\_0}$ are electrically connected together by at least one conductive segment and connected to a first interconnect (In_Out_1 or In_Out_2). In one or more embodiments, the WLS segments $WLS_{T\_0}$ and $WLS_{C\_0}$ are oriented at a prescribed angle relative to a major axis of the corresponding MJJ.

Each of the WLS segments $WLS_{T\_0}$ and $WLS_{C\_0}$ in a given WLS line are connected together in series with a corresponding selection switch, which may be implemented as a FET $\mathbf{1004}_0$ (e.g., NFET or PFET), in one or more embodiments. Specifically, a first terminal (e.g., drain) of the selection switch associated with each WLS line is connected to an end of a corresponding WLS segment (either true or complement WLS segment), and a second terminal (e.g., source) of the selection switch is connected to a second interconnect (In_Out_2 or In_Out_1). Each of the selection switches, FETs $\mathbf{1004}_0$ through $\mathbf{1004}_{N-1}$ (of which only FET $\mathbf{1004}_0$ is explicitly shown), is selectively activated by the application of a corresponding control signal, $\mathbf{1008}_0$ through $\mathbf{1008}_{N-1}$, (of which only control signal $\mathbf{1008}_0$ is explicitly shown), respectively, to a control terminal (e.g., gate) of the corresponding selection switch.

In the illustrative embodiment shown in FIG. 10, a first end of the complement WLS segment $WLS_{C\ 0}$ is connected to the first interconnect In_Out_1, which is connected to a first terminal of a current source 106, a second end of $WLS_{C\_0}$ is connected to a first end of the true WLS segment $WLS_{T\_0}$, a second end of $WLS_{T\_0}$ is connected to a first source/drain of FET $\mathbf{1004}_0$, and a second source/drain of FET $\mathbf{1004}_0$ is connected to the second interconnect In_Out_2, which is connected to a second terminal of the current source 106. The WLS segments are arranged such that a current, $I_{W\_0}$, flowing through a selected WLS line passes in a first direction over the corresponding true MJJ $MJJ_{T\_0}$ and passes in a second direction, opposite the first direction, over the corresponding complement MJJ $MJJ_{C\_0}$.

While the exemplary MJJ write circuit 1000 represents an embodiment that may be advantageous in some applications using superconducting circuits that require true and complement phases for operation, this write circuit is less tolerant to process variations compared to the illustrative MJJ write circuit 100 depicted in FIG. 1. Adding a second MJJ in the MJJ write circuit 1000 shown in FIG. 10 impacts the ability of the circuit to generate individualized (i.e., tailored) MJJ programming magnetic fields for π-state and 0-state, which are used to program the MJJ.

FIG. 11 is schematic diagram depicting at least a portion of an exemplary MJJ write circuit 1100 that provides individual control over both the hard and easy axis magnetic fields applied to each MJJ, according to one or more embodiments of the present disclosure. To aid in the description of this illustrative embodiment, exemplary conductor currents and NFET gate voltages associated with an active mode of the MJJ write circuit 1100 are shown in FIG. 11. The MJJ write circuit 1100 is similar to the write circuit 100 shown in FIG. 1, except that each of at least a subset of MJJs, $\mathbf{1102}_0$ through $\mathbf{1102}_{N-1}$ (only one MJJ $\mathbf{1102}_0$ being explicitly shown), where N is an integer greater than one, has hard-axis and easy-axis WLS segments associated therewith, each WLS segment being independently controlled by a corresponding FET switch.

Specifically, with reference to FIG. 11, the exemplary MJJ write circuit 1100 includes a plurality of MJJs, only one of which (MJJ $\mathbf{1102}_0$) is shown for clarity purposes. Each MJJ, using MJJ $\mathbf{1102}_0$ as a representative example, has a hard-axis WLS segment, $WLS_{0\_Hard\_Axis}$, passing under (or over) the corresponding MJJ $\mathbf{1102}_0$ and proximate to a fixed layer of the MJJ, and an easy-axis WLS segment, $WLS_{0\_Easy\_Axis}$, passing over (or under) the corresponding MJJ $\mathbf{1102}_0$ and proximate to a free layer of the MJJ (or vice versa). In this exemplary embodiment, $WLS_{0\ Hard\ Axis}$ is oriented in parallel with the major axis of the MJJ $\mathbf{1102}_0$, and $WLS_{0\ Easy\ Axis}$ is oriented in parallel with the minor axis of the MJJ and orthogonal to $WLS_{0\_Hard\_Axis}$. It is to be appreciated, however, that embodiments of the invention are not limited to any specific orientation of the hard-axis and easy-axis WLS segments associated with each MJJ.

For each MJJ in the write circuit 1100, there are two FET switches in the memory circuit 1100, a first FET, FET $\mathbf{1104}_{0\_Easy\_Axis}$, used to control an easy-axis write current, $I_{W\_0\_Easy\_Axis}$, for generating an easy-axis magnetic field, and a second FET, $\mathbf{1104}_{0\_Hard\_Axis}$, used to control a hard-axis write current, $I_{W\_0\_Hard\_Axis}$, for generating a hard-axis magnetic field associated with a first MJJ, $MJJ_{\_0}$. A first source/drain of FET $\mathbf{1104}_{0\_Easy\_Axis}$ is connected to a first end of the $WLS_{0\_Easy\_Axis}$ segment, a second end of the $WLS_{0\_Easy\_Axis}$ segment is connected to a first interconnect, In_Out_1_Easy_Axis, conveying the easy axis write current, a second source/drain of FET $\mathbf{1104}_{0\_Easy\_Axis}$ is connected to a second interconnect, In_Out_2_Easy_Axis, and a gate of FET $\mathbf{1104}_{0\_Easy\_Axis}$ is adapted to receive a first control signal, $\mathbf{1108}_0$, for selecting (to be written) the corresponding MJJ $\mathbf{1102}_0$. Likewise, a first source/drain of FET $\mathbf{1104}_{0\_Hard\_Axis}$ is connected to a first end of the $WLS_{0\_Hard\_Axis}$ segment, a second end of the $WLS_{0\_Hard\_Axis}$ segment is connected to a third interconnect, In_Out_1_Hard_Axis, conveying the hard axis write current, a second source/drain of FET $\mathbf{1104}_{0\_Hard\_Axis}$ is connected to a fourth interconnect, In_Out_2_Hard_Axis, and a gate of FET $\mathbf{1104}_{0\_Hard\_Axis}$ is adapted to receive the first control signal, $\mathbf{1108}_0$. Although only one MJJ is shown in FIG. 11 for clarity purposes, it is to be appreciated that the same circuit configuration and description can be applied to other MJJs in the write circuit 1100.

Although not explicitly shown in FIG. 11 (but is implied), a first programmable current source, configured to supply the current $I_{W\_Hard\_Axis}$ for generating the hard-axis magnetic field, may be connected between the In_Out_1_Hard_Axis and In_Out_2_Hard_Axis interconnects, and a second programmable current source, configured to supply the current $I_{W\_Easy\_Axis}$ for generating the easy-axis magnetic field, may be connected between the In_Out_1_Easy_Axis and In_Out_2_Easy_Axis interconnects. The second programmable current source is also not explicitly shown, but is implied.

During a write operation directed to a selected MJJ, such as MJJ $\mathbf{1102}_0$, both corresponding FETs $\mathbf{1104}_{0\_Easy\_Axis}$ and $\mathbf{1104}_{0\_Hard\_Axis}$ are turned on by applying an appropriate control signal $\mathbf{1108}_0$ (e.g., VDD, assuming NFET switches are used) to the gates of the corresponding FETs, and the remaining FETs associated with non-selected MJJs in the write circuit 1100 are turned off by applying appropriate control signals $\mathbf{1108}_1$ through $\mathbf{1108}_{N-1}$, where N is an integer greater than 1, (e.g., ground, assuming NFET switches are used) to the gates of the corresponding FETs (e.g., $\mathbf{1104}_{1\_Easy\_Axis}$ and $\mathbf{1104}_{1\_Hard\_Axis}$, through $\mathbf{1104}_{N-1\_Easy\_Axis}$ and $\mathbf{1104}_{N-1\_Hard\_Axis}$, not explicitly shown). The write circuit 1100 has a benefit of being very versatile because it permits any two-dimensional magnetic field to be applied to a selected MJJ, both hard and easy axes, enabled by, for example, orthogonal write line segments, $WLS_{0\_Hard\_Axis}$ and $WLS_{0\_Easy\_Axis}$, and their associated FET switches, $\mathbf{1104}_{0\_Hard\_Axis}$ and $\mathbf{1104}_{0\_Easy\_Axis}$, respectively.

Figure 12:
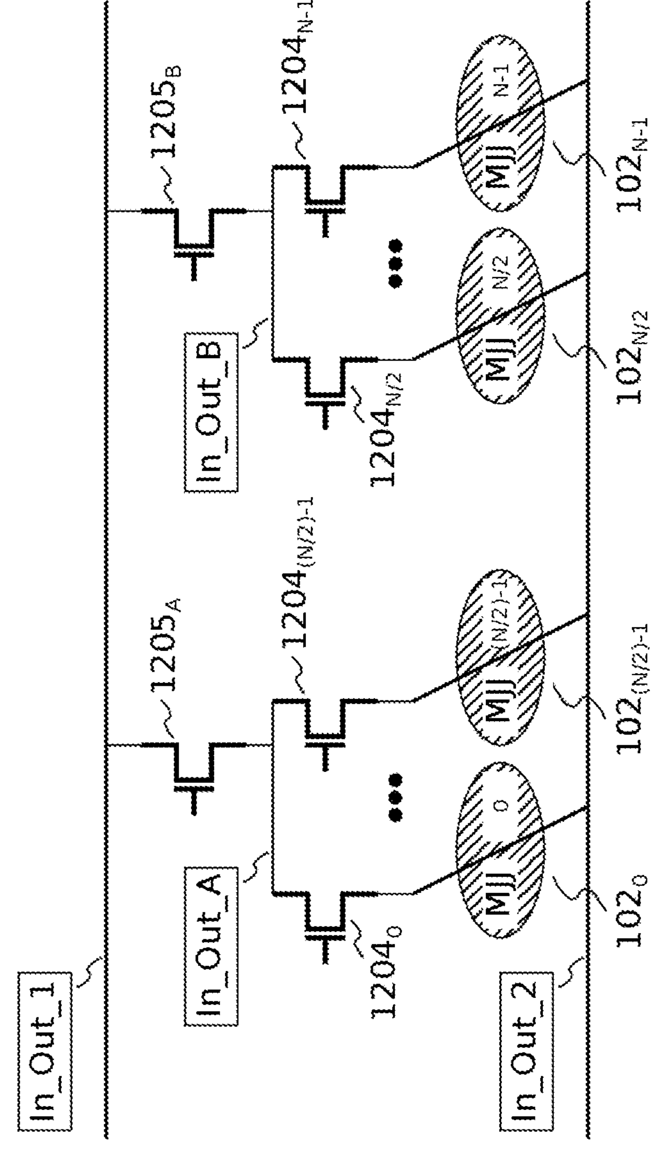
FIG. 12 is a schematic diagram depicting at least a portion of an exemplary write current multiplexing circuit for reducing leakage current, according to one or more embodiments of the present invention.

FIG. 12 is a schematic diagram depicting at least a portion of an exemplary write current multiplexing circuit 1200 for reducing leakage current, according to one or more embodiments of the present invention. The write current multiplexing circuit 1200 includes a plurality of MJJs $\mathbf{102}_0$ through $\mathbf{102}_{N-1}$ (collectively, 102) and a plurality of transistors $1205_A$, $1205_B$ and $1204_0$ through $1204_{N-1}$. Each of the MJJs 102 may be associated with a corresponding write column line in one of a plurality of subsets of write column lines, A and B. In the illustrative multiplexing circuit 1200, half of the MJJs 102 (MJJs $102_0$ through $102_{(N/2)-1}$) are associated with write column lines in subset A and the other half of the MJJs (MJJs $102_{(N/2)}$ through $102_{N-1}$) are associated with write column lines in subset B. It is to be appreciated that embodiments of the invention are not limited to any specific number of subsets of write column lines or any other distribution of the MJJs 102 among the plurality of subsets of write column lines.

In a large circuit, for example having hundreds of millions of MJJs, parallel leakage currents passing through the set of "off" transistors $1205_A$, $1205_B$ and $1204_0$ through $1204_{N-1}$ can significantly impact the applied write current through two series "on" transistors, one of $1205_A$, $1205_B$ and one of $1204_0$ through $1204_{N-1}$, and a WLS line coupling magnetic fields to a particular MJJ (i.e., one of MJJs $102_0$ through $102_{N-1}$), from one programming operation to the next (programming operations might occur once a day).

It is contemplated that read-modify-write schemes, however, can mitigate the impact of such leakage currents, given that the write current can be tuned each time the MJJ is written. Read-modify-write schemes suitable for use with embodiments of the present disclosure will be known by those skilled in the relevant art and will therefore not be discussed in further detail herein.

It is important to note that, as known in the art, π-state (or 0-state) can be associated with either the parallel or anti-parallel orientations. It can be a function of a thickness of the ferromagnetic layers in the MJJs.

Shift Register Driven Array Write Circuit

Figure 13:
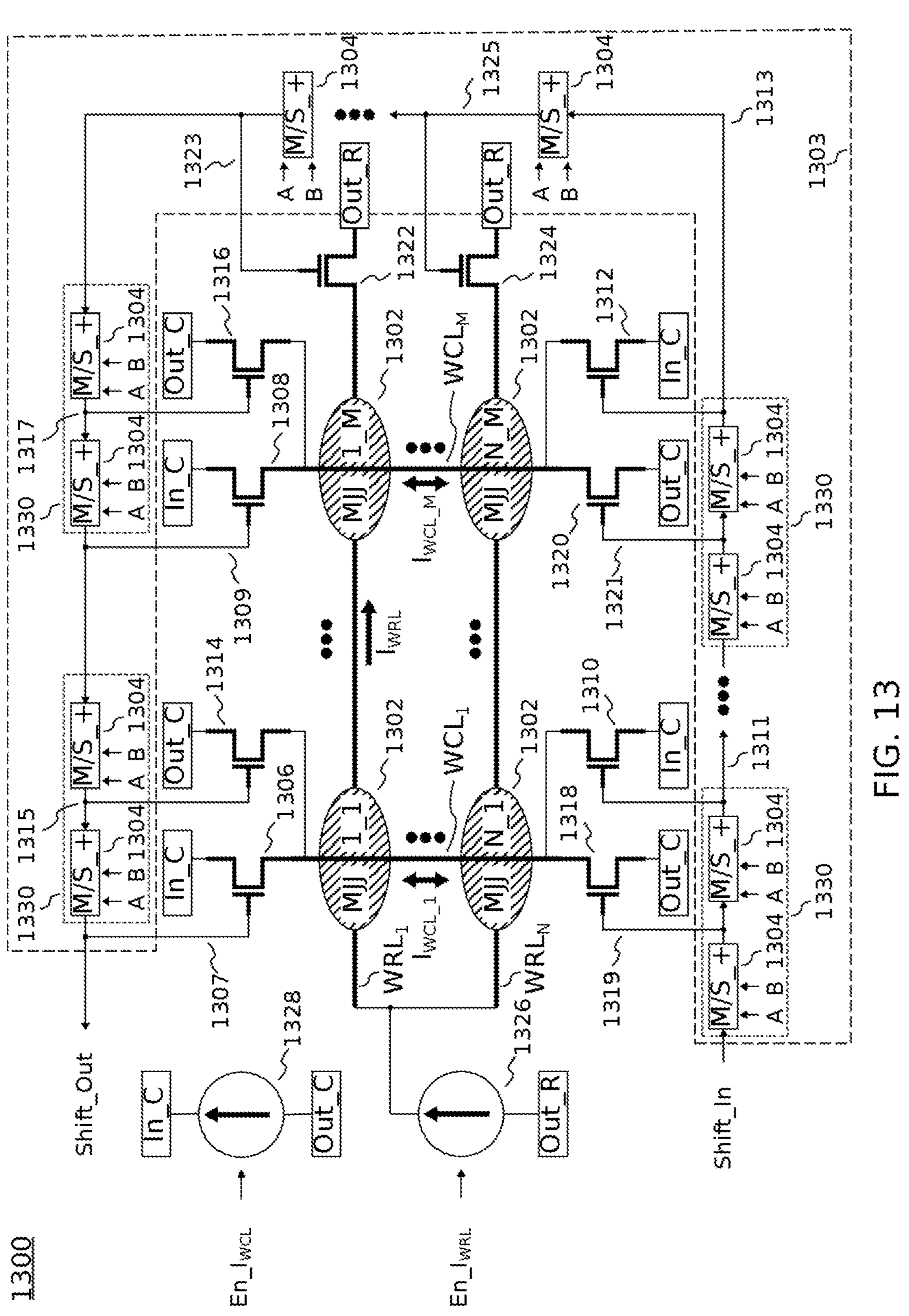
FIG. 13 is a schematic diagram depicting at least a portion of an exemplary MJJ-based write circuit for writing MJJs, according to one or more embodiments of the present invention.

FIG. 13 is a schematic diagram depicting at least a portion of an exemplary MJJ-based write circuit 1300 for writing MJJs, according to one or more embodiments of the present disclosure. As will be described in further detail below, the write circuit 1300 beneficially enables a bidirectional easy axis field application in the plane of the MJJ, or alternatively a bidirectional spin torque current (or a-state current) application through the MJJ stack of materials via an inductor associated with a memory circuit (not explicitly shown in FIG. 13). The write circuit 1300 can be used to "program" MJJs, which, for example, may serve as a memory element, which acts as a programmable switch in Josephson magnetic programmable logic arrays (JMPLAs), as described in U.S. Pat. No. 9,595,970 by W. Reohr, et. al. (the disclosure of which is incorporated by reference herein in its entirety), and which can serve as a memory element for other programmable circuit functions in superconducting field-programmable gate arrays (FPGAs), among other applications. It should be noted that only the MJJs, not the superconducting array cells (programmable switches PS) or FPGA circuits which include them, have been depicted in FIG. 13, primarily because the MJJs of all known superconducting array cells and FPGA circuits disclosed in the art can be written by this apparatus/circuit.

The exemplary MJJ write circuit 1300 for writing MJJs shown in FIG. 13 includes a plurality of magnetic Josephson junctions 1302, and a control circuit 1303 for controlling currents used to write the MJJs. In one or more embodiments, the control circuit 1303 may be implemented as a shift register comprising a plurality of shift circuits 1330, each of the shift circuits 1330 including one or more master-slave latches (M/S_+) 1304. The write circuit 1300 further comprises a plurality of write row lines, $WRL_1$ through $WRL_N$ (wherein N is an integer), for conveying a write row line current, $I_{WRL}$, through a selected one of the write row lines (in FIG. 13, $WRL_1$ caries the write row line current $I_{WRL}$ and thus illustrates a "selected" write row line), and a plurality of write column lines, $WCL_1$ through $WCL_M$ (where M is an integer), for conveying write column line current(s), $I_{WCL\_1}$ through $I_{WCL\_M}$, through at least one of the write column lines (e.g., the exemplary selected write column lines—$WCL_1$ through $WCL_M$ as shown in FIG. 13). It is to be appreciated that the term "write line," as used herein, is intended to broadly refer to one or more conductive elements in a write column path, including a write column line, a write line segment, a coupling wire forming a primary coil/winding of at least one inductor, and a serial JJ pass-through, and/or one or more conductive elements in a write row path, including a write line segment, a write row line, and a coupling wire forming a primary coil/winding of at least one inductor.

Write-column-current-ingress circuits included in the write circuit 1300 may control write column line (WCL) current ingress (i.e., current sourcing). In one or more embodiments, the write-column-current-ingress circuits may comprise a plurality of NFET switches 1306, 1308, 1310, 1312 (which advantageously provide a simple and effective implementation) adapted to receive corresponding control signals generated by the control circuit 1303 at control inputs of the write-column-current-ingress circuits, which in this embodiment are gates of the respective NFETS 1306, 1308, 1310, 1312. Each of the NFET switches 1306, 1308, 1310, 1312 forming the write-column-current-ingress circuits has a first source/drain coupled to a first terminal, In_C, of a first current source 1328, which may be a global write column line current source generating the write column line currents, $I_{WCL\_1}$ through $I_{WCL\_M}$, a second source/drain connected to a corresponding one of the write column lines, $WCL_1$ through $WCL_M$, and a gate for receiving one of the control signals generated at corresponding output nodes (i.e., taps) 1307, 1309, 1311, 1313 of the control circuit 1303. The first current source 1328, which may comprise a single current source or a plurality of current sources, is preferably adapted to receive at least one control signal, $En\_I_{WCL}$, for enabling and/or controlling an amplitude of the current(s) generated by the first current source. The write-column-current-ingress circuits control sourcing of the write column currents, $I_{WCL\_1}$ through $I_{WCL\_M}$, through the corresponding write column lines, $WCL_1$ through $WCL_M$.

Likewise, write-column-current-egress circuits included in the write circuit 1300 are configured to control write column line current egress (i.e., current sinking) for writing the MJJs 1302. The write-column-current-egress circuits, which may comprise NFET switches 1314, 1316, 1318, 1320 (which advantageously provide a simple and effective implementation), are adapted to receive corresponding control signals generated by the control circuit 1303 at control inputs of the write-column-current-ingress circuits, which in this embodiment are gates of the respective NFETS 1314, 1316, 1318, 1320. Each of the NFET switches 1314, 1316, 1318, 1320 forming the write-column-current-egress circuits has a first source/drain coupled to a corresponding one of the write column lines, $WCL_1$ through $WCL_M$, a second source/drain coupled to a second terminal, Out_C, of the first current source 1328, and a gate for receiving one of the control signals generated at corresponding outputs 1315, 1317, 1319, 1321 of the control circuit 1303. The write-column-current-egress circuits control sinking of the write column current, $I_{WCL\_1}$ through $I_{WCL\_M}$, through the corresponding write column lines, $WCL_1$ through $WCL_M$.

Although referred to herein as current ingress or current egress circuits, it is to be appreciated that each of these circuits can be located in either position, as an ingress or an egress circuit, due to zero voltage for superconducting wires for DC-like currents. Collectively, a primary function of the write-column-current-ingress and write-column-current-egress circuits is to selectively control a direction of the current flowing through the write column lines.

The write circuit 1300 further includes write-row-current circuits, which may comprise a plurality of NFET switches 1322 through 1324, for controlling a write-row-line current, $I_{WRL}$, conveyed by corresponding write row lines, $WRL_1$ through $WRL_N$ (where N is an integer greater than 1), for writing the MJJs 1303, in one or more embodiments. Specifically, a first terminal of a second current source (i.e., write-row-line-current source) 1326, configured to generate the write row line current $I_{WRL}$, is connected to first ends of the respective write row lines $WRL_1$ through $WRL_N$. The second current source 1326, which may comprise a single current source or a plurality of current sources, is preferably adapted to receive at least one control signal, $En\_I_{WRL}$, for enabling and/or controlling an amplitude of the current $I_{WRL}$ generated by the second current source. Each of the NFET switches 1322, 1324 has a first source/drain connected to a second end of a corresponding one of the write row lines, a second source/drain connected with a second terminal, Out_R, of the second current source 1326, and a gate adapted to receive one of the control signals generated at corresponding outputs 1323 through 1325 of the control circuit 1303.

When the second (write-row-line) current source 1326 is enabled for a write operation (e.g., by setting control signal $En\_I_{WRL}$ to a "1" (i.e., active) state), a write-row-line current $I_{WRL}$ of a prescribed amplitude flows through a selected one of the write row lines $WRL_1$ through $WRL_N$, as enabled by activation of a corresponding one of the write-row-current circuits, for example by turning on a corresponding NFET switch 1322, 1324, which can be ingress or egress transistors. The activation of a selected NFET switch 1322, 1324 is coordinated by the control circuit 1303 configured to manage the currents that write the MJJs 1302. As previously stated, the control circuit 1303 provides the row input control signals 1323, 1325 to the write-row-current circuits, represented as NFET switches 1322, 1324.

When the first (global write column line) current source 1328 is enabled for a write operation (e.g., by setting control signal $En\_I_{WCL}$ to a "1" (i.e., active) state), which is enabled concurrently (or near concurrently) in time with activation of the second (write-row-line) current source 1326, the total (global) write column line current $I_{WCL\_T}$ divides into zero magnitude current(s) (i.e., no current(s) flow), substantially equal positive currents, and substantially equal negative currents. In this regard, it is important to note that positive and negative current magnitudes can be different, which is beneficial to reliable writing of the MJJs 1302 in light of their real, non-ideal magnetic switching characteristics. When the first source 1328 is enabled, currents $I_{WCL\_1}$ through $I_{WCL\_M}$ will flow through a plurality of their associated write column lines $WCL_1$ through $WCL_M$, as coordinated by the control circuit 1303 for managing currents that write the MJJs 1302. The control circuit 1303 also provides the column input control signals 1307, 1309, 1311, 1313, 1315, 1317, 1319, 1321 supplied to the corresponding write-column-current-ingress circuits 1306, 1308, 1310, 1312 and the write-column-current-egress circuits 1314, 1316, 1318, 1320.

The total write column line current, $I_{WCL\_T}$, may be determined using the following expression:

$$I_{WCL\_T} = WCLN_P \times I_{WCL\_P} + WCLN_N \times I_{WCL\_N},$$

where $I_{WCL\_P}$ represents a positive current component in the write column current, $WCLN_P$ is the number of positive flowing write column line currents $I_{WCL\_P}$, $I_{WCL\_N}$ represents a negative current component in the write column current, and $WCLN_N$ is the number of negative flowing write column line currents $I_{WCL\_N}$.

Figure 16:
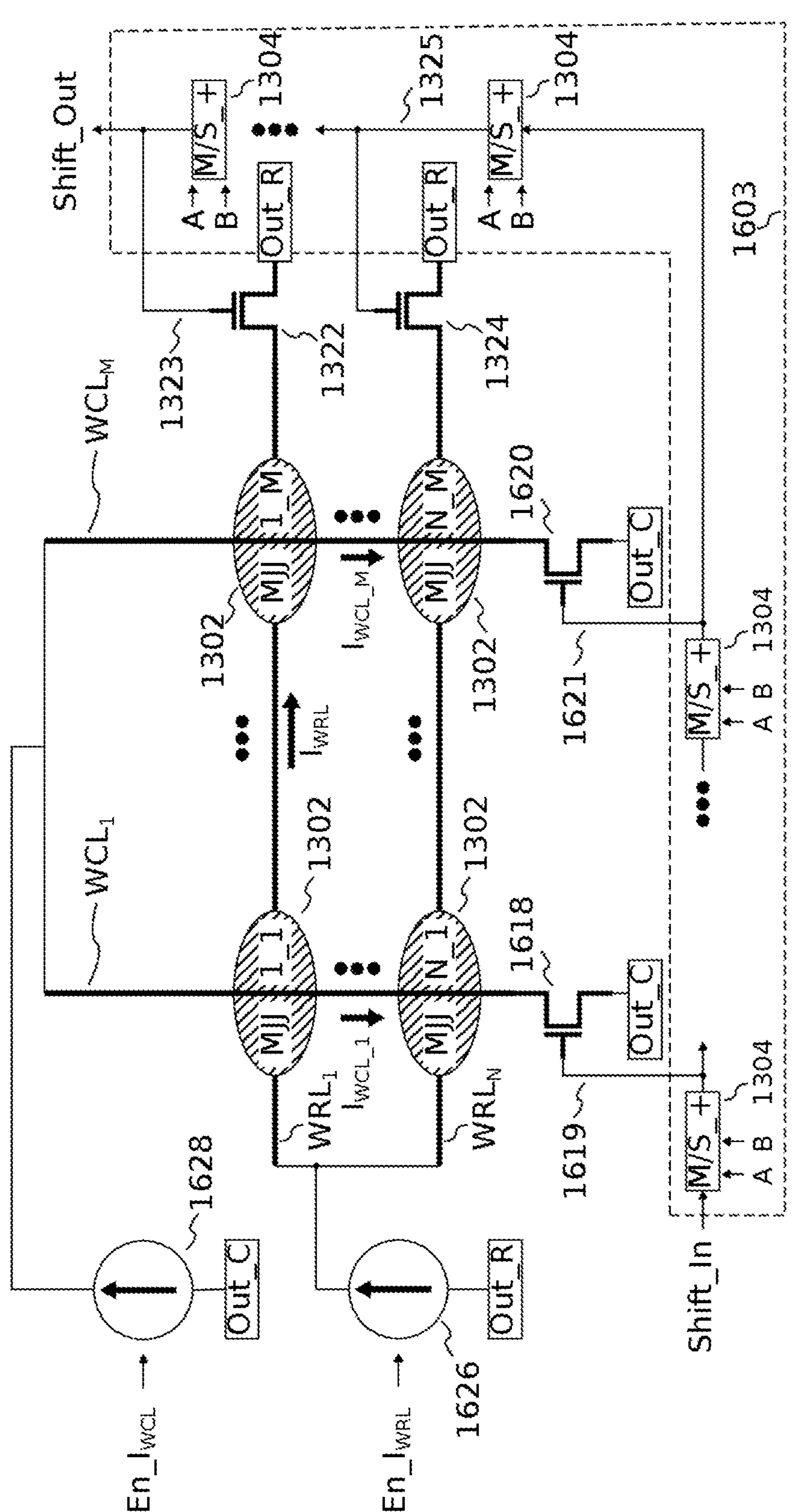
FIG. 16 is a schematic diagram depicting at least a portion of an exemplary circuit for writing MJJs, according to one or more alternative embodiments of the present invention.

While the illustrative embodiment (and other exemplary embodiments to be discussed herein) has been described in broad terms, the schematic of the write circuit 1300 for writing MJJs 1302 shows symbols for "NFETs" and a "shift register," terms which will be used in most cases to explain an operation of this embodiment, rather than the terms "circuits" (e.g., write-column-current-ingress circuits, write-column-current-egress circuits, write-row-current-egress circuits, and write-column-current circuits shown in FIG. 16) or "transistor-based circuit for managing currents that write MJJs," respectively.

In one or more embodiments, the control circuit 1303 for managing the write column line and write row line currents comprises a shift register, which can be formed using CMOS technology in a manner consistent with known shift register architectures, as will become apparent to those skilled in the art. Having limited inputs, the shift register in the control circuit 1303 can advantageously reduce or minimize heat injection (i.e., cooling losses) for 4.2 Kelvin, and below, refrigerators, as compared to other viable alternatives, associated with the signal wires of the limited inputs, which may connect through an insulating layer between room temperature and low temperature regions (providing a path to transfer heat between them), in one or more embodiments. This exemplary embodiment enables a bidirectional field application along the easy axis of the MJJ 1302 as well as a bidirectional spin torque current application through the MJJ stack of materials (not explicitly shown in FIG. 13, but implied), and other unique embodied/claimed capabilities, some of which will be discussed in further detail below.

For this disclosure, current flowing in a first direction is defined as positive; current flowing in a second direction, opposite the first direction, is defined as negative. It is to be understood, however, that embodiments of the invention are not limited to any particular assignment of current direction and polarity.

A column line (or a row line) can be arranged to "wrap around," and aspects according to embodiments of the present disclosure are well-suited to using a shift register. It should be understood by those skilled in the relevant art that, given such a "wrap around" architecture, ingress and egress terminals can be located proximate to one another and, therefore, their associated transistors can be driven by fewer common input control signals (e.g., write-column-current-ingress-control input signals 1307, 1309 and write-column-current-egress-control input signals 1319, 1321), since ingress and egress transistors can be enabled and disabled in pairs.

Figure 14:
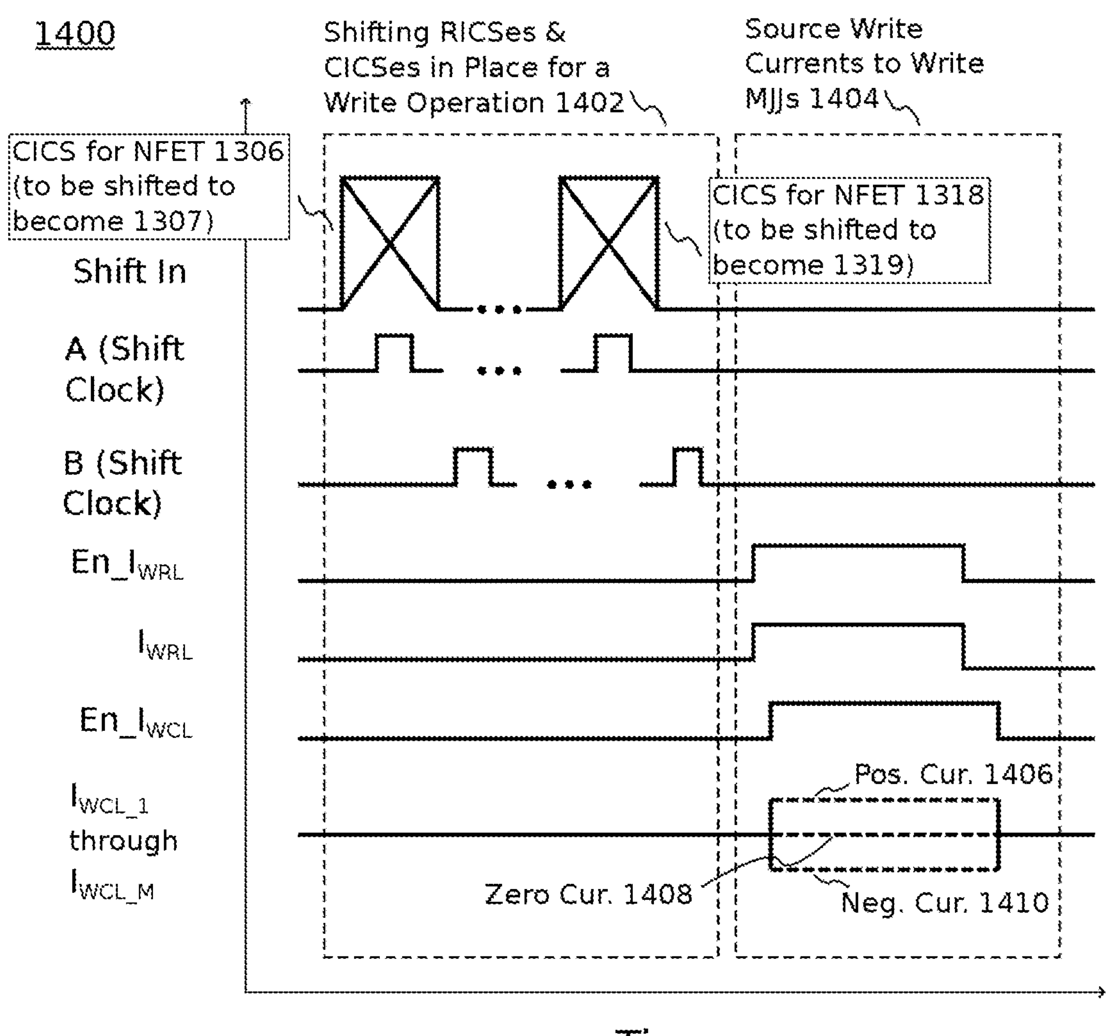
FIG. 14 is a timing diagram illustrating at least a portion of an exemplary timing diagram for writing method, according to one or more embodiments of the present invention.

FIG. 14 is a timing diagram illustrating at least a portion of an exemplary timing diagram 1400 for writing method, according to one or more embodiments of the present invention. Before discussing the illustrative writing method, it is important to note that row input control signal(s) (RICSes) and column input control signal(s) (CICSes) are abbreviated in the figures as "RICSes," being indicative of plural RICS signals, "CICS," being indicative of a singular CICS signal, and "CICSes," being indicative of plural CICS signals. In one or more embodiments, the exemplary writing method depicted by timing diagram 1400 involves the following steps, applied in sequence: [1] shifting RICSes and CICSes in place for a write operation (step 1402), during which time the current sources are disabled (current sources can be disabled by using a switch or other mechanism included anywhere in the conduction path, which includes either a write row line or a write column line); and [2] sourcing write currents to write MJJs (step 1404), during which time shift clocks "A" and "B" are disabled (e.g., set to "0") and thus the shifted input control signals remain constant at their designated voltage or state. Write currents can be used to generate magnetic fields or spin torque currents for writing MJJs, as will become apparent to those skilled in the art.

More particularly, the shifting step 1402 may include sourcing input data through a "Shift_In" input (see, e.g., FIG. 13) while applying pairs of "A" and "B" clocks, each applied datum of a set of data progressing through one master-slave latch 1304 (M/S_+) of the shift register 1303 every time a pair of "A" and "B" clocks are applied. Here, "A" and "B" clocks may be non-overlapping clocks that can be generated from a single clock signal delivered to a refrigerated region (e.g., low temperature region, 4.2 Kelvin) via a single clock wire/source. As is known in the art, non-overlapping clock pulses can be generated from one clock input using delay lines and/or clock choppers or the like, all while managing the input signal pulse duration.

With continued reference to FIGS. 13 and 14, with correct timing synchronization of a desired data feed at the "Shift_In" input to the shift register in the control circuit 1303, row and column input control signals (e.g., write-column-current-ingress-control input signals 1307, 1309 and write-column-current-egress-control input signals 1319, 1321) are shifted into place within the shift register 1303 by "A" and "B" clock pulse pairs that correspond in number to the total number of master-slave latches 1304 collectively forming the shift register 1303. It is important to note, as labeled on timing diagram 1400, that the first and last datum inputs, applied in the time sequence, for the shift register 1303 (having the underlying organization shown in FIG. 13) set the input control signals 1307, 1319, which enable or disable NFET switches 1306, 1318, respectively. In general, all desired input control signals, which enable or disable write-row-line current circuits 1322, 1324 (e.g., NFETs), write-column-current-ingress circuits 1306, 1308, 1310, 1312 (e.g., NFETs), and the write-column-current-egress circuits 1314, 1316, 1318, 1320 (e.g., NFETs), can be moved into place by the control circuit 1303.

In a write operation, the input control signals steer appropriate write currents $I_{WRL}$ and $I_{WCL\_1}$ through $I_{WCL\_M}$, sourced by the write-row-line-current source(s) 1326 and global write column line current source(s) 1328, respectively, through at least one of the write row lines $WRL_1$ through $WRL_N$ and at least one of the write column lines, $WCL_1$ through $WCL_M$. For typical write schemes, the currents generate magnetic fields, which collectively write selected MJJs. In contrast, π-current-based or spin torque JMRAM cells (spin transfer torque (STT)-based JMRAM cells), use the write column currents to couple a supercurrent into the JMRAM cells themselves, for example via a transformer. The JMRAM-internal current then applies at least one of a π-phase setting seed current and a spin torque in combination with the hard axis field (generated by the write row current $I_{WRL}$) as the JMRAM-internal current passes through the selected MJJs as is known in the art.

With respect to rows, it is preferred to write a row of superconducting array cells, by selecting (i.e., enabling) only one row NFET switch of the plurality of row NFET switches (write-row-current circuits) associated with the rows. As an example, in FIG. 13, NFET switch 1322 is enabled (i.e., driven into a conducting state) under the conditions that its source (connected to the "Out_R" terminal of the write-row-line-current source 1326) and drain are kept substantially close to ground (GND), by the write-row-line-current source(s) 1326, and that its gate (connected to output node/tap 1323 of the shift register in the control circuit 1303) is driven to VDD by the control circuit 1303. More specifically for the overall row circuit, by applying VDD (where VDD equals a logic "1" in CMOS technology) to the gate of row NFET switch 1322 and applying GND (where GND equals a logic "0" in CMOS technology) to gates of the other row NFET switches, such as NFET switch 1324, the selected row NFET switch 1322 may be driven into a conducting state, while all other non-selected row NFET switches (e.g., NFET switch 1324) may be driven into a nonconducting state, under the conditions that the sources and drains of all the NFET switches are held substantially near GND. The write row line current $I_{WRL}$ thus flows through the selected write row line $WRL_1$.

With respect to columns, it is assumed for the following discussion that the global write column line current source(s) 1328 drives the source and drains of the write-column-current-ingress NFET switches 1306, 1308, 1310, 1312 and the write-column-current-egress NFET switches 1314, 1316, 1318, 1320 to GND (the NFETs are assumed to be highly conductive). While any column input control signals can be applied to the column NFET switches (write-column-current-ingress circuits and the write-column-current-egress circuits) associated with the write column lines WCLs, seven switch setting options appear to be most desired for each write column line, in one or more embodiments.

By way of example only and without limitation, seven switch setting options that appear to be desirable for each write column line are the following, for exemplary write column line 1 $WCL_1$ (Here to generalize most broadly, for this example, it is also assumed that $I_{WRL}$ is applied to $WRL_1$ and that idealized coincident magnetic field writing, based on a Stoner-Wohlfarth switching asteroid as known in the art, is viable):

[i] To prepare to source a positive current 1406 of FIG. 14 to write the MJJ_1_1 to a "1-state," (a) set the input voltage 1307 of NFET 1306 to VDD, (b) set the input voltage 1319 of NFET 1318 to VDD, (c) set the input voltage 1315 of NFET 1314 to GND, and (d) set the input voltage 1311 of NFET 1310 to GND;

[ii] To prepare to source a zero-magnitude current 1408 of FIG. 14 to $WCL_1$, (a) set the input voltage 1307 of NFET 1306 to VDD, (b) set the input voltage 1319 of NFET 1318 to GND, (c) set the input voltage 1315 of NFET 1314 to GND, and (d) set the input voltage 1311 of NFET 1310 to GND;

[iii] To prepare to source a zero-magnitude current 1408 of FIG. 14 to $WCL_1$, (a) set the input voltage 1307 of NFET 1306 to GND, (b) set the input voltage 1319 of NFET 1318 to VDD, (c) set the input voltage 1315 of NFET 1314 to GND, and (d) set the input voltage 1311 of NFET 1310 to GND;

[iv] To prepare to source a zero-magnitude current 1408 of FIG. 14 to $WCL_1$, (a) set the input voltage 1307 of NFET 1306 to GND, (b) set the input voltage 1319 of NFET 1318 to GND, (c) set the input voltage 1315 of NFET 1314 to VDD, and (d) set the input voltage 1311 of NFET 1310 to GND;

[v] To prepare to source a zero-magnitude current 1408 of FIG. 14 to $WCL_1$, (a) set the input voltage 1307 of NFET 1306 to GND, (b) set the input voltage 1319 of NFET 1318 to GND, (c) set the input voltage 1315 of NFET 1314 to GND, and (d) set the input voltage 1311 of NFET 1310 to VDD;

[vi] To prepare to source a negative current 1410 to write the MJJ_1_1 to a "0-state," (a) set the input voltage 1307 of NFET 1306 to GND, (b) set the input voltage 1319 of NFET 1318 to GND, (c) set the input voltage 1315 of NFET 1314 to VDD, and (d) set the input voltage 1311 of NFET 1310 to VDD; and

[vii] To isolate $WCL_1$ entirely from "In_C" and "Out_C" nodes, and to assure no transient current flow (a zero-magnitude current 1408), (a) set the input voltage 1307 of NFET 1306 to GND, (b) set the input voltage 1319 of NFET 1318 to GND, (c) set the input voltage 1315 of NFET 1314 to GND, and (d) set the input voltage 1311 of NFET 1310 to GND.

While other combinations can occur during shifting of data in place through the shift register in control circuit 1303, only the settings described previously should be applied during the step 1404, primarily because other combinations may create various current loops through, for example, NFET switches 1306, 1314 or NFET switches 1306, 1314, 1318, which do not pass or pass only partially, respectively, through $WCL_1$.

Before turning to a discussion of the writing step, the total write column current $I_{WCL\_T}$ sourced by the global write column line current source(s) 1328 should be calculated for each write cycle, in one or more embodiments. The total write column current $I_{WCL\_T}$ is the sum of [i] the product of the number of positive write column line currents $WCLN_P$ (an integer) and the magnitude of the desired positive write column current $I_{WCL\_P}$, and [ii] the product of the number of negative write column line currents $WCLN_N$ (an integer) and the magnitude of the desired negative write column current $I_{WCL\_N}$, as noted on FIG. 13. As will be discussed in further detail herein below, it is to be understood that defining target positive and negative write column currents may involve electrical simulation first, and then experimentation for specific chips, with $I_{WCL\_T}$, $VDD_P$ and $VDD_N$ as well as the write column current NFET switches. Ultimately, write currents may be tailored to each specific chip.

In detail, step 1404 in FIG. 14 may include a time-based enablement of (i) global write column line current source(s) 1328, and (ii) write-row-line-current source(s) 1326, which are disabled at all other times, the enabling and disabling of the current sources 1328 and 1326 being controlled by inputs $En\_I_{WCL}$ and $En\_I_{WRL}$, respectively. As shown in FIG. 14, the enable signals should overlap for a prescribed period of time, and, for high hard axis writes the write row line current $I_{WRL}$—which generates the hard axis field—is preferably withdrawn before the write column line currents $I_{WCL\_1}$ through $I_{WCL\_M}$—which generate the easy axis fields. It is important to note that the write column currents $I_{WCL\_1}$ through $I_{WCL\_M}$, in one or more embodiments, may have at least three distinct levels: a positive current level 1406, a zero-magnitude current level 1408, and a negative current level 1410.

The exemplary writing method represented by timing diagram 1400 can be used not only in a test mode of operation (e.g., at wafer test) and in an initial program load (IPL) of operation, but can be used in a system mode of operation as well (all modes being known by those skilled in the art) to redefine a Boolean logic function in situ in the system mode of operation in, for example, a superconducting array circuit (e.g., MJJ-based write circuit 1300 of FIG. 13, RAM, FPGA, PLA, or similar), for a particular target algorithm(s), which may be subsequently run on a quantum computing system.

Figure 15A:
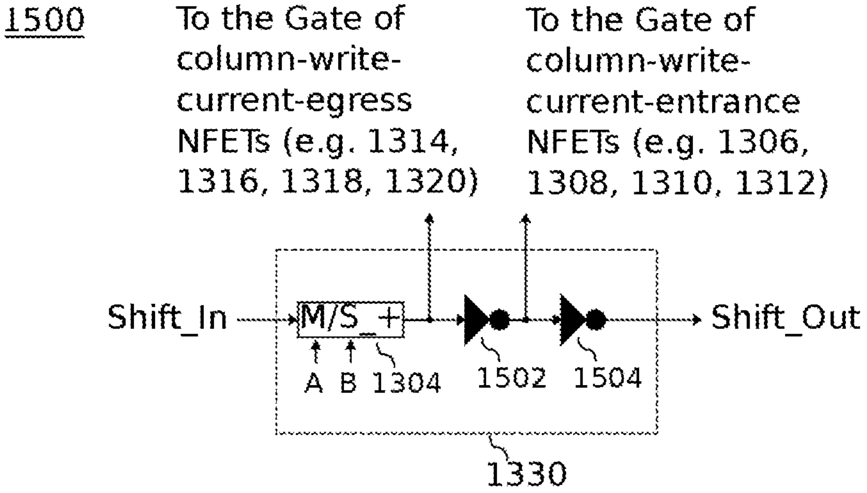
FIGS. 15A and 15B are schematic diagrams depicting exemplary shift circuits suitable for use in conjunction with the illustrative circuit of FIG. 13, according to embodiments of the present invention.

FIG. 15A is a schematic diagram depicting an exemplary shift circuit 1500 suitable for use in conjunction with the illustrative circuit of FIG. 13, according to embodiments of the present invention. The shift circuit 1500, which may be used to implement the illustrative shift circuit 1330 shown in FIG. 13, includes a master/slave latch (M/S_+) 1304. Rather than using two series master-slave latches 1304 for forming the shift circuit 1330, however, the exemplary shift circuit 1500 shown in FIG. 15A retains one master-slave latch 1304 but replaces the second master-slave latch with two series-connected inverters 1502 and 1504.

More particularly, a first input of the master-slave latch 1304 is adapted to receive an input signal, Shift_In, applied to the shift circuit 1500, and an output of the master-slave latch 1304 is connected to an input of a first inverter 1502. The master-slave latch 1304 further includes a first clock input, configured to receive a first clock signal, A, and a second clock input, configured to receive a second clock signal, B. In one or more embodiments, clock signals A and B may be non-overlapping clock signals, as known in the art. An output of the first inverter 1502 is connected to an input of a second inverter 1504, and an output of the second inverter 1504 generates an output signal, Shift_Out, of the shift circuit 1500. The first inverter 1502 generates a complement input control signal, and the second inverter 1504 restores the signal to its original level for a next (i.e., downstream) shift circuit in the shift register 1303 (see FIG. 13). The inversion between pairs of ingress and egress NFET switches connected to an end of a given write column line ensures that one NFET switch is enabled while the other NFET switch is disabled. In this manner, the NFET switches at both ends of the given write column line beneficially enable push-pull current operations to be performed. It is important to understand that, in one or more embodiments, the global current sources do not source current during a shift operation; they are always disabled.

The outputs of the master-slave latches 1304 in each of the shift circuits 1330 may generate a first subset of control signals of the control circuit 1303 which are applied to corresponding gates of the write-column-current-egress NFET switches (e.g., NFET switches 1314, 1316, 1318, 1320 in FIG. 13). The outputs of the first inverters 1502 in each of the shift circuits 1330 may generate a second subset of control signals of the control circuit 1303 which are applied to gates of the write-column-current-ingress NFET switches (e.g., NFET switches 1306, 1308, 1310, 1312 in FIG. 13), and an output, Shift_Out, of the second inverter 1502 in each of the shift circuits 1330 is connected to a Shift_In input of a subsequent shift circuit 1330 in the control circuit 1303.

Figure 15B:
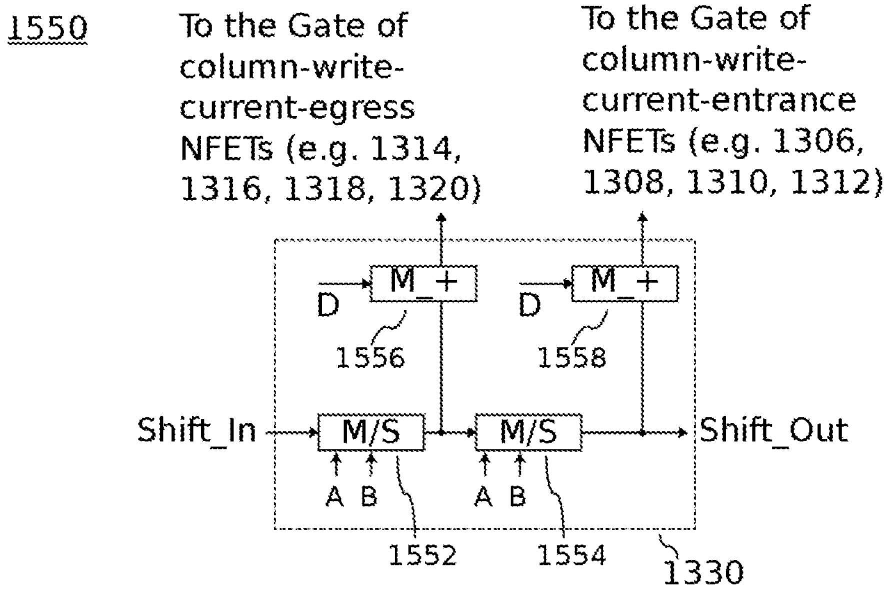

FIG. 15B is a schematic diagram depicting at least a portion of an exemplary shift circuit 1550 suitable for use in conjunction with the illustrative circuit of FIG. 13, according to embodiments of the present invention. The shift circuit 1550 includes a first master/slave latch (M/S_+) 1552, a second master/slave latch 1554 connected in series with the first master/slave later 1552, and at least two master latches (M_+) 1556 and 1558. Specifically, an input of the first master/slave later 1552 is configured to receive an input signal, Shift_In, applied to the shift circuit 1550, and output of the first master/slave latch 1552 is connected to an input of the second master/slave latch 1554, and an output of the second master/slave latch generates an output signal, Shift_Out, of the shift circuit 1550. Each of the first and second master/slave latches 1552, 1554 includes a first clock input, configured to receive a first clock signal, A, and a second clock input, configured to receive a second clock signal, B. In one or more embodiments, clock signals A, B, and C may be non-overlapping clock signals, as known in the art.

A first master latch 1556 includes a first clock input connected to the output of the first master/slave latch 1552, and a second master latch 1558 includes a first clock input connected to the output of the second master/slave latch 1554. Each of the two master latches 1556, 1558 further includes a second clock input configured to receive a third clock signal, D. An output signal generated by the first master latch 1556 in each of the plurality of shift circuits 1550 (1330 in the control circuit 1303 of FIG. 13) is applied to the gate of a corresponding one of the write-column-current-egress NFET switches (e.g., NFETs 1314, 1316, 1318, 1320 in FIG. 13). Similarly, an output signal generated by the second master latch 1558 in each of the plurality of shift circuits 1550 (1330 in the control circuit 1303 of FIG. 13) is applied to the gate of a corresponding one of the write-column-current-ingress NFET switches (e.g., NFETs 1306, 1308, 1310, 1312 in FIG. 13). With the addition of a non-overlapping "D" clock that may be pulsed only when the correct data pattern is fully shifted in place, the master latches 1556, 1558 may decouple the shifting function of the shift register 1303 from the driving function of the shift register 1303 (see FIG. 13). Thus, the exemplary shift circuit 1550 may be beneficial for reducing switching power consumption (e.g., $\frac{1}{2}CV^2$ power consumption of switching FETs) associated with potentially large write row current NFETs, write-column-current-ingress NFETs, and write-column-current-egress NFETs, in accordance with one or more embodiments of the present disclosure.

FIG. 16 is a schematic diagram depicting at least a portion of an exemplary write circuit 1600 for writing MJJs which enables selected unidirectional field applications (e.g., for "toggle" MJJs, as proposed in the art), according to one or more embodiments of the present disclosure. For toggle MJJs, a magnitude of the total write column current, $I_{WCL\_T}$, may be adjusted every write operation since it depends on the existing stored data pattern, which is determined by a read operation issued in advance of the write operation. As will be known by those skilled in the relevant art, every superconducting array cell necessitating a state change requires a write column current $I_{WCL}$ to "toggle." The total write column line current, $I_{WCL\_T}$, in the write circuit 1600 can be determined using the following expression:

$$I_{WCL\_T} = T \times I_{WCL\_P},$$

where T is an integer corresponding to the number of superconducting array cells which need to be toggled (i.e., inverted) in a particular write operation, and $I_{WCL\_P}$ is as previously defined.

The write circuit 1600 includes a plurality of MJJs 1302, a control circuit, which may comprise a shift register 1603, a plurality of write row lines, $WRL_1$ through $WRL_N$ (where N is an integer greater than one), configured to convey a write row line current, $I_{WRL}$, through a selected one of the write row lines, write column lines, $WCL_1$ through $WCL_M$ (where M is an integer greater than one), configured to convey write column line current(s), $I_{WCL\_1}$ through $I_{WCL\_M}$, through a corresponding one of the write column lines, write row current circuits, which may comprise NFET switches 1322 through 1324, and write column current circuits, which may comprise NFET switches 1618 through 1620. Each of the NFET switches 1622 through 1624 in the write row current circuits is connected to a first end of a corresponding one of the write row lines $WRL_1$ through $WRL_N$, respectively; a second end of each of the write row lines is connected to a write-row-line-current source 1626 configured to supply the write row line current for selecting a given row of MJJs 1302 in the write circuit 1600. Similarly, each of the NFET switches 1618 through 1620 in the write column current circuits is connected to a first end of a corresponding one of the write column lines $WCL_1$ through $WCL_M$, respectively; a second end of each of the write column lines is connected to a global write-column-line-current source 1628 configured to supply the write column line current(s) for writing selected MJJs 1302 in the write circuit 1600.

With regard to the architecture of the write column lines $WCL_1$ through $WCL_M$, in comparison to the illustrative write circuit 1300 shown in FIG. 13, which included both write-column-current-ingress circuits (e.g., NFETs 1306, 1308, 1310, 1312) and write-column-current-egress circuits (e.g., NFETs 1314, 1316, 1318, 1320), the exemplary write circuit 1600 of FIG. 16 includes only write-column-current-ingress circuits or write-column-current-egress circuits. In the example shown in FIG. 16, the write circuit 1600 includes write-column-current-egress circuits. Specifically, each of at least a subset of the write-column-current-egress circuits comprises an NFET switch—one of NFET switches 1618 through 1620—having a first source/drain connected to a first end of a corresponding one of the write column lines $WCL_1$ through $WCL_M$, respectively. A second end of each of the write column lines $WCL_1$ through $WCL_M$ is connected to a first terminal of the write-column-line-current source 1628, such as through a first interconnection or bus. A second source/drain of each of the NFET switches 1618 through 1620 is connected to a second terminal of the write-column-line-current source 1628 via a second interconnection, Out_C, which may be ground or other column voltage return. It is to be appreciated that, in one or more alternative embodiments, the write-column-current-egress circuits may be replaced with write-column-current-ingress circuits connected in series between the second end of each of the write column lines $WCL_1$ through $WCL_M$ and the first terminal of the write-column-line-current source 1628, and the first end of each of the write column lines $WCL_1$ through $WCL_M$ may be connected directly to the second terminal of the write-column-line-current source 1628 via the second interconnect Out_C.

Regarding the write row lines $WRL_1$ through $WRL_N$, the write circuit 1600 may include a plurality of write-row-current-ingress circuits or write-row-current-egress circuits. In the example shown in FIG. 16, the write circuit 1600 includes write-row-current-egress circuits. Specifically, each of at least a subset of the write-row-current-egress circuits comprises an NFET switch—one of NFET switches 1322 through 1324. Each of the NFET switches 1322 through 1324 includes a first source/drain connected to a first end of a corresponding one of the write row lines $WRL_1$ through $WCL_N$, respectively. A second end of each of the write row lines $WRL_1$ through $WRL_N$ is connected to a first terminal of the write-row-line-current source 1626, such as through a third interconnection or bus. A second source/drain of each of the NFET switches 1322 through 1324 is connected to a second terminal of the write-row-line-current source 1626 via a fourth interconnection, Out_R, which may be ground or other row voltage return. It is to be appreciated that, in one or more alternative embodiments, the write-row-current-egress circuits may be replaced with write-row-current-ingress circuits connected in series between the second end of each of the write row lines $WRL_1$ through $WRL_N$ and the first terminal of the write-row-line-current source 1626, and the first end of each of the write row lines $WRL_1$ through $WRL_N$ may be connected directly to the second terminal of the write-row-line-current source 1626 via the fourth interconnect Out_R.

With continued reference to FIG. 16, control signals for activating each of the write-column-current-egress circuits (e.g., NFET switches 1618 through 1620) and write-row-current-egress circuits (e.g., NFET switches 1322 through 1324) may be supplied by the shift register 1603. In this illustrative embodiment, the shift register 1603 comprises a plurality of master-slave latches (M/S_+) 1304 connected in series between an input of the shift register, configured to receive an input signal, Shift_In, supplied to the shift register, and an output of the shift register 1603, configured to supply an output signal, Shift_Out. Each of at least a subset of the master-slave latches 1304 may operate in a manner consistent with the description previously provided (e.g., in conjunction with FIGS. 15A-15B). Gates of each of the NFET switches 1618 through 1620 in the write-column-current-egress circuits are connected to corresponding outputs, 1619 through 1621, respectively, of the master-slave latches 1304 in the shift register 1603. Likewise, gates of each of the NFET switches 1322 through 1324 in the write-row-current-egress circuits are connected to corresponding outputs, 1323 through 1325, respectively, of the master-slave latches 1304 in the shift register 1603.

When NFET switches (e.g., 1618 through 1620, and 1322 through 1324) are employed in the write-column-current-egress circuits and write-row-current-egress circuits, the shift register 1603 is configured to generate a high voltage (e.g., VDD) to activate (i.e., enable or turn on) the switches and a low voltage (e.g., ground or zero) to deactivate (i.e., disable or turn off) the switches. In other embodiments, where PFET switches are employed, the control signals supplied by the shift register 1603 may be inverted.

When the global write-column-line-current source(s) 1628 is enabled for a write operation, which is enabled at least partially concurrent in time with activation of the write-row-line-current source(s) 1626, a total (global) write column line current, $I_{WCL\_T}$, divides into zero magnitude current(s) (i.e., no current(s) flow) and/or substantially equal unidirectional current(s), depicted as $I_{WCL\_1}$ through $I_{WCL\_M}$, and these currents are configured to flow through their respective write column lines $WCL_1$ through $WCL_M$, as coordinated by the control circuit (which may comprise the shift register 1603) for managing the currents that write the MJJs 1302, which provides the column input control signals 1619, 1621 applied to the write-column-current-egress circuits 1618, 1620.

At least two magnetic field adjustment embodiments according to aspects of the present disclosure are configured to enable the application of different magnitudes of hard axis and easy axis fields to MJJs in an array, so that each MJJ in the array can be reliably written to a first or second logic state even though it may present non-ideal switching characteristics. While the hard axis field can be directly adjusted easily at its source, write-row-line-current source(s) 1626, by adjusting the magnitude of the current it sources (write row line current $I_{WRL}$), the easy axis fields may not be directly adjusted because both a positive and negative easy axis field, most likely of different magnitudes, may be required to reliably write each MJJ to its first or second logic state. Consequently, an important component of the magnetic-field-adjustment embodiments is to provide different magnitude positive and negative easy axis fields while constraining the number of signal or power lines running from, for example, "room temperature" electronics to "low temperature" electronics.

Figure 17:
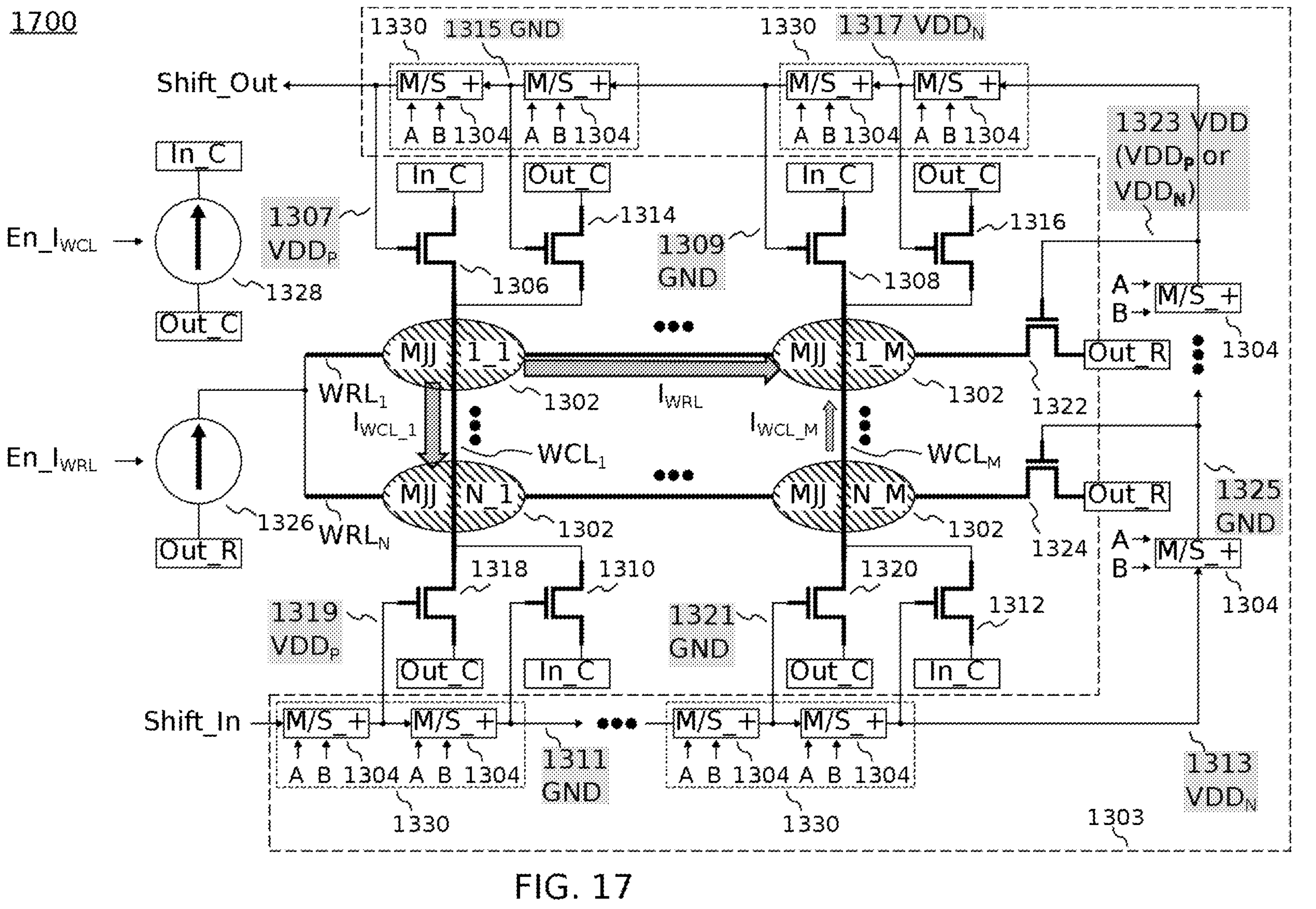
FIG. 17 is a schematic diagram depicting at least a portion of an exemplary circuit for writing MJJs, according to one or more alternative embodiments of the present invention.

By way of example only and without limitation or loss of generality, FIG. 17 is a schematic diagram depicting at least a portion of the illustrative MJJ-based write circuit 1700 (which may be derived from the illustrative write circuit 1300, but having independent VDD rails, $VDD_P$ and $VDD_N$), including exemplary voltages applied to control inputs of the write-column-current-ingress circuits, write-column-current-egress circuits and write-row-current-egress circuits during a write operation, according to one or more embodiments of the present disclosure. More particularly, FIG. 17 illustrates exemplary MJJs (MJJ_1_1 and MJJ_1_M) being written by the write circuit 1300 to a first and second logic state with hard axis and easy axis magnetic fields, which have adjustable magnitudes, as indicated by the write row line WRL and write column line WCL current sizes.

For this illustrative embodiment, two different voltages associated with the write-column current NFET switches (i.e., write-column-current-ingress circuits and the write-column-current-egress circuits) are defined; namely, high voltages $VDD_P$ and $VDD_N$, where the subscript "P" refers to positive (higher VDD) and "N" refers to negative (lower VDD), although embodiments of the present disclosure are not limited to two specific voltages. With these two voltages being applied appropriately to the gates of the NFET switches forming the write-column-current-ingress circuits and the write-column-current-egress circuits (e.g., NFET switches 1306, 1308, 1310, 1312, 1314, 1316, 1318, 1320), the control of gate-to-source and gate-to-drain voltages ($V_{GS}$ and $V_{DS}$, respectively) of selected NFETs can be used to adjust the relative magnitudes of positive column currents associated with writing, without loss of generality, the first logic state (π-state), and negative column currents associated with writing the second logic state (0-state) of the MJJs. $VDD_P$ is applied to the NFET switches in the positive column current path (e.g., NFETs 1306 and 1318), and $VDD_N$ is applied to the NFET switches in the negative column current path (e.g., NFETs 1312 and 1316). The other NFET switches associated with the write column lines may be disabled, such as by setting the appropriate control signals (e.g., 1309, 1311, 1315, 1321) to a voltage of zero (ground or GND) applied to the gates of corresponding NFETs (e.g., 1308, 1310, 1314, 1320).

The total current, $I_{WCL\_TP}$ and $I_{WCL\_TN}$, supplied by each of the global write column line current sources, $\mathbf{1328}_P$ and $\mathbf{1328}_N$, respectively, may be determined by the following expressions:

$$I_{WCL\_TP}=\mathrm{WCLN}_P \times I_{WCL\_P}$$

$$I_{WCL\_TN}=\mathrm{WCLN}_N \times I_{WCL\_N},$$

where $WCLN_P$, $WCLN_N$, $I_{WCL\_P}$, and $I_{WCL\_N}$ are as previously defined. As previously stated, the total write column current $I_{WCL\_T}$ may be determined as a sum of (i) a product of the number of positive write column line currents $WCLN_P$ (an integer) and the magnitude of the desired positive write column current $I_{WCL\_TP}$, and (ii) a product of the number of negative write column line currents $WCLN_N$ (an integer) and the magnitude of the desired negative write column current $I_{WCL\_TN}$, as indicated in FIG. 17.

The high voltage supplies $VDD_P$ and $VDD_N$ may be configured to adjust gate voltages with respect to source and drain voltages of the write-column-current-ingress (or egress) NFET switches, which can be maintained substantially close to ground (GND). As shown in FIG. 17, it is important to recognize that the higher the voltage $VDD_P$ with respect to $VDD_N$, the greater the positive write column line current $I_{WCL\_1}$ (responsible for writing the first logic state (a-state) into MJJ_1_1) flowing through corresponding write column line $WCL_1$ becomes with respect to the negative write column line current $I_{WCL\_M}$ (responsible for writing the second logic state (0-state) into MJJ_1_M) flowing through corresponding write column line $WCL_M$, as indicated by larger and smaller arrows, respectively. In a steady state, the more conductive positive current path NFET switches (e.g., NFETs 1306, 1318) present less resistance compared to the more resistive negative current path NFET switches (e.g., NFETs 1316, 1312). Thus, the positive and negative write column line currents will divide accordingly based on the respective conductances of the NFET switches associated with the write column lines; that is, more current will flow in the write column line(s) with the lowest resistance (i.e., highest conductance) NFET switches, and lesser current will flow in the write column line(s) with the highest resistance (i.e., lowest conductance) NFET switches.

Differentiating voltages can be incorporated into circuits by including level shifters, as will be known by those skilled in the relevant art.

With regard to the write-row-current-egress circuits configured to select a given row of MJJs to be written, in this example NFET switch 1322 associated with write row line $WRL_1$ is selected by the appropriate master-slave latch 1304 in the control circuit 1303 setting a corresponding control signal 1323 to a high voltage, VDD (e.g., either $VDD_P$ or $VDD_N$). The NFET switches (e.g., NFET 1324) associated with the other non-selected write row lines (e.g., $WRL_2$ through $WRL_N$) are disabled, such as by the control circuit 1303 setting the appropriate control signals (e.g., 1325) to a low voltage, zero or ground (GND).

Figure 18:
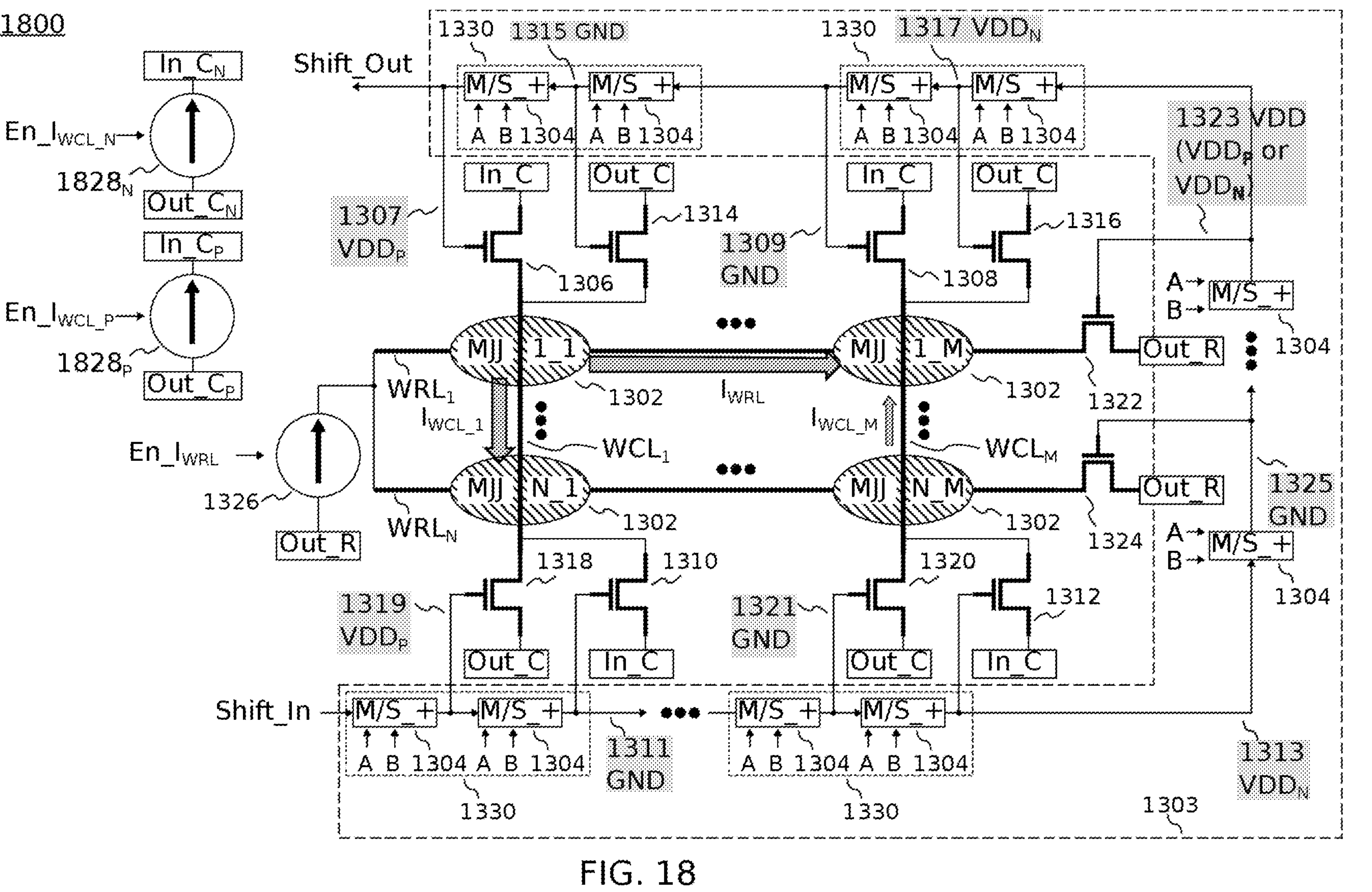
FIG. 18 is a schematic diagram depicting at least a portion of an exemplary circuit for writing MJJs, according to one or more alternative embodiments of the present invention.

By way of example only and without limitation or loss of generality, FIG. 18 is a schematic diagram depicting at least a portion of the illustrative MJJ-based write circuit 1800, including exemplary voltages applied to control inputs of the write-column-current-ingress circuits, write-column-current-egress circuits and write-row-current-egress circuits during a write operation, according to one or more alternative embodiments of the present disclosure. More particularly, in FIG. 18, the illustrative write circuit 1800 is essentially configured in the same manner (i.e., having the control signals for controlling the write-column-current-ingress circuits, write-column-current-egress circuits and write-row-current-egress circuits set at the same voltage levels) as the write circuit 1300 shown in FIG. 17, except that the write-column-line-current source(s) shown in FIG. 18 are arranged as a first write-column-line-current source(s) $\mathbf{1828}_P$ configured to generate a positive write column line current, $I_{WCL\_P}$, and a second write-column-line-current source(s) $\mathbf{1828}_N$ configured to generate a negative write column line current, $I_{WCL\_N}$. The write row line current source 1326 may be the same as used in the write circuit 1300 shown in FIGS. 13 and 17.

With reference to FIG. 18, the exemplary write circuit 1800 is beneficially configured to write selected MJJs 1302 (MJJ_1_1 and MJJ_1_M) to a first logic (π-state) and a second logic state (0-state), respectively, using an alternative arrangement wherein hard axis and easy axis magnetic fields have adjustable magnitudes, as indicated. As stated above, a modification from the original write circuit 1300 shown in FIG. 13 for writing MJJs 1302 may involve dividing the global-write-column-line-current source(s) 1328 (FIG. 13) into two current sources (or two sets of current sources), dedicating the first global write-column-line-current source(s) $\mathbf{1828}_P$ to sourcing positive currents (as directed by the shift register in the control circuit 1303) through selected write column lines and corresponding selected NFET switches (e.g., 1306, 1318, 1308, 1320), and dedicating the second global write-column-line-current source(s) $\mathbf{1828}_N$ to sourcing negative currents (as directed by the control circuit 1303) through selected write column lines and corresponding selected NFET switches (e.g., 1314, 1310, 1316, 1312).

For FIG. 18, the total write column positive current $I_{WCL\_TP}$ may be determined as a product of the number of positive write column line currents $WCLN_P$ (an integer) and the magnitude of the desired positive write column current $I_{WCL\_P}$, and, likewise, the total write column negative current $I_{WCL\_TN}$ may be determined as a product of the number of negative write column line currents $WCLN_P$ (an integer) and the magnitude of the desired negative write column current $I_{WCL\_N}$.

Again, it is important to emphasize that control over "1s" and "0s" write current magnitude may be advantageous in dealing with non-ideal switching asteroids, such as those made necessary by MJJs that at the moment have no synthetic antiferromagnetic layer (SAF) associated with their fixed layer magnets. It is believed, within the present body of superconducting research, that such synthetic antiferromagnetic layers kill supercurrents and thus cannot be viably incorporated into the MJJ stack. Field lines from the magnetic domain of the fixed layer impinge as a demagnetizing, or magnetizing, force on the magnetic domain of the free layer causing, for example, a horizontal shift from an "ideal" asteroid 1902 to an "offset" asteroid 1904, as conceptually depicted in the exemplary Stoner-Wohlfarth switching asteroid plots shown in FIG. 19.

Figure 19:
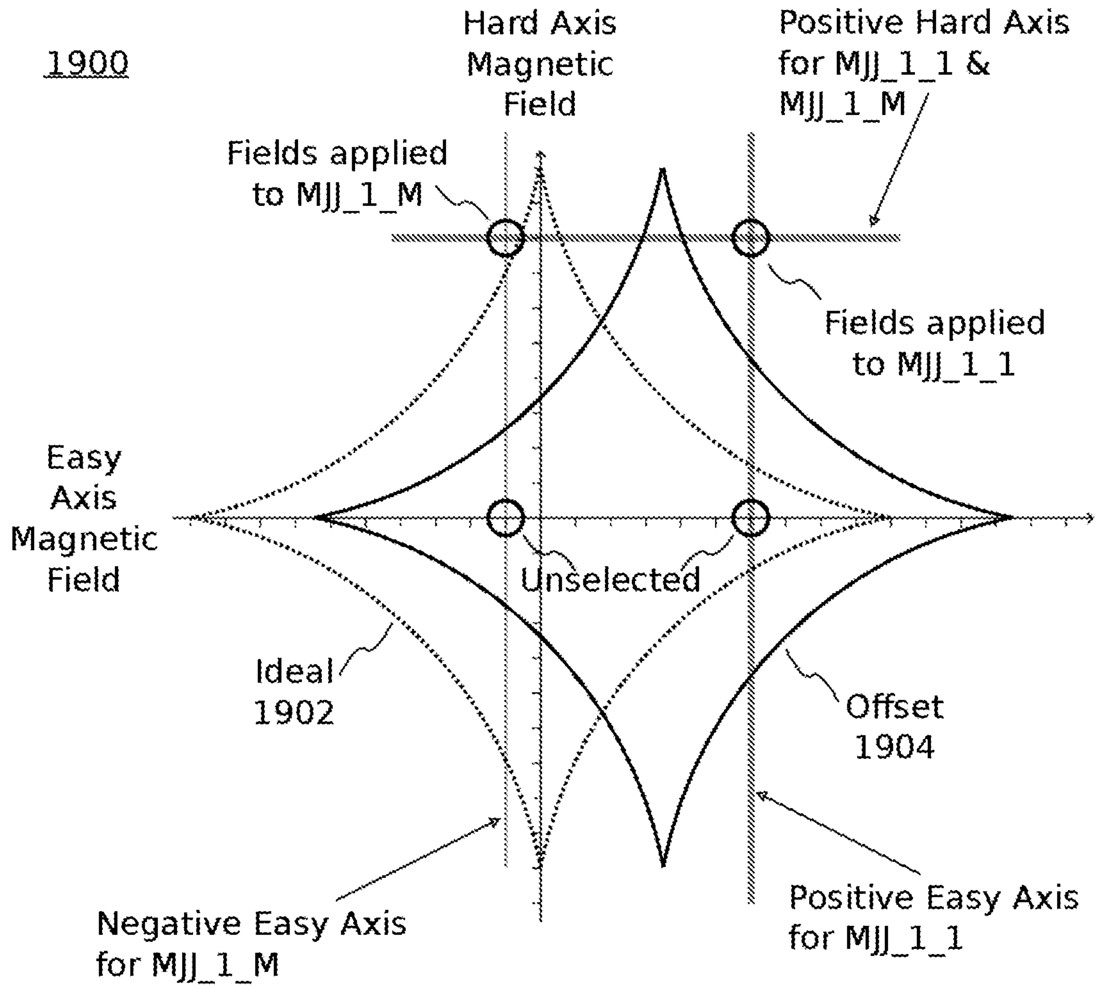
FIG. 19 depicts ideal and non-ideal Stoner-Wohlfarth switching for an MJJ.

Thus, it is important to understand that, although illustrated in FIG. 19 as a thin fixed boundary line conforming to the shape of an asteroid, the actual shape of the asteroid may significantly change and/or an offset (relative to the origin of the axes as shown in FIG. 19) may occur. This change in asteroid shape and/or offset may be due, for example, to environmental conditions (e.g., temperature), MJJ crystalline variations, and/or processing variations, among other factors (rather than characteristics of the underlying fixed layer). Variation between individual JMRAM superconducting array cells (more specifically, their corresponding MJJs) in a memory array substantially reduces the write-select margin within the overall memory array. For example, non-ideal physical artifacts may blur the distinction between half-selected and selected MJJ cells; the former could be written in a write operation intended only for the latter. FIG. 19 conceptually illustrates and explains how hard axis and easy axis field points for writing MJJ_1_1 and MJJ_1_M can be arranged around the offset asteroid 1904 using the circuits for writing MJJs 1300, 1800, where the exemplary currents are displayed in FIG. 17 and FIG. 18, respectively.

Because of very dramatic differences between CMOS circuits and superconducting electronics, CMOS being more than a thousand times denser, it is contemplated that all required hard axis and easy axis field information for writing (i.e., programming) MJJs within a specific chip from a specific wafer can be stored in "room temperature" electronics, such as flash technology. Assuming environmental factors such as temperature do not change, the write circuits according to embodiments of the present disclosure may assure precision writing of MJJs.

Figure 20:
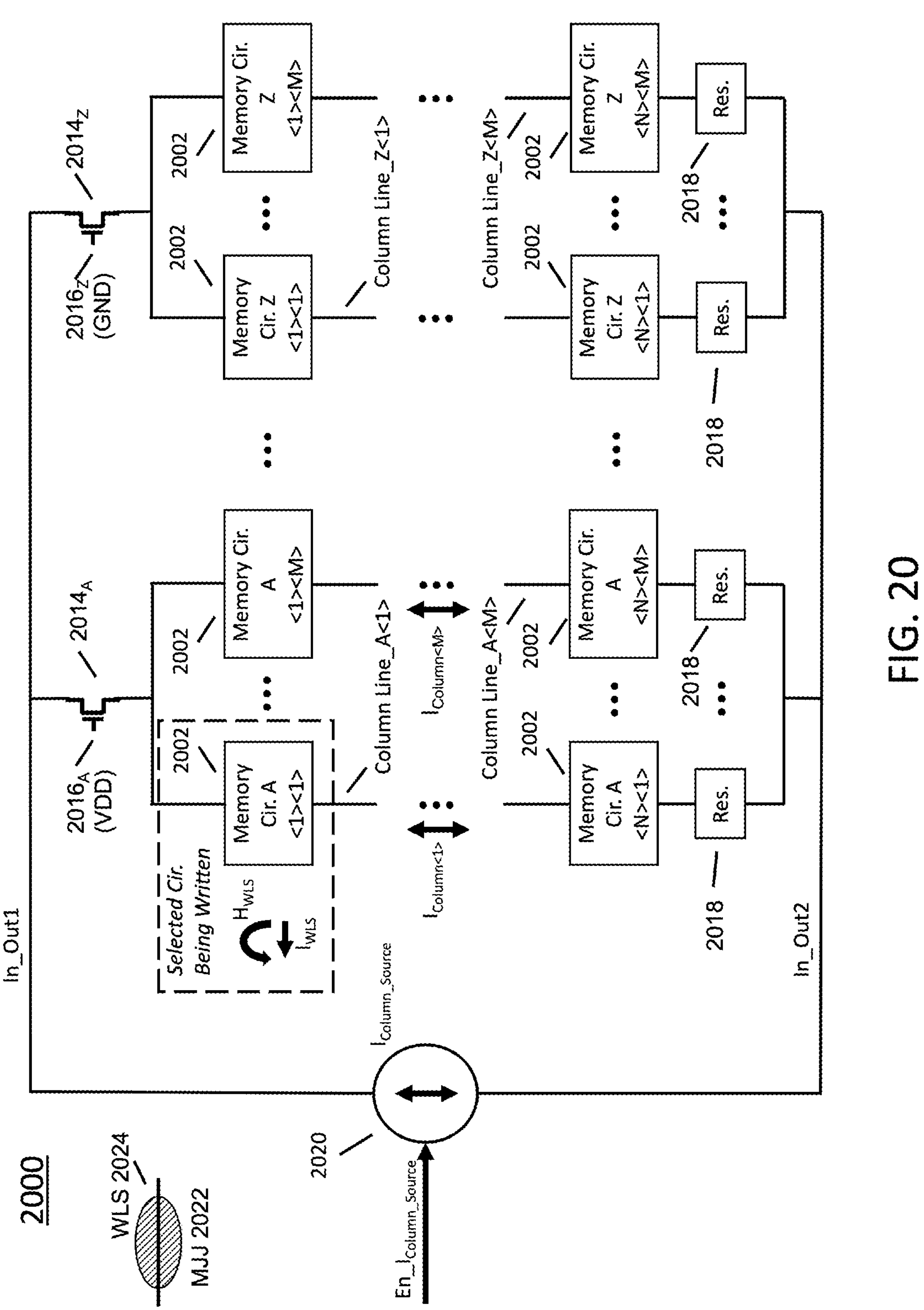
FIG. 20 is a schematic diagram depicting at least a portion of an exemplary circuit for writing MJJs, according to one or more alternative embodiments of the present invention.

FIG. 20 is a schematic diagram depicting at least a portion of an exemplary MJJ-based write circuit 2000 for writing MJJs, according to one or more embodiments of the present invention. As will be described in further detail below, the write circuit 2000 beneficially sources a clockwise or counter-clockwise π-phase setting seed current into superconducting loops of the memory circuit (or alternatively enables a bidirectional easy axis field application in the plane of the MJJ, or a bidirectional spin torque current application) through an MJJ stack of materials via an inductor associated with a memory cell (details of the memory cell are not explicitly shown in FIG. 20). The write circuit 2000 can be used to "program" MJJs, which, for example, may serve as a memory element, which acts as a programmable switch in Josephson magnetic programmable logic arrays (JMPLAs), as described, for example, in U.S. Pat. No. 9,595,970 by W. Reohr, et. al. (the disclosure of which is incorporated by reference herein in its entirety), and which can serve as a memory element for other programmable circuit functions in superconducting field-programmable gate arrays (FPGAs), among other applications.

The write circuit 2000 includes a plurality of memory circuits 2002 arranged into a plurality of write columns, A through Z, although embodiments of the invention are not limited to any specific number of write columns. The memory circuits 2002 in each of the write columns A through Z may be further divided into one or more write column lines, 1 through M, where M is an integer greater than one, with each write column line including a plurality of memory circuits, 1 through N, where N is an integer greater than one. Each of the memory circuits 2002 may be labeled according to the unique row and write column line with which it is associated. Thus, for example, a memory circuit 2002 in write column A, row 1, write column line 1, may be designated as memory circuit A<1><1>, and a memory circuit in write column A, row N, write column line M, may be designated as memory circuit A<N><M>. Similarly, a memory circuit 2002 in write column Z, row 1, write column line 1, may be designated as memory circuit Z<1><1>, and a memory circuit in write column Z, row N, write column line M, may be designated as memory circuit Z<N><M>.

The write circuit 2000 further includes a plurality of (Bi)CMOS switches, which in one or more embodiments may comprise NFETs 2014$_A$ through 2014$_Z$, each NFET being connected in a corresponding one of the write columns A through Z, respectively. More particularly, each of the NFETs 2014$_A$ through 2014$_Z$ preferably includes a first source/drain connected to a first terminal of a write current source 2020 via a first interconnection, In_Out1, a second source/drain connected to a first end of the plurality of column lines 1 through M associated with a corresponding one of the write columns, and a gate configured to receive a corresponding one of a plurality of control signals, 2016$_A$ through 2016$_Z$, supplied thereto. A second end of each of the write column lines in the respective write columns A through Z is connected, through a series-connected resistor 2018 or other resistive element (e.g., a wire), to a second terminal of the write current source 2020 via a second interconnection, In_Out2. In one or more embodiments, the write current source 2020 is configured to supply a bidirectional write current, $I_{Column\_Source}$, for writing state into the plurality of memory circuits 2002.

In this illustrative array-like embodiment shown in FIG. 20, the write circuit 2000 is configured to write only one memory circuit 2002 at a time. By way of example only and without loss of generality, for illustrating an operation of the write circuit 2000, a write operation directed to a selected memory circuit A<1><1> is indicated using a dashed box which surrounds this memory circuit. Also shown in the dashed box is a write line segment current $I_{WLS}$ and a write line segment magnetic field $H_{WLS}$ generated by a write line segment current, which passes through a write line segment WLS 2024, and acts upon a MJJ 2022, of the "selected" memory cell (to generate a hard axis field, in particular, for the preferred embodiment). In order to select memory circuit A<1><1> for writing, NFET 2014$_A$ is activated (i.e., turned on), such as by application of a high voltage (e.g., VDD) control signal 2016$_A$ applied to the gate of the NFET 2014$_A$. A write line segment current, $I_{WLS}$, which is applied only to memory circuit A<1><1>, preferably generates a hard axis magnetic field which can select the memory cell for a write operation, consistent (i) with the relative orientations of WLS 2024 and MJJ 2022, (ii) with FIG. 8 (the inclusion of FET 812, disclosed herein, for selectively writing a memory cell), and (iii) with U.S. Pat. No. 11,120,869 to O. Naaman, et. al.

Each of the write column lines 1 through M in each of the write columns A through Z is preferably configured to convey a write current for writing state into the memory circuits 2002, and may be arranged, in some embodiments, to pass through a transformer in each of at least a subset of the memory cells 2002. Recall from a discussion of the illustrative memory circuit 800 shown in FIG. 8 that the transformer 806 of the exemplary memory circuit 800 may receive a clockwise or counter-clockwise π-phase setting seed current and induces a proportional secondary current for setting a clockwise or counter-clockwise π-phase current in the superconducting loops of the memory circuit 800. In the exemplary write circuit 2000 of FIG. 20, each of at least a subset of the memory circuits 2002 may comprise the exemplary memory circuit 800 of FIG. 8, connected in a serial fashion along a write column line of the write circuit 2000 by connecting each second terminal "In_Out_2_Spin_Torque_&_π-phase" of the memory circuit 800 to each first terminal "In_Out_1_Spin_Torque_&_π-phase," except at the ends of the write column line, where a column of memory circuits 2002 connects to a FET 2014 at a first end of the write column line WCL and to a resistor 2018 at a second end in the write column line WCL for setting a clockwise or counter-clockwise π-phase current in the superconducting loops of the respective memory circuits 2002, and in particular, of a "selected" one of the memory circuits 2002.

Memory circuit 800 may require modification for use in the write circuit 2000, in some embodiments. For example, to support the write operation set forth in U.S. Pat. No. 11,120,869, an orientation of the write line segment (WLS) may be modified with respect to a major axis of the elliptical MJJ so that write line segment 2024 is in parallel (i.e., 0 degrees) with the major axis of the MJJ 2022 in each of the memory circuits 2002, as shown in FIG. 20. With this modification, current conveyed by a write line segment WLS can apply a hard axis field to the selected MJJ for the purpose of driving the MJJ into a 0-state, which in this particular design of a particular MJJ can be achieved when magnetic layers in the MJJ align in parallel (note that, in earlier examples, the 0-state of their MJJs had antiparallel magnetic layer orientations, and therefore the MJJs of the earlier examples had a different design as known in the art).

This approach of Naaman relies on the properties of the superconducting circuit and is very different from MTJ MRAM-like schemes originally proposed for MJJ-based MRAM, where state is encoded in the magnetic orientations of the MJJ. In the ground state of this system, the MJJ should be in an antiparallel orientation that is its π-state. The write circuit 2000 advantageously provides better read and write margins than conventional MJJ write schemes.

It should be understood that this array-like embodiment, and other illustrative embodiments, do not require that the memory circuits 2002 be located at each intersection of a unique row and column pair. Moreover, the terms "row" and "column" lines are used to connote at least intersecting lines which may or may not be orthogonal everywhere. It is also to be appreciated that the terms "row" and "column" are merely intended to convey relative positions. For example, a "row" may become a "column" by rotating the circuit by 90 degrees.

Although not explicitly shown in FIG. 20, each of at least a subset of the memory circuits 2002 in the write circuit 2000 may further include at least one NFET switch for each memory circuit (e.g., arranged in a manner consistent with NFET 812 shown in FIG. 8, as already described), for controlling a write line segment current, $I_{WLS}$, conveyed by a corresponding write line segment WLS 2024 for writing (in the preferred embodiment, more particularly, for selecting to write) at least one corresponding MJJ 2022 (e.g., MJJ 810 of FIG. 8), in one or more embodiments. Specifically, a first terminal of a second current source (not explicitly shown in FIG. 8 or 20, but rather shown as current source 106 of FIG. 1), configured to generate the write line segment current $I_{WLS}$, is connected to first ends of the respective write line segments (e.g. WLS 2024), for example, via In_Out_1 of FIG. 1, associated with memory circuit A<1><1> 2002 through WLS for memory circuit Z<N><M> 2002. The second current source (e.g., current source 106 of FIG. 1), which may comprise a single current source or a plurality of current sources, is preferably adapted to receive at least one control signal, $En\_I_W$ of FIG. 1 for enabling and/or controlling an amplitude of the current $I_W$ generated by the second current source. Each of the NFET switches associated with the write line segments in the respective memory circuits 2002 has a first source/drain connected to a second end of a corresponding one of the write line segments, a second source/drain connected with a second terminal (e.g., terminal In_Out_2 of FIG. 1) of the second current source, and a gate adapted to receive one or more control signals.

When the second (write line segment) current source (e.g., current source 106 of FIG. 1, thus not shown) is enabled for a write operation (e.g., by setting control signal $En\_I_W$ to a "1" (i.e. active) state), a write line segment current $I_{WLS}$ of a prescribed amplitude flow through a selected one of the write line segments, WLS for memory circuit A<1><1> 2002 through WLS for memory circuit Z<N><M> 2002, as enabled by activation of a corresponding one of the write segment line circuits, for example by turning on a corresponding NFET switch (812 of FIG. 8) of the memory circuits 2002.

When the (global write column line) current source 2020 is enabled for a write operation (e.g., by setting control signal $En\_I_{Column\_Source}$ to a "1" (i.e. active) state), which is enabled concurrently (or near concurrently) in time with activation of a second current source (providing the write line segment current $I_{WLS}$, as described in FIG. 1), the total (global) write column line current $I_{WCL\_T}$ divides into substantially equal positive currents (or substantially equal negative currents) within each write column line, associated with an enabled (Bi)CMOS switch/NFET circuit (e.g., NFET 2014$_A$ as appears on FIG. 20). In this regard, it is important to note that positive and negative current magnitudes can be different (because each memory circuit 2002 can be written with different currents sourced by the first and second current sources), which is beneficial to reliable writing of the MJJs within the memory cells 202 in light of their real, non-ideal magnetic switching characteristics. When the first source 2020 is enabled, currents $I_{Column<1>}$ through $I_{Column<M>}$ will flow through a plurality of their associated column lines, column line <1> through column line <M>, as coordinated by the control signals 2016$_A$ through 2016$_Z$ of (Bi)CMOS switch/NFET circuits 2014$_A$ through 2014$_Z$ for managing currents that write one magnetic field selected MJJ ($H_{WLS}$) in the single memory circuit 2002 selected for a write operation, here enclosed by the dashed box (i.e., memory circuit <1><1> 2002).

The total column line current, $I_{Column\_Line\_T}$, may be determined using the following equation:

$$I_{Column\_Line\_T} = \text{WCLN} \times I_{Column}$$

where WCLN is the number of positive (or negative) flowing write column line currents $I_{WCL}$ associated with each write column (e.g., A through Z), and $I_{Column}$ represents a positive (or negative) current component of the write column line current. The total column line current $I_{Column\_Line\_T}$ of FIG. 20 is divided into substantially equal column currents, $I_{Column}$ (i.e., one of $I_{Column<1>}$ through $I_{Column<M>}$), by the presence of resistors 2018 (which serve to "divide" the currents equally as known in the art of superconducting electronics). Again, these column currents induce π-phase setting currents through transformer actions (induction) within each memory circuit 2002.

As explained with respect to FIG. 1, one MJJ associated with a corresponding memory circuit 2002 (e.g., the memory circuit 800) can be selected at a time for a write operation from the entire set of MJJs. In the write circuit 2000 shown in FIG. 20, the gate voltages of each NFET 812 of each memory circuit 800 of FIG. 8 and of each NFETs 2014A through 2014Z of FIG. 20 can be controlled by shift registers. These gate voltages direct currents to flow where necessary to select a memory cell for a write operation (via $I_{WLS}$) and to deliver its state (via $I_{Column}$), respectively.

Enabling the NFET (i.e. NFET 812 of FIG. 8) of memory circuit A<0><0> by driving its gate high, while all other gates of memory circuits 2002 are held low, this embodiment of memory circuit 800 of FIG. 8, in combination with write circuit 100 of FIG. 1, directs a hard axis write line segment current IWLS (which generates a hard axis field HWLS) to select one of the memory circuits 2002 (shown here as memory circuit A<1><1>) from the entire array of memory circuits 2002 (shown here as memory circuit A<1><1> through memory circuit Z<N><M>) for a write operation by π-state potential barrier lowering. The column current IColumn (precisely) induces a clockwise or counterclockwise π-phase setting seed current into the selected memory circuit 2002 (e.g., memory circuit A<1><1>) to set its state. It is notable aspect of this embodiment of the invention that IColumn flows through other memory circuits 2002 (e.g., memory circuit A<1><1> through memory circuit A<N><M>) without impacting their states.

FIG. 21 is a flow diagram depicting at least a portion of an illustrative method 2100 for writing memory circuits, according to one or more embodiments of the invention. As an initial matter, it should be noted that the arrows shown in FIG. 21 are intended to define a flow among the steps of the exemplary method 2100, which may include sequential/ stream flow 2120, 2122, 2124, 2126 and branches 2128, 2130, 2132. The exemplary method 2100 includes the following steps:

Step 2101: An initialization may be performed, wherein at least one memory circuit is selected from a set of memory circuits for subsequent writing;

Step 2102: Move into place the (Bi)CMOS control signals for selecting the at least one memory circuit for a write operation;

Step 2104: Source at least one current to write the selected at least memory circuit to at least one state (e.g., by sourcing write current 1404 in FIG. 14;

Step 2106: Read the at least one memory circuit using its superconducting circuits and transfer at least one read result into a different thermal layer (e.g., at room temperature);

Step 2108: Verify stored state of the at least one memory cell is the at least one state. If identical (passed), move to final step 2110 in the case that the at least one memory cell is the final memory cell intended for a write operation or return to step 2102, choosing a next at least one memory cell for writing. If not identical (failed), move to step 2110;

Step 2110: Failure options; and

Step 2112: Entity/entities ready for operation.

Depending on the number of failures recorded for this particular entity, or particular entities, failure options, essentially step 2110, can [i] perform a retry, [ii] disable entity function altogether, and/or [iii] perform other retries with various adjustments to hard and easy axis fields.

If step 2112 is reached, the entity or entities, for example, a JMPLA(s) or a Josephson magnetic FPGA(s), both of which have MJJs, are ready for operation and thus can perform their newly defined functions in a broader system environment, such as that defined for the controller of a quantum computer system.

It is contemplated that built-in self-test (BIST) may also be used as an alternative to at least some of steps 2106 through 2112.

High-Performance One-Row Parallel Write Operation (e.g., Preferred Embodiments for Use in RAM or Content-Addressable Memory (CAM))

Write operations of memory arrays often involve the parallel application of data across one write cycle. Data for each cycle is not shifted into position. It is generated elsewhere and delivered to the memory arrays substantially concurrently.

A read operation of a MJJ memory circuits/cells can involve JJs, MJJs, transformers, and superconducting wires exclusively. Current hungry write operations of superconducting MJJ-based RAMs, or MJJ-based CAMs, for example, can benefit with the inclusion/addition of selected (Bi)CMOS circuits disposed in the following manner:

i) The first and preferred write circuit approach can be implemented with (a) row (word line) write circuit as (Bi)CMOS circuits and (b) column (bit line) write circuit as superconducting circuits. This preferred approach notably exploits currents generated by (Bi) CMOS write circuits to select a row (word line) of memory cells for a write operation. It is preferred, with respect to the alternative discussed subsequently, (ii), because only one row line (world line) conveys selection current for each write operation. The very significant power consumed by the row circuit in its entirety is principally the power consumed in that row line, which is the product of the row current required to achieve/realize/deliver a particular magnetic field strength on each MJJ (e.g., from 2 mA to 20 mA), the voltage applied across the row circuit (e.g., 200 mV to 2V), the duration of the applied current (e.g., 5 nS to 40 nS), and the frequency (an average utilization) of write operations directed to the RAM (e.g., 1 MHz—by design keep write activity low). It is known that the generation of enough flux to drive a word line (magnetic field) is a significant challenge for superconducting circuits, both (a) in terms of circuit area consumed to store the flux in a giant inductor and (b) in terms of the recovery time of the flux pump for subsequent RAM write operations (e.g., 10 s of microseconds). The column line write circuits can remain as superconducting circuits because, as known in the art, they require significantly fewer flux quanta in each write operation (involving applied column currents, for example, ranging from 10 microAmps to 200 microAmps in the write operation of U.S. Pat. No. 11,120,869, O. Naaman, et. al.);

ii) The second write circuit approach can be implemented with row (word line) write circuits and column (bit line) write circuits both as (Bi)CMOS circuits to reduce superconducting circuit area and to provide greater control over the amplitudes of the write currents via the (Bi)CMOS circuits.

In support of the first write approach (i), superconducting column write circuits for memory arrays can source bidirectional currents required to support their write operations in one or more of the preferred embodiments of the invention. Alternative superconducting column write circuits include (i) U.S. Non-Provisional patent application Ser. No. 17/993,586 by W. Reohr, Nov. 23, 2022 (the disclosure of which is incorporated by reference herein in its entirety) and (ii). U.S. Pat. No. 10,622,977 by O. Naaman, D. Miller, and R. Burnett, Apr. 14, 2020 (the disclosure of which is incorporated by reference herein in its entirety) in combination with U.S. Non-Provisional patent application Ser. No. 17/976,179 by W. Reohr, Oct. 28, 2022 (the disclosure of which is incorporated by reference herein in its entirety). Notably, the former (i), to be exploited in FIG. 23A, may distribute bus signals to multiple instances of superconducting circuits (which adapt to be current sinks and/or sources during operation) while the latter (ii), to be exploited in FIG. 23B, requires wrap around bit lines and can require modifications to the read path circuits to assure Boolean consistency between stored and retrieved data as described by Reohr.

Figure 22:
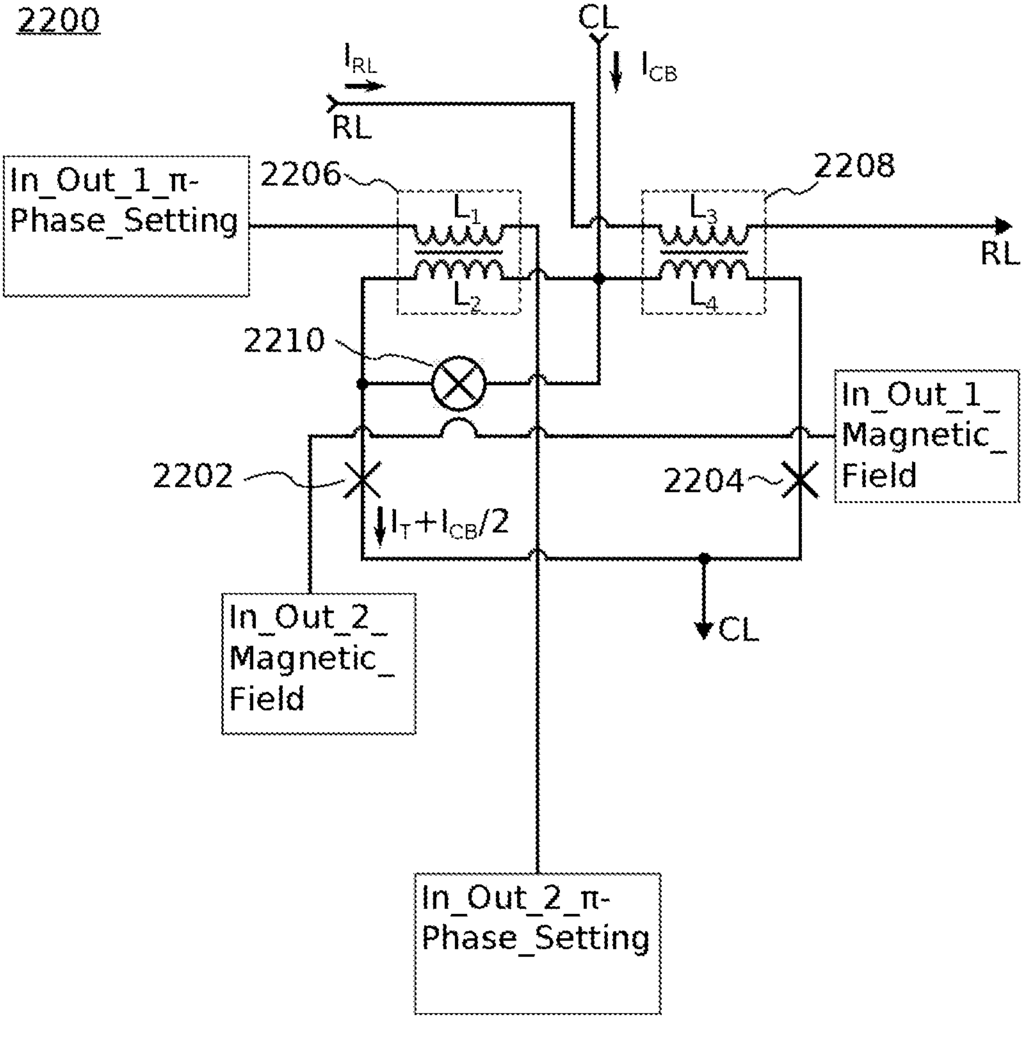
FIG. 22 is a block diagram depicting at least a portion of a conventional MJJ-based memory circuit.

FIG. 22 is an exemplary prior art memory circuit, which can be preferably exploited and incorporated in subsequent FIGS. 23A, 23B, 24, and 25. Its read and write operation are described in U.S. Pat. No. 10,122,351, O. Naaman, et. al., and in U.S. Pat. No. 11,120,869, O. Naaman, et. al., respectively, the disclosures of which are incorporated herein by reference in their entirety.

An integrated write circuit of the exemplary MJJ-based memory cell/circuit 2200 includes a transformer 2206, a MJJ 2210, and first and second write lines, which may be oriented in a write row line, and write column line orientations, respectively, for subsequent FIGS. 23A, 23B, 24, and 25. A first terminal of the first write line may be connected to a first interconnection terminal, In_Out_2_Magnetic_Field, and via a write row line, which passes proximate to the MJJ 2210 for writing a state of the MJJ, connects to a second terminal of the first write line, which may be connected with a second interconnection terminal, In_Out_1_Magnetic_Field. A first terminal of the second write line may be connected to a first interconnection terminal, In_Out_1_π-Phase_Setting, and via a write row line, which passes through to the transformer 2206 for writing a state of the MJJ, connects to a second terminal of the first write line, which may be connected with a second interconnection terminal, In_Out_2_π-Phase_Setting.

Henceforward, the relative orientations of the write row line and each MJJ, in the preferred embodiments, are defined by the following icons: WRL 2324 and MJJ 2322 (of FIG. 23A), WRL 2374 and MJJ 2372 (of FIG. 23B), WRL 2424 and MJJ 2422 (of FIG. 24), and WRL 2524 and MJJ 2522 (of FIG. 25). As was the case with WLS 2024 and MJJ 2022 (of FIG. 20). these icons that the write row line WRL conveys write row line current $I_{WRL}$ that generates a hard axis field on the selected row of MJJs.

Figure 23A:
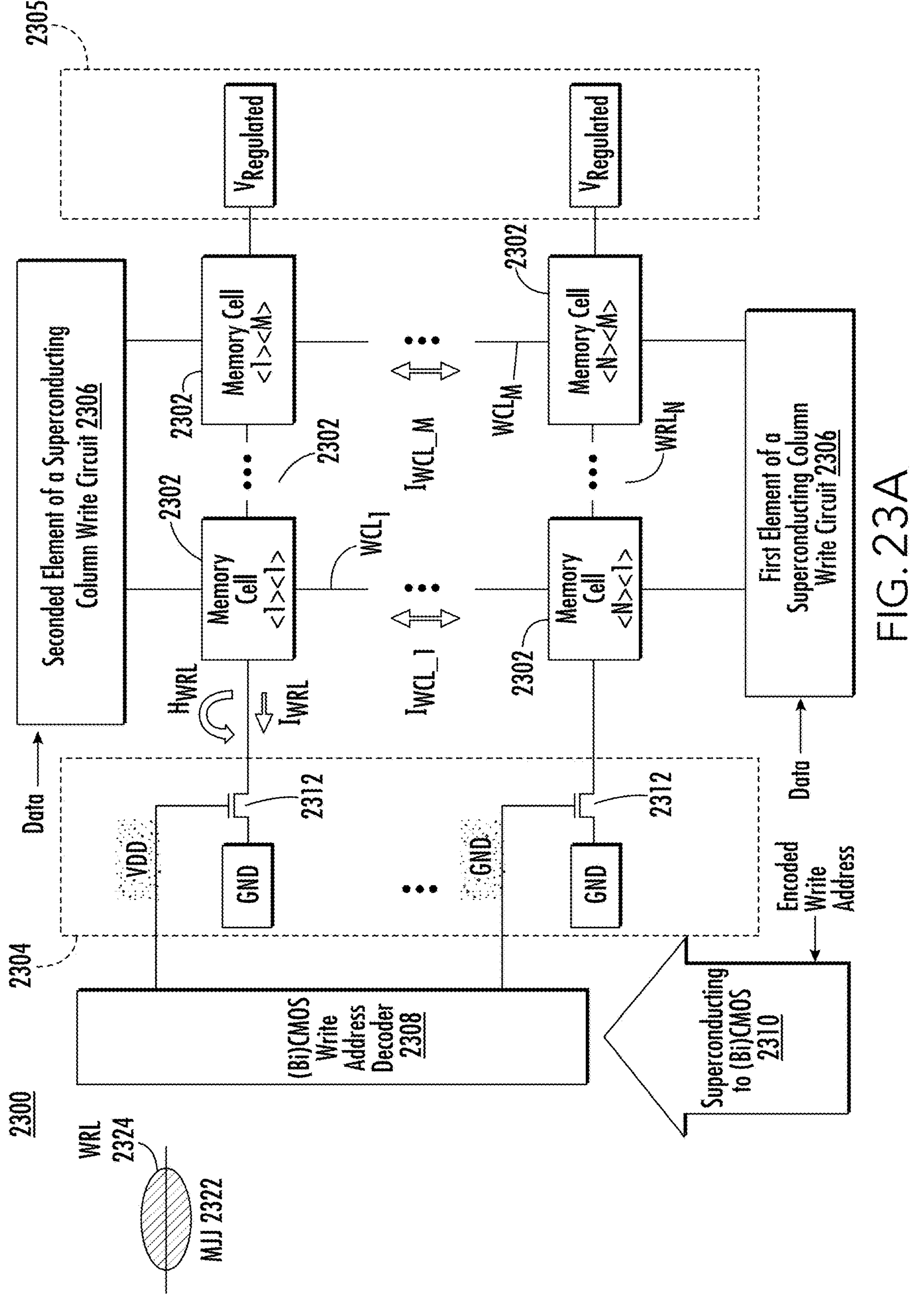
FIG. 23A is a schematic diagram depicting at least a portion of an exemplary write circuit for writing MJJs, that may be embedded within superconducting memory cells, using mixed superconducting and (Bi)CMOS write circuits, according to one or more embodiments of the present invention.

FIG. 23A is a schematic diagram depicting at least a portion of an exemplary write circuit 2300 for writing MJJs, that may be embedded within superconducting memory cells, using mixed superconducting and (Bi)CMOS write circuits, according to one or more embodiments of the present disclosure. To aid in a comprehension of this illustrative embodiment, conductor currents and exemplary NFET gate voltages associated with an active mode of the write circuit 2300 are indicated in FIG. 23A by way of example only and without limitation or loss of generality. Unlike in the exemplary write circuit 2000 shown in FIG. 20, where column currents are ideally identical in sign and magnitude, column write line currents generated in the write circuit 2300 of FIG. 23A, as well as in illustrative write circuits shown in FIGS. 23B, 24, and 25, can be positive (i.e., first direction) or negative (i.e., second direction) depending on what state is being written into each memory cell in the set of selected memory cells, according to one or more embodiments. It is to be understood, however, that embodiments of the invention are not limited to any particular assignment of current direction and polarity.

As will be described in further detail below, the write circuit 2300 beneficially enables a clockwise or counter-clockwise application of π-phase setting seed current into superconducting loops of the memory circuit (or alternatively enables a bidirectional easy axis field application in a plane of the MJJ, or alternatively a bidirectional spin torque current application) through the MJJ stack of materials via a transformer (e.g., transformer 2206, the column line connection being formed accordingly) or other coupling element associated with the memory circuit. The write circuit 2300 can be used to "write" or "program" MJJs, which can serve as memory elements in JMRAM and in JMPLAs, for example as described in U.S. Pat. No. 9,595,970 by W. Reohr, et. al. (the disclosure of which is incorporated by reference herein in its entirety), and which can serve as memory cells for other programmable circuit functions in superconducting FPGAs, among other applications.

With continued reference to FIG. 23A, the write circuit 2300 preferably includes a plurality of memory cells 2302, memory cell<1><1> through memory cell<N><M>, where N and M are integers, at least one (Bi)CMOS row write circuit 2304, a superconducting column write circuit 2306, including first and second elements, a plurality of write row lines, $WRL_1$ through $WRL_M$, connected to the row write circuit 2304 and arranged in a row (i.e., horizontal) orientation, and a plurality of write column lines, $WCL_1$ through $WCL_M$, connected to the column write circuit 2306 and arranged in a column (i.e., vertical) orientation. In this configuration, wherein each memory cell 2302 to be written may have at least one MJJ, the (Bi)CMOS row write circuit 2304 is configured to generate a write row line current, $I_{WRL}$, that is conveyed by a selected one of the write row lines $WRL_1$ through $WRL_N$. The first element of the superconducting column write circuit 2306, which may be connected to a bottom end of each of the write column lines $WCL_1$ through $WCL_M$, and the second element of the superconducting column write circuit 2306, which may be connected to a top end of each of the write column lines, are collectively configured to generate a plurality of write column line supercurrents, $I_{WCL\_1}$ through $I_{WCL\_M}$, that are conveyed by the write column lines $WCL_1$ through $WCL_M$, respectively. It is contemplated that more than one write column line may be associated with each column of memory cells 2302; that is, a memory cell 2302 may require more than one column input to complete a write operation, either for selection or for state definition. Likewise, it is contemplated that more than one write row line may be associated with each row of memory cells 2302; that is, a memory cell 2302 may require more than one row input to complete a write operation, either for selection or for state definition.

Each of the write column lines 1 through M ($WCL_1$ through $WCL_M$) is configured to convey a write column line current, $I_{WCL\_1}$ through $I_{WCL\_M}$, respectively, for writing state into the memory cells 2302, and may be arranged, in some embodiments, to pass through a transformer in each of at least a subset of the memory cells 2302. As previously stated in conjunction with the exemplary memory circuit 2200 of FIG. 22, the transformer 2206 of the exemplary memory circuit 2200 may receive a clockwise or counter-clockwise π-phase setting seed current and induces a proportional secondary current for setting a clockwise or counter-clockwise π-phase current in the superconducting loops of the memory circuit 2200. In the exemplary write circuit 2300 of FIG. 23A, each of at least a subset of the memory cells 2302 may comprise the exemplary memory circuit 2200 of FIG. 22, connected in a serial fashion along a given write column line of the write circuit 2300, for example by connecting each second terminal "In_Out_2_π-Phase_Setting" of the memory cell 2200 (FIG. 22) to each first terminal "In_Out_1_π-Phase_Setting," except at the ends of the write column line where a column line, thereby formed, of memory cells 2302 connects to a second element of a superconducting column write circuit 2306 at a first end, and to a first element of a superconducting column write circuit 2306 at a second end along the given write column line WCL for setting a clockwise or counter-clockwise π-phase current in the superconducting loops of each of the memory cells, and in particular, of a "selected" one of the memory cells 2302.

The first and second elements of the superconducting column write circuit 2306 can act collectively to control the direction of the write column line currents $I_{WCL\_1}$ through $I_{WCL\_M}$, qualifying each of the column line currents as negative or positive currents, as described in U.S. application Ser. No. 17/993,586 to Reohr, which is incorporated herein by reference in its entirety. Each datum of the data preferably defines a sign (i.e., direction) of the current flowing in a corresponding column. It should be noted that the data is supplied to both to the first and second elements of the superconducting column write circuit 2306 where, as known in the art, it triggers portions of a superconducting circuit into a voltage state, which diverts and directs currents along a particular path that defines the sign of the current conveyed in each of the respective write column lines $WCL_1$ through $WCL_M$.

In one or more embodiments, column currents can induce clockwise or counter-clockwise π-phase setting seed currents in the superconducting loops of the memory cells 2302. While not identical to a (Bi)CMOS push-pull circuit in its internal function, the superconducting bidirectional driver described in U.S. application Ser. No. 17/993,586 to Reohr performs a similar global function as the push-pull circuit; that is, to drive a positive or negative current (i.e., in a first or second direction) based on an input datum signal.

The (Bi)CMOS row write circuit 2304 may comprise a plurality of NFET switches 2312 or alternative switch elements, configured to selectively control which of the write row lines $WRL_1$ through $WRL_N$ will convey the write row line current $I_{WRL}$ for selecting a row of the memory cells 2302 <1><1> through <N><M> for a write operation, in one or more embodiments. In one or more embodiments, only one NFET current switch 2312 is enabled during a given write cycle to direct the write row line current $I_{WRL}$ through a selected write row line.

A voltage supply, $V_{Regulated}$, 2305, which may be a regulated voltage supply, may be connected to first ends of the respective write row lines $WRL_1$ through $WRL_N$, while the (Bi)CMOS row write circuit 2304, including NFETs 2312, is connected to second ends of the respective write row lines $WRL_1$ through $WRL_N$. The voltage supply $V_{Regulated}$ 2305, in one or more embodiments, may be configured to control an amplitude of the write row line current $I_{WRL}$ that is conveyed in the write row lines. Each of the NFETs 2312 preferably has a first source/drain connected to a second end of a corresponding one of the write row lines $WRL_1$ through $WRL_N$, a second source/drain connected to a voltage source, which may be ground (GND), and a gate adapted to receive a corresponding one of a plurality of control signals generated by a (Bi)CMOS write address decoder 2308.

The write circuit 2300 may further include a conversion circuit 2310 configured to convert superconducting signals to (Bi)CMOS signals suitable for use with the (Bi)CMOS write address decoder 2308. In one or more embodiments, the superconducting signals can be converted to (Bi)CMOS signals with the aid of Suzuki stacks included in the conversion circuit 2310. Suzuki stacks are known in the art and therefore will not be described in detail herein. Interfacing directly with the (Bi)CMOS write address decoder 2308 (and/or the (Bi)CMOS row write circuit 2304, not explicitly shown but implied), such converted (Bi)CMOS signals (labeled "encoded write address" in FIG. 23A) may include, for example, (i) write timing triggers, for shaping the write row line current $I_{WRL}$ into a pulse; (ii) write timing triggers, for enabling the write row line current $I_{WRL}$ with respect to other signals, such as a pulse associated with the write column line currents $I_{WCL\_1}$ and $I_{WCL\_M}$; and (iii) address signals, for selecting a particular row. Address signals are preferably "encoded," as noted, to decrease the size of the superconducting to (Bi)CMOS conversion circuit 2310.

As known in the art, the (Bi)CMOS write address decoder 2308 may generate "hot" signals, the hot signals being set to a high voltage, such as VDD (as noted), and "cold" signals, the cold signals being set to a low voltage, such as GND (as noted), for enabling and disabling, respectively, corresponding NFETs 2312 for conveying write row line current $I_{WRL}$ through the write row lines $WRL_1$ through $WRL_N$. In this example, write row line $WRL_1$ conveys the write row line current $I_{WRL}$ since its corresponding NFET 2312 is enabled by application of a gate voltage of VDD. The remaining write row lines $WRL_2$ through $WRL_N$ will not convey any write row line current since the respective NFETs 2312 corresponding to these unselected write row lines are disabled by application of a gate voltage of GND.

Address and time triggers (clock signals) associated with the write operation can be transferred through the conversion circuit 2310, which can provide bit conversions ranging from substantially serial to substantially parallel. Substantially serial bit conversions may notably reduce the superconducting die area associated with the Suzuki stack.

It should be understood that row and write column line currents can be used to induce superconducting currents in the memory cells 2302, such as through transformers (e.g., transformers 806 and/or 808 in FIG. 8), or can couple magnetic fields directly to the MJJs of the memory cells 2302. Not intended to be limiting, the magnetic field, $H_{WRL}$, generated by the write row line current $I_{WRL}$ conveyed along the write row line $WRL_1$ shown in FIG. 23A, is illustrative of one embodiment which couples the magnetic field $H_{WRL}$ onto the MJJ directly.

The (Bi)CMOS write address decoder 2308 and row write circuit 2304 may considerably reduce chip area in an implementation of mixed (Bi)CMOS and superconducting chips/dies, compared to an implementation that exclusively uses superconducting circuits in the superconducting chips/dies, primarily because (a) (Bi)CMOS circuit area scales substantially better compared to superconducting circuits (e.g., area may be reduced by greater than 500 times) and (b) (Bi) CMOS circuits can be placed below superconducting circuits on the chips/dies.

Figure 23B:
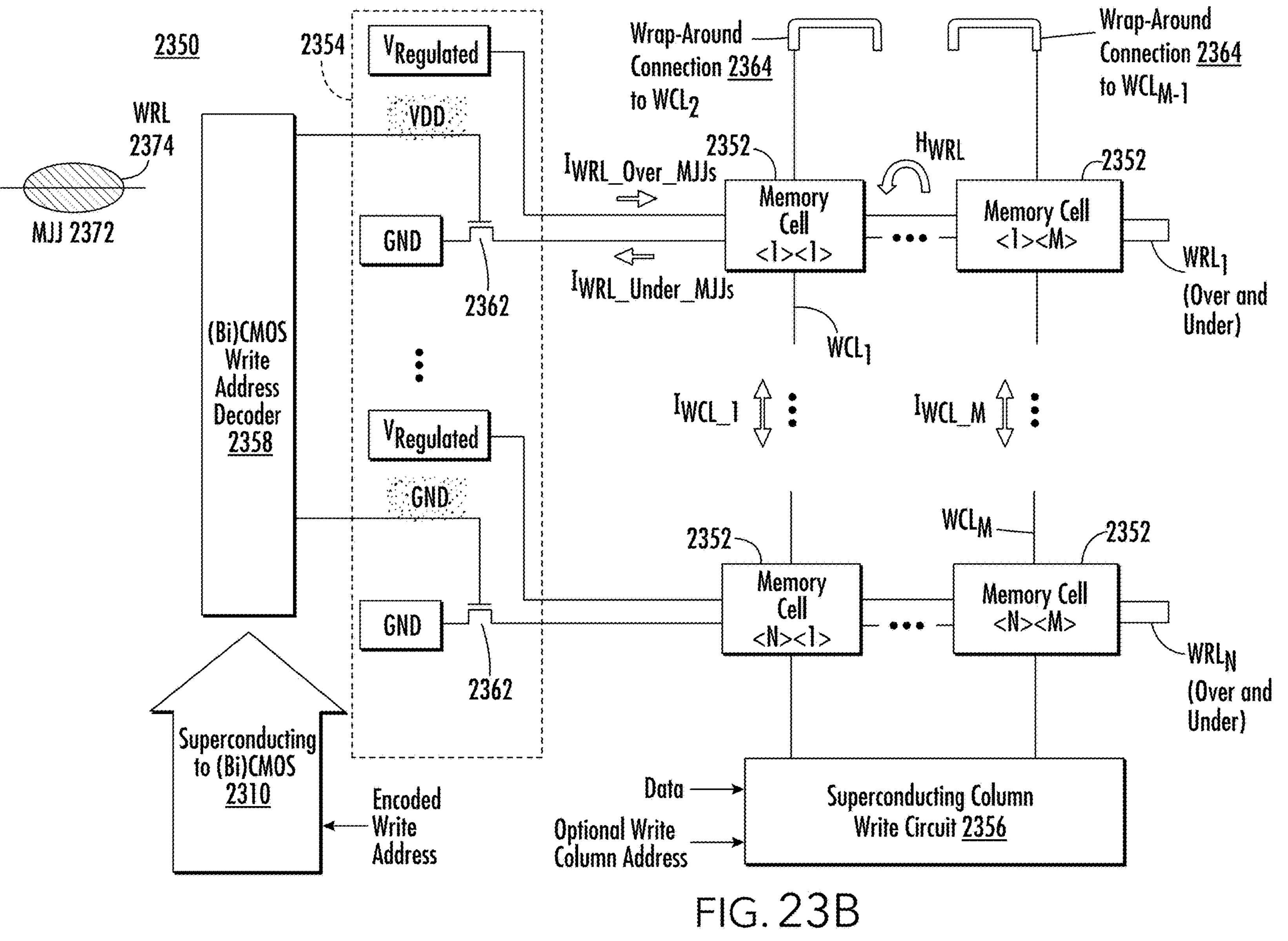
FIG. 23B is a schematic diagram depicting at least a portion of an exemplary write circuit for writing MJJs, that may be embedded within superconducting memory cells, using mixed superconducting and (Bi)CMOS write circuits, according to one or more embodiments of the present invention.

FIG. 23B is a schematic diagram depicting at least a portion of an exemplary write circuit 2350 for writing MJJs, that may be embedded within superconducting memory cells, using mixed superconducting and (Bi)CMOS write circuits, according to one or more embodiments of the present disclosure. The write circuit 2350 has a topology that is consistent with the illustrative write circuit 2300 shown in FIG. 23A, except that the write circuit 2350 employs wrap-around write column lines and write row lines that pass under and over each of a plurality of memory cells 2352, <1><1> through <N><M>, each of the memory cells comprising at least one MJJ.

Specifically, a superconducting column write circuit 2356 included in the write circuit 2350 is configured to control a direction of the write column line currents $I_{WCL\_1}$ through $I_{WCL\_M}$, qualifying each of the write column line currents as negative or positive, indicative of an assigned direction of the write column line current flow in the corresponding write column lines, as described, for example, in U.S. Pat. No. 10,622,977 by O. Naaman, et. al. Each datum of the data supplied to the superconducting column write circuit 2356 may define the sign of the current for a particular write column line. It should be appreciated that, in contrast to the write circuit 2300 shown in FIG. 23A, each write column line current $I_{WCL}$ may be sourced by, and returns to, the same superconducting column write circuit 2356. This feature is achieved by the use of wrap-around connections 2364 in the write column lines, each wrap-around connection being configured to connects a pair of adjacent even and odd write column lines.

In one or more embodiments, write column line currents may induce clockwise or counter-clockwise π-phase setting seed currents in the superconducting loops of the memory cells 2352. While not identical to a (Bi)CMOS push-pull circuit in its internal function, a superconducting bidirectional driver performs a similar global function, which is to drive a negative or positive current (in a first or second direction) as a function of an input datum signal.

In the illustrative write circuit 2350 of FIG. 23B, a given write row line, such as $WRL_1$, carries write row line current, $I_{WRL\_Over\_MJJs}$ and $I_{WRL\_Under\_MJJs}$, which is actually the same current viewed at different locations along the given write row line, that passes over and under, respectively, the MJJs in the memory cells 2352, such as memory cells <1><1> through <1><M> associated with the write row line $WRL_1$. Using this wrap-around topology for the write column lines increases the magnetic field coupled into the MJJs (e.g., effectively doubling the magnetic field coupled into the respective memory cells). In order to achieve this topology, the write circuit 2350 includes a modified (Bi)CMOS row write circuit 2354.

The modified (Bi)CMOS row write circuit 2354, like the row write circuit 2304 shown in FIG. 23A, preferably includes a plurality of NFET switches 2362 or alternative switch elements, configured to selectively control which of the write row lines $WRL_1$ through $WRL_N$, each being "over and under" write row lines, will convey the write row line current $I_{WRL\_Over\_MJJs}$ and $I_{WRL\_Under\_MJJs}$ for selecting the memory cells 2352. In one or more embodiments, only one NFET current switch 2362 is enabled during a given write cycle to direct the write row line current $I_{WRL\_Over\_MJJs}$ and $I_{WRL\_Under\_MJJs}$ through a selected write row line. Unlike the row write circuit 2304, however, a regulated voltage supply, $V_{Regulated}$, is integrated into the row write circuit 2354. Thus, in the (Bi)CMOS row write circuit 2354, the write row line current $I_{WRL\_Over\_MJJs}$ and $I_{WRL\_Under\_MJJs}$ is sourced by the regulated supply and returned to ground GND.

Figure 24:
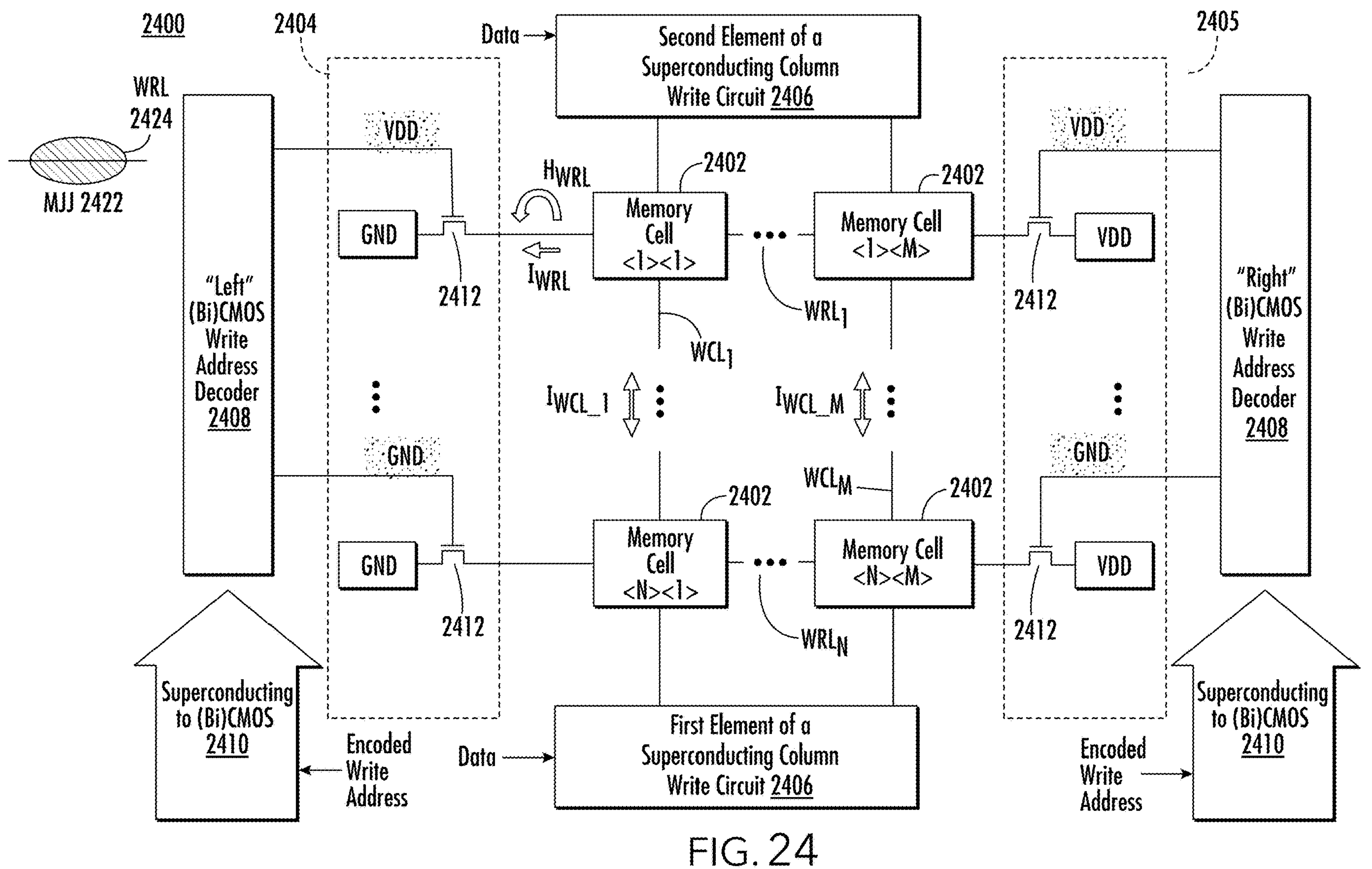
FIG. 24 is a schematic diagram depicting at least a portion of an exemplary write circuit for writing MJJs, that may be embedded within superconducting memory cells, using mixed superconducting and (Bi)CMOS write circuits, according to one or more embodiments of the present invention.

FIG. 24 is a schematic diagram depicting at least a portion of an exemplary mixed superconducting and (Bi)CMOS write circuit 2400, according to another embodiment of the present disclosure. The write circuit 2400, like the illustrative write circuit 2300 shown in FIG. 23A, includes a plurality of memory cells 2402, memory cell<1><1> through memory cell<N><M>, where N and M are integers, at least two (Bi)CMOS row write circuits 2404 and 2405, a superconducting column write circuit 2406, including first and second elements, a plurality of write row lines, $WRL_1$ through $WRL_M$, connected to the (Bi)CMOS row write circuit 2404 and arranged in a row (i.e., horizontal) orientation, and a plurality of write column lines, $WCL_1$ through $WCL_M$, connected to the column write circuit 2406 and arranged in a column (i.e., vertical) orientation. In this configuration, wherein each memory cell 2402 to be written may have at least one MJJ, the (Bi)CMOS row write circuits 2404, 2405, collectively, are configured to generate a write row line current, $I_{WRL}$, that is conveyed by a selected one of the write row lines $WRL_1$ through $WRL_N$. Having row write circuits 2404, 2405 connected at both ends of the write row lines beneficially provides the ability to decouple unselected write row lines to thereby reduce current surges in unselected write row lines of the write circuit 2400.

The first and second elements of the superconducting column write circuit 2406, collectively, are configured to generate a plurality of write column line supercurrents, $I_{WCL\_1}$ through $I_{WCL\_M}$, that are conveyed by the write column lines $WCL_1$ through $WCL_M$, respectively. It is contemplated that more than one write column line may be associated with each column of memory cells 2402; that is, a memory cell 2402 may require more than one column input to complete a write operation, either for selection or for state definition. It is to be appreciated that the first and second elements of the superconducting column write circuit 2406 may be configured in a manner consistent with the superconducting column write circuit 2306 shown in FIG. 23A.

Each of the (Bi)CMOS row write circuits 2404, 2405 may comprise a plurality of NFET switches 2412 or alternative switch elements. Each of the write row lines $WRL_1$ through $WRL_N$ is preferably connected at a first end to a first one of the row write circuits (e.g., 2404), and is preferably connected at a second end to a second one of the row write circuits (e.g., 2405). Functioning together, corresponding pairs of NFETs 2412 in the first and second (Bi)CMOS row write circuits 2404, 2405 are configured to selectively control which of the write row lines $WRL_1$ through $WRL_N$ will convey the write row line current $I_{WRL}$ for writing the memory cells 2402, and to control a direction of the write row line current.

More particularly, each of the NFETs 2412 in the first and second (Bi)CMOS row write circuits 2404, 2405 preferably includes a first source/drain connected to a corresponding one of the write row lines, $WRL_1$ through $WRL_N$, a second source/drain connected to a voltage source, which may be programmable, and a gate adapted to receive a corresponding one of a plurality of control signals generated by corresponding (Bi)CMOS write address decoders 2408; a first ("left") (Bi)CMOS write address decoder configured to generate a first subset of control signals supplied to the first row write circuit 2404, and a second ("right") (Bi)CMOS write address decoder configured to generate a second subset of control signals supplied to the second row write circuit 2405. The first and second subsets of control signals may be function in conjunction with one another to enable or disable a pair of NFETs in the first and second row write circuits 2404, 2405 that are associated with the same write row line. In one or more embodiments, the voltage supplied to the second source/drain of each of the NFETs 2412 may be independently controlled so that an amplitude and direction of the write row line current $I_{WRL}$ can be optimized according to characteristics of the individual MJJs in each of the memory cells 2402 to be written.

By way of example only and without limitation, for a corresponding pair of NFETs 2412 connected to the same write row line, such as $WRL_1$, when configured such that a source/drain of the NFET 2412 in the second row write circuit 2405 is connected to VDD and a source/drain of the NFET 2412 in the first row write circuit 2404 is connected to ground, a write row line current $I_{WRL}$ will flow from the second row write circuit 2405 to the first row write circuit 2404, upon application of the appropriate control signals to gates of the corresponding NFETs (which are driven to VDD). Likewise, when configured such that a source/drain of the NFET 2412 in the second row write circuit 2405 is connected to ground and a source/drain of the NFET 2412 in the first row write circuit 2404 is connected to VDD, the write row line current $I_{WRL}$ will flow in the opposite direction (i.e., from the first row write circuit 2404 to the second row write circuit 2405). In one or more embodiments, only one pair of NFET switches 2412 is enabled during a given write cycle to direct the write row line current $I_{WRL}$ through a selected write row line. Regulated voltages can be introduced at points labeled "VDD" to control the write row line current in this circuit.

The write circuit 2400 may further include two conversion circuits 2410, each of which being configured to convert superconducting signals to (Bi)CMOS signals suitable for use with the (Bi)CMOS write address decoders 2408. Like the conversion circuit 2310 previously described in conjunction with FIG. 23A, the superconducting signals can be converted to (Bi)CMOS signals with the aid of Suzuki stacks included in the conversion circuits 2410, in one or more embodiments. Interfacing directly with the (Bi)CMOS write address decoders 2408 (and/or the (Bi) CMOS row write circuits 2404,2405, not explicitly shown but implied), such converted (Bi)CMOS signals (labeled "encoded write address" in FIG. 24) may include, for example, (i) write timing triggers, for shaping the write row line current $I_{WRL}$ into a pulse; (ii) write timing triggers, for enabling the write row line current $I_{WRL}$ with respect to other signals, such as a pulse associated with the write column line currents $I_{WCL\_1}$ and $I_{WCL\_M}$; and (iii) address signals, for selecting a particular row. Address signals are preferably "encoded," as noted, to decrease the size of the superconducting to (Bi)CMOS conversion circuits 2410.

Figure 25:
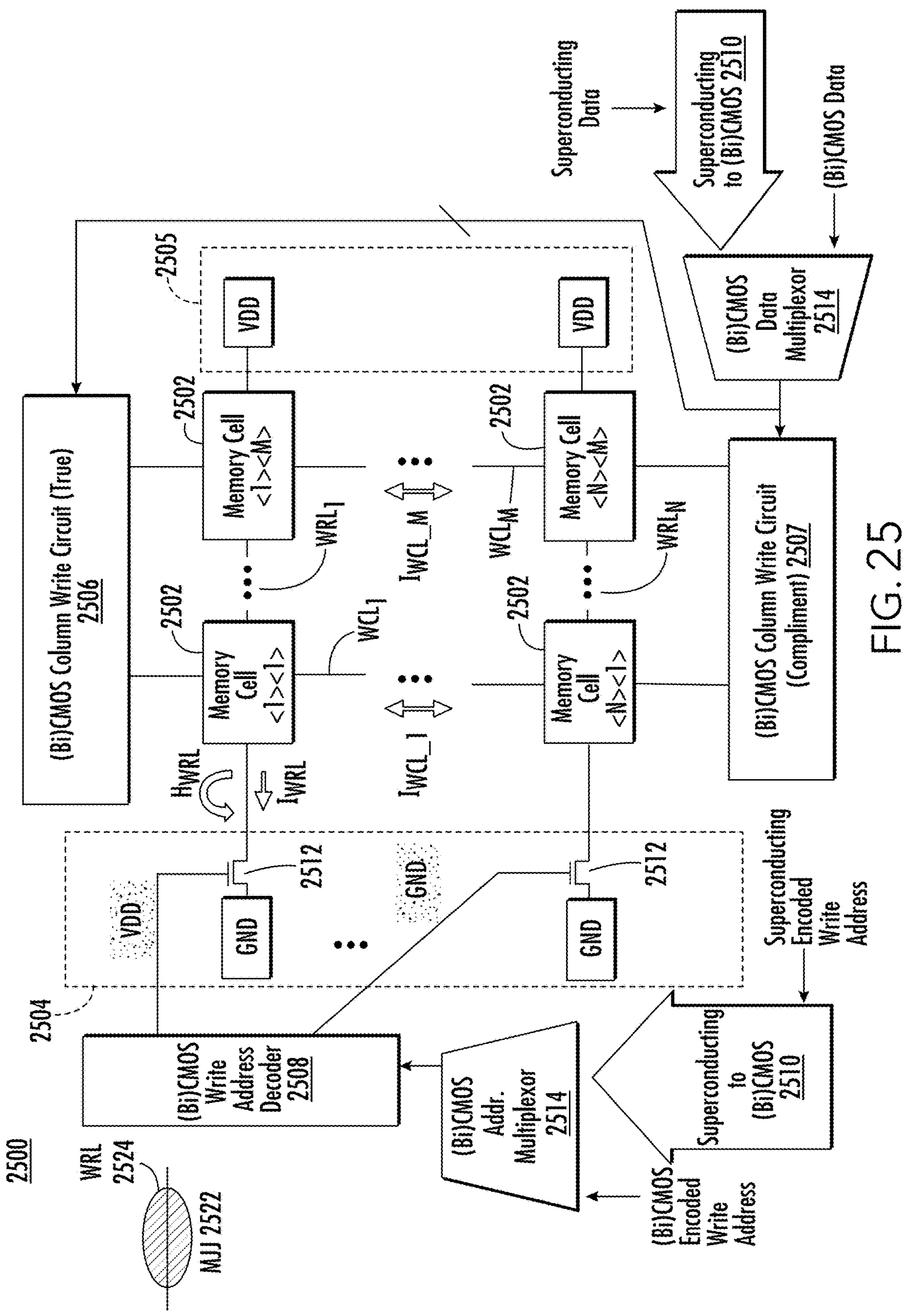
FIG. 25 is a schematic diagram depicting at least a portion of an exemplary mixed superconducting and (Bi)CMOS write circuit, according to one or more embodiments of the present invention.

FIG. 25 is a schematic diagram depicting at least a portion of an exemplary mixed superconducting and (Bi)CMOS write circuit 2500, according to another embodiment of the present disclosure. The write circuit 2500 is configured in a manner consistent with the illustrative write circuit 2300 shown in FIG. 23A, except that write circuit 2500 employs (Bi)CMOS column write circuits, including true and complement (Bi)CMOS column write circuits 2506 and 2507, respectively, and at least one (Bi)CMOS row write circuit 2504 for controlling currents in corresponding write column lines, $WCL_1$ through $WCL_M$, and write row lines, $WRL_1$ through $WRL_N$. The (Bi)CMOS row and column circuits may be configured to function in a manner similar to the row and column write circuits depicted in FIG. 23A.

The write circuit 2500 further includes multiplexers 2514 operatively connected to the (Bi)CMOS column write circuits 2506, 2507, and to a (Bi)CMOS address decoder 2508, the (Bi)CMOS address decoder being configured to generate a plurality of control signals for controlling NFETs 2512, or other switching elements, in the (Bi)CMOS row write circuit 2504 for selecting a corresponding one of the write row lines $WRL_1$ through $WRL_N$ for conveying a write row line current, $I_{WRL}$. A first one of the (Bi)CMOS multiplexers 2514 includes a first input port configured to receive a (Bi)CMOS encoded write address, and a second input port configured to receive a superconducting encoded write address generated by a first superconducting-to-(Bi)CMOS conversion circuit 2510. The first conversion circuit 2510 may be configured in a manner consistent with the conversion circuit 2310 shown in FIG. 23A. An output port of the first (Bi)CMOS multiplexer 2514 may be configured to generate an address signal supplied to the write address decoder 2508 for selecting a given one of the write row lines.

Likewise, a second one of the (Bi)CMOS multiplexers 2514 includes a first input port configured to receive a (Bi)CMOS data signal supplied thereto, and a second input port configured to receive a superconducting data signal, which may be generated by a second superconducting-to-(Bi)CMOS conversion circuit 2510. The second conversion circuit 2510 may be configured in a manner consistent with the conversion circuit 2310 shown in FIG. 23A. An output port of the second (Bi)CMOS multiplexer 2514 may be configured to generate a data signal supplied to the (Bi) CMOS column write circuit 2507 for writing state into a selected memory cell or cells 2502.

Figure 26A:
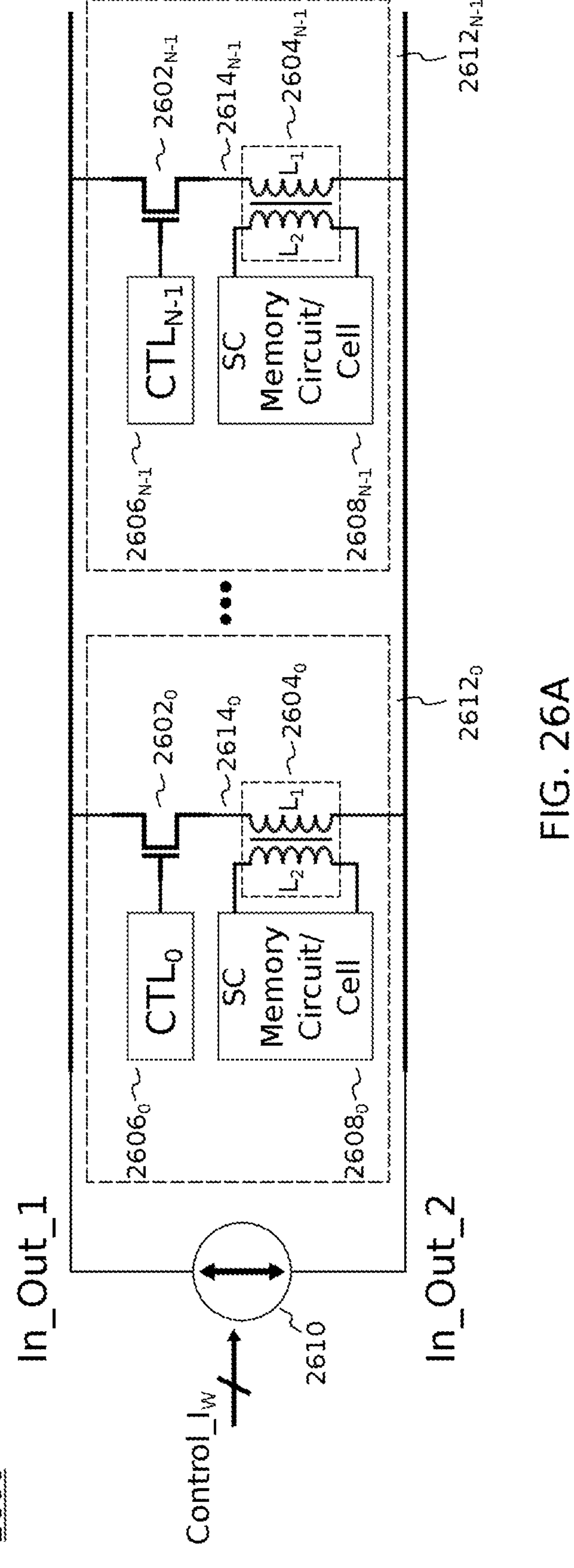
FIG. 26A is a schematic diagram depicting at least a portion of an exemplary write circuit for writing state into superconducting memory cells, according to one or more embodiments of the present invention.

FIG. 26A is a schematic diagram depicting at least a portion of an exemplary write circuit 2600 for writing state into superconducting memory cells, which may comprise JJ- and FET-based superconducting memory cells, according to one or more embodiments of the present invention. The write circuit 2600 preferably includes one or more write column switches 2602, each of which, in one or more embodiments, may comprise an NFET or other (Bi)CMOS device, one or more transformers 2604, connected to a corresponding write line $\mathbf{2614}_0$ through $\mathbf{2614}_{N-1}$, where N is an integer, one or more superconducting memory cells (or elements) $\mathbf{2608}_0$ through $\mathbf{2608}_{N-1}$ (collectively, 2608) (e.g., JJ-based and FET-based, rather than MJJ-based) which retain written state, and a current source 2610 configured to supply a write current, $I_W$, for writing the states of the memory cells $\mathbf{2608}_0$ through $\mathbf{2608}_{N-1}$. In one or more embodiments, the current source 2610 may be configured to generate a bidirectional write current $I_W$ having a current level and direction (positive or negative) that is controllable as a function of at least one control signal, Control_$I_W$, supplied to the current source (e.g., a programmable current source). It is to be appreciated that, in one or more embodiments, the current source 2610 may reside in a room temperature thermal environment (i.e., room temperature layer), or in another environment external to the rest of the write circuit 2600.

Each of at least a subset of the write lines passing through memory cells $\mathbf{2614}_0$ through $\mathbf{2614}_{N-1}$ may include a corresponding one of the superconducting memory cells $\mathbf{2608}_0$ through $\mathbf{2608}_{N-1}$, which retains written state, integrated with a corresponding write line switch 2602 and transformer 2604. Specifically, assuming an NFET implementation for the write line switches, each of at least a subset of the write lines $\mathbf{2614}_0$ through $\mathbf{2614}_{N-1}$ may include an NFET 2602 having a first source/drain connected to a first terminal of the write current source 2610 via a first interconnection, In_Out_1, a second source/drain connected to a first terminal of a primary winding (i.e., inductor or coil), $L_1$, of the transformer 2604, and a gate configured to receive a corresponding one of a plurality of control signals ($CTL_0$ through $CTL_{N-1}$) $\mathbf{2606}_0$ through $\mathbf{2606}_{N-1}$. A second terminal of the primary inductor $L_1$ of the transformer 2604 in each of at least the subset of write lines $\mathbf{2614}_0$ through $\mathbf{2614}_{N-1}$ may be connected to a second terminal of the current source 2610 via a second interconnection, In_Out_2.

Write current $I_W$ flowing through the primary inductor $L_1$ in a given one of the transformers 2604 will induce a proportional write current to flow in a secondary winding (i.e., inductor or coil), $L_2$, of the transformer 2604 through the principle of mutual inductance. This proportional write current will have an amplitude and direction that is a function of the amplitude and direction of the write current flowing in the corresponding write column line, as well as a ratio of the number of turns of the secondary winding to the number of turns of the primary winding (flux ratio, or equivalently, the wires' mutual inductance). Each of the memory cells (or memory elements) $\mathbf{2608}_0$ through $\mathbf{2608}_{N-1}$ is connected to the secondary inductor $L_2$ of the transformer 2604 in a corresponding one of the write column lines, and the proportional write current supplied by secondary inductor $L_2$ of the transformer is used to write state into the memory cell.

In the exemplary write circuit 2600, the current source 2610 provides a write current $I_W$ from the first interconnection In_Out_1, through the NFET 2602 (configured as a write column switch) and transformer 2604 in at least a selected one of the write column lines $WCL_0$ through $WCL_{N-1}$, and returning to the current source 2610 through the second interconnection In_Out_2, or vice versa (depending on the direction of the write current). The current source 2610 can provide a temporary DC current or it can provide a more complex current signal with AC and DC components. Thus, integrated in each of at least a subset of the write lines $\mathbf{2614}_0$ through $\mathbf{2614}_{N-1}$ connected between the two interconnections In_Out_1 and In_Out_2, is a series-connected (Bi)CMOS switch (i.e., gate element) 2602 and a transformer 2604, in which its primary inductor $L_1$ can be a regular conductor or a superconductor, but in which its secondary inductor $L_2$ is a superconducting inductor.

In broader language, each write column line may comprise a (Bi)CMOS gate circuit (2602) which includes a transformer (2604) that is also an integral part of the superconducting memory cell (2608). In a basic operation of the write circuit 2600, the write current $I_W$ supplied by the current source 2610 is selectively gated by the transistor 2602 (as a function of the applied control signal 2606) and flows through the primary inductor $L_1$ of the transformer 2604 in the selected write column line. This current flowing through the primary inductor $L_1$ in the transformer 2604 induces a time-varying voltage and/or constant phase differential across the secondary inductor $L_2$ of transformer 2604, which is then applied to the rest of the superconducting memory cell 2608.

Figure 26B:
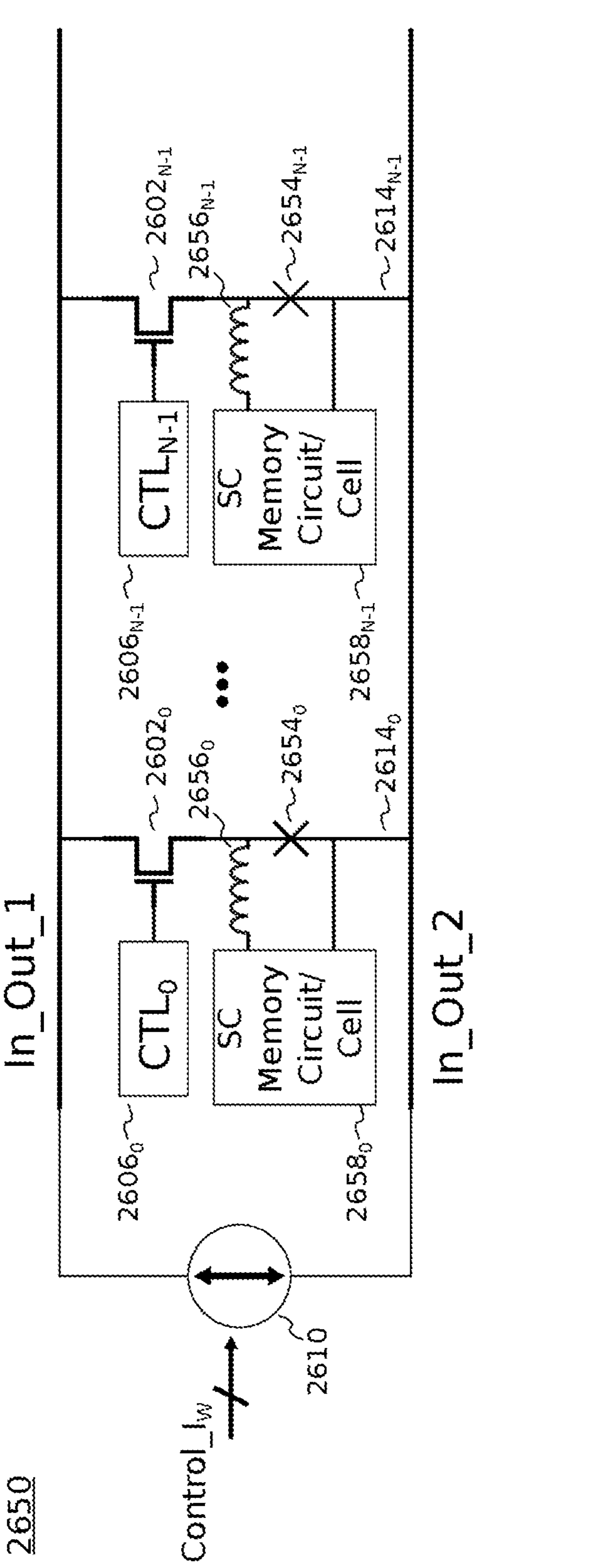
FIG. 26B is a schematic diagram depicting at least a portion of an exemplary write circuit for writing state into superconducting memory cells, according to one or more embodiments of the present invention.

FIG. 26B is a schematic diagram depicting at least a portion of an exemplary write circuit 2650 for writing state into superconducting memory cells, according to one or more alternative embodiments of the present invention. Like the illustrative write circuit 2600 shown in FIG. 26A, the exemplary write circuit 2650 of FIG. 26B preferably includes one or more write line switches 2602, each of which, in one or more embodiments, may comprise an NFET or other (Bi)CMOS device, connected in a corresponding write line, $\mathbf{2614}_0$ through $\mathbf{2614}_{N-1}$, where N is an integer, one or more superconducting memory cells $\mathbf{2658}_0$ through $\mathbf{2658}_{N-1}$ (collectively, 2658) (e.g., JJ-based and FET-based, rather than MJJ-based) which retain written state, and a current source 2610 configured to supply a write current, $I_W$, for writing the respective states of the memory cells $\mathbf{2658}_0$ through $\mathbf{2658}_{N-1}$. As previously explained, the current source 2610 may be configured to generate a bidirectional write current $I_W$ having a current level and direction (positive or negative) that is controllable as a function of at least one control signal, Control_$I_W$, supplied to the current source. It is to be appreciated that, in one or more embodiments, the current source 2610 may reside in a room temperature thermal environment (i.e., room temperature layer), or in another environment external to the rest of the write circuit 2650.

Rather than including a transformer, as in the illustrative write circuit 2600 of FIG. 26A, each of at least a subset of the write lines $\mathbf{2614}_0$ through $\mathbf{2614}_{N-1}$ in the exemplary write circuit 2650 may include a Josephson junction 2654 and a superconducting inductor 2656 integrated with a corresponding one of the superconducting memory cells $\mathbf{2658}_0$ through $\mathbf{2658}_{N-1}$ and configured to selectively direct single-flux voltage pluses (collectively generating a current pulse within the superconducting inductor 2656), originating in current source 2610, to its associated superconducting memory cell $\mathbf{2658}_0$ through $\mathbf{2658}_{N-1}$.

Specifically, each of at least a subset of the write column lines $WCL_0$ through $WCL_{N-1}$ includes, integrated therein, the write column switch 2602, which may comprise an NFET having a first source/drain connected to a first terminal of the current source 2610 via a first interconnection, In_Out_1, a second source/drain connected to a first terminal of the superconducting inductor 2656 and a first terminal of the Josephson junction 2654, and a gate adapted to receive a corresponding one of a plurality of control signals ($CTL_0$ through $CTL_{N-1}$) $\mathbf{2606}_0$ through $\mathbf{2606}_{N-1}$, where N is an integer. A second terminal of the superconducting inductor 2656 is connected to a first terminal of a corresponding one of the superconducting memory cells $\mathbf{2658}_0$ through $\mathbf{2658}_{N-1}$, and a second terminal of the Josephson junction 2654 is connected to a second terminal of the corresponding one of the memory cells $\mathbf{2658}_0$ through $\mathbf{2658}_{N-1}$. A second terminal of the current source 2610 is connected to the second terminal of each of at least the subset of the plurality of superconducting memory cells $\mathbf{2658}_0$ through $\mathbf{2658}_{N-1}$ and to the second terminal of each of at least the subset of the plurality of Josephson junctions 2654 in the write lines $\mathbf{2614}_0$ through $\mathbf{2614}_{N-1}$ via a second interconnection, In_Out_2.

The exemplary write circuit 2650 of FIG. 26B is arranged similarly to the illustrative write circuit 2600 shown in FIG. 26A, except that the transformer 2605 in each of at least a subset of the write lines $\mathbf{2614}_0$ through $\mathbf{2614}_{N-1}$ in the write circuit 2600 has been replaced by a Josephson junction 2654 and superconducting inductor 2656, as previously described. Here, a write current signal supplied from the current source 2610 is passed through the Josephson junction 2654 directly. As will be known by those skilled in the art, a carefully selected current signal through a Josephson junction 2654 of appropriate critical current can produce discreet single-flux quantum pulses at a desired interval. These quantized pulses are provided to the superconducting memory cell 2658, via the superconducting inductor 2656, which can be of much different design and/or construction (e.g., optimized for a galvanically coupled input rather than an inductively coupled input as in the write circuit 2600). As is known in the art, a multitude of single-flux quantum pulses can be stored in a superconducting inductor and released onto a transmission line with a control signal. The superconducting inductor 2656 itself can be designed to be the storage inductor for these stored pulses. This illustrative embodiment of the write circuit 2650 can provide benefits in speed and/or accuracy in generating such stored single-flux quantum pulses.

Figure 27:
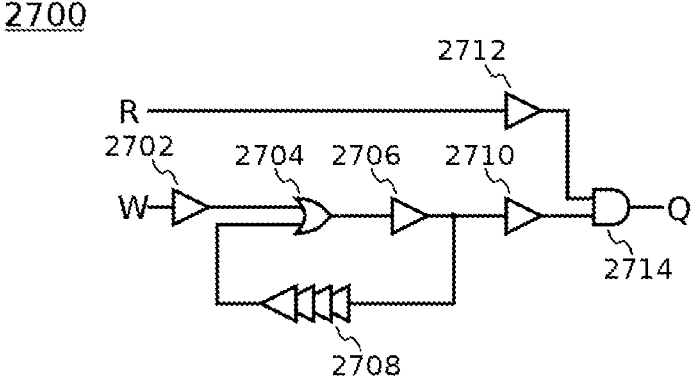
FIG. 27 is a schematic diagram depicting at least a portion of an exemplary read-only memory (ROM) circuit, according to one or more embodiments of the invention.

FIG. 27 is a schematic diagram depicting at least a portion of an exemplary read-only memory (ROM) circuit 2700, according to one or more embodiments of the invention. The ROM circuit 2700, in one or more embodiments, may be programmed only once after each cooldown, and is suitable for use with the illustrative write system 2600 of FIG. 26A. More particularly, the ROM circuit 2700 may include a read port (i.e., input), R, a write port, W, and an output port, Q. A write signal supplied to the write port W of the ROM circuit 2700 is preferably passed through a first Josephson transmission line (JTL) 2702, which feeds into one of the inputs of a logical OR gate 2704. An output of the OR gate 2704 feeds into a second JTL 2706, which is configured to amplify the signal. The amplified output signal from the second JTL 2706 is split along two signal paths; a first portion of the split signal is fed to JTL-based delay line 2708, and a second portion of the split signal is fed to a third JTL 2710.

In one or more embodiments, the JTL-based delay line 2708 is configured to delay the second portion of the output signal from the second JTL 2706 by one clock cycle before feeding it into a second input of the OR gate 2704. Configured in this manner, an output from the third JTL 2710 fed to a first input of a logical AND gate 2714 will always be a logical one if a logical one has been applied at the write port W.

A read signal supplied to the read port R of the ROM circuit 2700 is preferably passed through a fourth JTL 2712, which is then fed to a second input of the AND gate 2714. The AND gate 2714 will output a logical one signal on the output port Q of the ROM circuit 2700 if and only if both a read signal (logical one) from the read port R has been received during that clock cycle and if a logical one signal has appeared on the write port W.

A logical zero is established differently, as an initial state of the ROM circuit 2700 at cooldown. In the exemplary ROM circuit 2700, as in many superconducting logic circuits, upon cooldown the circuit is in a logical zero state. In ROMs, as well as other superconducting memory circuits, such as, but not limited to, field-programmable gate arrays (FPGAs), or programmable logic arrays (PLAs), where a (Bi)CMOS input writes the memory circuit (e.g., ROM circuit 2700) once and only once at the beginning of operation, applying a flux quantum(s) or not, no mechanism is needed to re-write the memory cells in the ROM circuit 2700 to a zero state during system operation. A temperature cycling of the system to temperatures that do not support superconductivity (i.e., above a critical temperature) can reset all the memory cells in the superconducting memory circuit to logical zero states.

Figure 28:
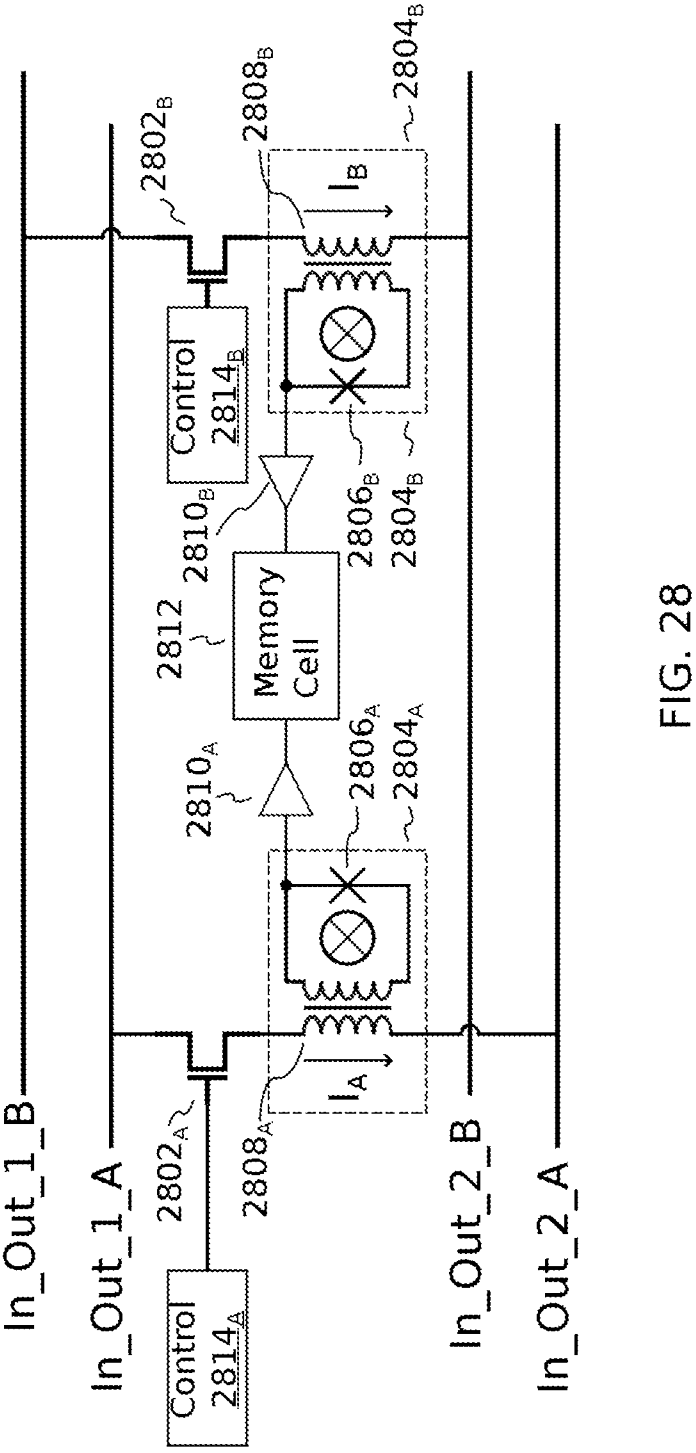
FIG. 28 is a schematic diagram depicting at least a portion of an exemplary write circuit for writing state into superconducting memory cells, according to one or more embodiments of the invention.

FIG. 28 is a schematic diagram depicting at least a portion of an exemplary write circuit 2800 for writing state into superconducting memory cells, according to one or more embodiments of the invention. Although the write circuit 2800 depicts only a single memory cell for clarity of description, it is to be understood that the write circuit 2800 may be configured for use with a plurality of memory cells, as will become apparent to those skilled in the art given the teachings herein.

With reference to FIG. 28, the exemplary write circuit 2800 preferably includes at least a first (Bi)CMOS switch $\mathbf{2802}_A$, which may comprise a first NFET, and a second (Bi)CMOS switch $\mathbf{2802}_B$, which may comprise a second NFET. The first and second (Bi)CMOS switches $\mathbf{2802}_A$ and $\mathbf{2802}_B$ are preferably adapted to receive corresponding control signals, $\mathbf{2814}_A$ and $\mathbf{2814}_B$, respectively, for selectively activating the switches. In some embodiments, the control signals $\mathbf{2814}_A$ and $\mathbf{2814}_B$ may be the same signal. The write circuit 2800 may further include at least a first transformer $\mathbf{2808}_A$ and a second transformer $\mathbf{2808}_B$, at least a first Josephson junction $\mathbf{2806}_A$ and a second Josephson junction $\mathbf{2806}_B$, each of which may be integrated with a corresponding transformer $\mathbf{2808}_A$, $\mathbf{2808}_B$, at least a first JTL $\mathbf{2810}_A$ and a second JTL $\mathbf{2810}_B$, and at least one superconducting memory cell 2812 (e.g., JJ-and-FET-based, rather than MJJ-based). Each superconducting memory cell 2812, which retains written state, may be integrated with its corresponding write circuit elements (e.g., first and second NFET switches $\mathbf{2802}_A$, $\mathbf{2802}_B$, first and second transformers $\mathbf{2808}_A$, $\mathbf{2808}_B$, first and second Josephson junctions $\mathbf{2806}_A$, $\mathbf{2806}_B$, and first and second JTLs $\mathbf{2810}_A$, $\mathbf{2810}_B$).

More particularly, the first NFET switch $\mathbf{2802}_A$ may include a first source/drain connected to a first interconnection (i.e., bus), In_Out_1_A, a second source/drain connected to a first terminal of a primary winding (i.e., inductor or coil) of the corresponding first transformer $\mathbf{2808}_A$, and a gate adapted to receive the corresponding control signal $\mathbf{2814}_A$. A second terminal of the primary inductor of the first transformer $\mathbf{2808}_A$ may be connected to a second interconnection, In_Out_2_A. Likewise, the second NFET switch $\mathbf{2802}_B$ may include a first source/drain connected to a third interconnection, In_Out_1_B, a second source/drain connected to a first terminal of a primary winding (i.e., inductor or coil) of the corresponding second transformer $\mathbf{2808}_B$, and a gate adapted to receive the corresponding control signal $\mathbf{2814}_B$. A second terminal of the primary inductor of the second transformer $\mathbf{2808}_B$ may be connected to a fourth interconnection, In_Out_2_B.

In one or more embodiments, two pairs of interconnections, preferably In_Out_1_A and In_Out_1_B, and/or In_Out_2_A and In_Out_2_B, may be connected in common (and also to ground). The interconnections In_Out_1_A, In_Out_2_A, In_Out_2_A, In_Out_2_B can be formed of regular conductors and need not be formed of superconductors, although embodiments of the invention contemplate that one or more of the interconnections may comprise superconductors.

Although not shown explicitly in FIG. 28, at least first and second current sources, which can be implemented as bidirectional programmable current sources in a manner consistent with the current source 2610 shown in FIG. 26, may be connected to the exemplary write circuit 2800 and configured to supply a write current for writing state into the memory cell 2812. It is to be appreciated that the first and second current sources are not required to be bidirectional, although the illustrative arrangement shown in FIG. 28 may benefit from having bidirectional current sources. The first current source may be connected across the first and second interconnections, In_Out_1_A and In_Out_2_A, and the second current source may be connected across the third and fourth interconnections, In_Out_1_B and In_Out_2_B. The first and second current sources may preferentially reside in a room temperature thermal environment (i.e., room temperature layer).

A secondary winding (i.e., inductor or coil) of the first transformer $\mathbf{2808}_A$ may be connected across the first Josephson junction $\mathbf{2806}_A$, such that a first terminal of the secondary inductor of the first transformer $\mathbf{2808}_A$ is connected to a first terminal of the first Josephson junction $\mathbf{2806}_A$, and a second terminal of the secondary inductor of the first transformer $\mathbf{2808}_A$ is connected to a second terminal of the first Josephson junction $\mathbf{2806}_A$. The first transformer $\mathbf{2808}_A$ and the first Josephson junction $\mathbf{2806}_A$ may be integrated together to form a first radio frequency (RF) superconducting quantum interference device (SQUID) $\mathbf{2804}_A$. Likewise, a secondary winding (i.e., inductor or coil) of the second transformer $\mathbf{2808}_B$ may be connected across the second Josephson junction $\mathbf{2806}_B$, such that a first terminal of the secondary inductor of the second transformer $\mathbf{2808}_B$ is connected to a first terminal of the second Josephson junction $\mathbf{2806}_B$, and a second terminal of the secondary inductor of the second transformer $\mathbf{2808}_B$ is connected to a second terminal of the second Josephson junction $\mathbf{2806}_B$. The second transformer $\mathbf{2808}_B$ and the second Josephson junction $\mathbf{2806}_B$ may be integrated together to form a second RF SQUID $\mathbf{2804}_B$.

The first JTL $\mathbf{2810}_A$ may include an input connected to the first RF SQUID $\mathbf{2804}_A$ and an output connected to the corresponding superconducting memory cell 2812. Similarly, the second JTL 2810 may include an input connected to the second RF SQUID $\mathbf{2804}_B$ and an output connected to the memory cell 2812. The first and second JTLs $\mathbf{2810}_A$, $\mathbf{2810}_B$ are preferably configured to direct flux (e.g., by collectively generating current pulses through the JTLs $\mathbf{2810}_A$, $\mathbf{2810}_B$), originating in the first and second current sources, selectively to the associated memory cell 2812.

It is to be appreciated that the exemplary write circuit 2800 shown in FIG. 28 depicts an arrangement in which two (Bi)CMOS switches (e.g., NFETs $\mathbf{2802}_A$ and $\mathbf{2802}_B$) are utilized to apply datum and write enable signals to write state into each superconducting memory cell 2812. In one or more embodiments, the control signal(s) $\mathbf{2814}_A$, $\mathbf{2812}_B$ select the corresponding memory cell 2812 for a write operation by connecting the first write current source (not explicitly shown in FIG. 28, but implied), connected between the first and second interconnections In_Out_1_A, In_Out_2_A, to the first RF SQUID $\mathbf{2804}_A$, and by connecting the second write current source (not explicitly shown in FIG. 28, but implied), connected between the third and fourth interconnections In_Out_1_B, In_Out_2_B, to the second RF SQUID $2804_B$ (each of the SQUIDs including a transformer (2808) and a Josephson junction (2806)).

Figure 29:
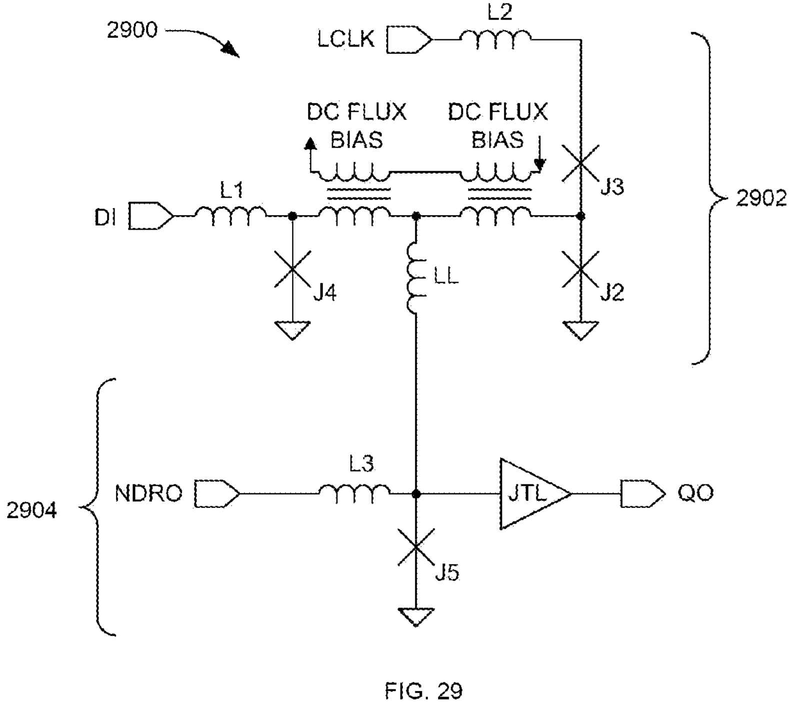
FIG. 29 is a schematic diagram depicting a conventional core memory cell which is suitable for use in conjunction with the illustrative write circuit shown in FIG. 28.

FIG. 29 is a schematic diagram depicting a conventional core memory cell 2900 which is suitable for use in conjunction with the illustrative write circuit 2800 shown in FIG. 28. Details of the memory cell 2900 are provided in U.S. Pat. No. 10,554,207 to A. Herr, et. al., the disclosure of which is incorporated by reference herein in its entirety for all purposes. The memory cell 2900, which includes a "body" section 2902 and a "tail" section 2904, utilizes two write signals received on data and clock input ports DI and LCLK, respectively. A read input port, NDRO, and a data output port, QO, are entirely superconducting in a ROM array and are therefore not shown in the exemplary write circuit 2800 of FIG. 28. As will be appreciated by those skilled in the art, certain input(s) and/or output(s) that may otherwise be present in an actual implementation of one or more of the illustrative circuits according to embodiments of the invention described herein may be omitted for brevity and clarity purposes.

An exemplary write cycle operation using the illustrative write circuit 2800 shown in FIG. 28, for writing state into the memory cell 2900 of FIG. 29 (as the memory cell 2812), will now be described, according to one or more embodiments of the invention. With reference to FIGS. 28 and 29, in the exemplary write cycle, the data and clock input ports DI and LCLK, respectively, of the memory cell 2900 are asserted to write a logical "high" value as the body-stored state and enable the reading out of this state to the data output port QO. In the context of the write circuit 2800, these signals are asserted by providing appropriate write currents through the interconnections In_Out_1_A and In_Out_1_B, respectively, and by concurrently enabling control signals $2814_A$ and $2814_B$, respectively. The write currents, applied to the RF SQUIDs $2804_A$ and $2804_B$, respectively, will generate SFQ pulses applied to the JTLs $2810_A$ and $2810_B$, respectively, which are then supplied to the data and clock input ports DI and LCLK, respectively, of the memory cell 2900.

The superconducting phase of Josephson junction J2 in the memory cell 2900 transitions high (e.g., logic "1") (e.g., to $2\pi$ radians) in response to the write-enabling signal provided on the logical clock input port LCLK going high. The superconducting phase of Josephson junction J2 stays high after an assertion SFQ pulse supplied to the data input port DI triggers Josephson junction J4. When the clock input port LCLK transitions low, the high superconducting phase of state-storing Josephson junction J2 is maintained. Rather than Josephson junction J2 untriggering, Josephson junction J3 (which may be an "escape" Josephson junction) triggers. The combination of the logical clock input LCLK going high and the data input DI going high places the memory cell 2900 into a "write 1" state, thereby causing a logical "1" to be written to the body-stored state by maintaining Josephson junction J2 in a $2\pi$-radian superconducting phase. As long as long as Josephson junction J2 remains in a high state of $2\pi$ radians, it provides pre-critical bias current to Josephson junction J5 in the tail section 2904 of the memory cell 2900, thereby preparing Josephson junction J5 to propagate any pulse it receives at the read input port NDRO to the data output port QO. Writing the memory cell 2900 to a "write 0" state is similarly explained in the art.

In this example, a signal applied from the transistor/transformer line (e.g., NFET $2802_A$/transformer $2808_A$, or NFET $2802_B$/transformer $2808_B$ in FIG. 28) is coupled into a corresponding RF SQUID (e.g., RF SQUID $2804_A$, $2804_B$ in FIG. 28). Such an arrangement can be used to generate SFQ pulses, which are then provided to the rest of the superconducting memory cell (e.g., 2812 in FIG. 28). Such a rf SQUID can be designed to provide a desired data encoding of choice; that is, careful selection of the inductance value of the secondary transformer coil and the critical current of the Josephson junction, can allow both of the following behaviors which may be of interest. In one case, the rf SQUID can be designed so that a signal of sufficient strength produces a single SFQ pulse, and then no others even when the signal is removed. In another case, the start of the signal can produce a positive SFQ pulse, and when removed produce a negative SFQ pulse. Both these, or any other number of pulse generation patterns (i.e., encodings), can be useful depending on the requirements of the associated memory cell. This arrangement is compatible with any component that turns the applied primary transformer current into a phase or voltage signal in the superconducting logic circuit.

As is known in the art, a similar arrangement of several transistors can provide a push/pull configuration (already shown in FIG. 13 to provide current through the primary transformer coil. Similarly, any number of transistor/transformer pair lines can be used to apply signals to a single superconducting circuit. For superconducting memory cells requiring different or separate signals to write the first or second logic state, multiple transistor/transformer pair lines can be allocated to a single superconducting memory cell.

The write circuit arrangement according to embodiments of the invention beneficially provides a means of using CMOS or (Bi)CMOS circuits to provide a written data pattern to the whole of a superconducting memory array, write the data into the array elements (the superconducting memory circuits), and then remove CMOS transient data signals and turn off the CMOS circuitry. The superconducting memory array can then be read or written as needed. This limits the power consumption of the CMOS operation to only an isolated period of time. For an array that need only be written once, but read often, this arrangement allows a single high-power write and any number of subsequent low-power reads. If no write operations are performed after the initial write, the size and complexity of the memory circuit can be reduced from a typical read-and-write superconducting memory cell.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures or devices illustrated in the accompanying figures, or portions thereof, may be part of an integrated circuit. Integrated circuits so manufactured are considered part of this invention.

Those skilled in the art will appreciate that the exemplary devices, structures and circuits discussed above can be distributed in raw form (i.e., a single wafer having multiple unpackaged chips), as bare dies, in packaged form, or incorporated as parts of intermediate products or end products that benefit from a memory device formed in accordance with one or more embodiments of the invention, such as, for example, JMRAM, etc.

An integrated circuit in accordance with aspects of the present disclosure can be employed in essentially any memory application and/or electronic system. Suitable systems for implementing embodiments of the invention may include, but are not limited to, quantum computing systems, etc. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. The term "and/or" is intended to include either of associated items, taken alone, or any combination of one or more of the associated items. Thus, for example, the phrase "A, B and/or C" as used herein is intended to mean only A, or only B, or only C, or any combination of A, B and C. Terms such as "above" and "below," where used, are intended to indicate relative positioning of elements or structures to each other as opposed to absolute position.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A write circuit for writing state into a plurality of superconducting memory cells, the write circuit comprising:
- a control circuit;
- a first plurality of write lines, each of the first plurality of write lines being configured to convey a first write current; and
- a first plurality of non-superconducting switch circuits, each of the first plurality of non-superconducting switch circuits being integrated with a corresponding one of the first plurality of write lines and being configured to receive at least a first control signal supplied by the control circuit for enabling the first write current to flow through the corresponding one of the first plurality of write lines into at least a selected one of the plurality of superconducting memory cells associated with the corresponding one of the first plurality of write lines.

2. The write circuit according to claim 1, further comprising:
- a second plurality of write lines, each of the second plurality of write lines being configured to convey a second write current; and
- a second plurality of non-superconducting switch circuits, each of the second plurality of non-superconducting switch circuits being integrated with a corresponding one of the second plurality of write lines and being configured to receive at least a second control signal supplied by the control circuit for enabling the second write current to flow through the corresponding one of the second plurality of write lines.

3. The write circuit according to claim 1, further comprising at least first and second interconnections, a first end of each of the first plurality of write lines being operably connected to the first interconnection, a second end of each of the first plurality of write lines being operably connected to a first terminal of a corresponding one of the first plurality of non-superconducting switch circuits, and a second terminal of the corresponding one of the first plurality of non-superconducting switch circuits being operably connected to the second interconnection, wherein the first and second interconnections are operably connected to first and second terminals, respectively, of at least a first current source configured to supply the first write current.

4. The write circuit according to claim 3, wherein each of at least a subset of the first plurality of non-superconducting switch circuits is operably connected in series between a corresponding one of the first plurality of write lines and at least one of the first or second interconnections.

5. The write circuit according to claim 1, wherein each of at least a subset of the first plurality of write lines is configured to pass over and/or under each of a corresponding one of the superconducting memory cells at a prescribed angle relative to a major axis of a magnetic Josephson junction of the memory cell.

6. The write circuit according to claim 2, further comprising:

first, second, third and fourth interconnections, a first end of each of the first plurality of write lines being operably connected to the first interconnection, a second end of each of the first plurality of write lines being connected to a first terminal of a corresponding one of the first plurality of non-superconducting switch circuits, a second terminal of the corresponding one of the first plurality of non-superconducting switch circuits being connected to the second interconnection, a first end of each of the second plurality of write lines being connected to the third interconnection, a second end of each of the second plurality of write lines being connected to a first terminal of a corresponding one of the second plurality of non-superconducting switch circuits, and a second terminal of the corresponding one of the second plurality of non-superconducting switch circuits being connected to the fourth interconnection;

wherein the first and second interconnections are connected to first and second terminals, respectively, of at least a first current source configured to supply the first write current, and wherein the third and fourth interconnections are connected to first and second terminals, respectively, of at least a second current source configured to supply the second write current for selecting one or more corresponding memory cells of the plurality of superconducting memory cells, wherein the second control signal supplied by the control circuit is configured to selectively enable the second write current to flow through the corresponding one of the second plurality of write lines for selecting one or more of the superconducting memory cells associated with the corresponding one of the second plurality of write lines.

7. The write circuit according to claim 2, wherein each of at least a subset of the second plurality of non-superconducting switch circuits is operably connected in series between a corresponding one of the second plurality of write lines and a current source configured to supply the second write current, wherein the second control signal supplied by the control circuit is configured to selectively enable the second write current to flow through the corresponding one of the second plurality of write lines for selecting one or more of the superconducting memory cells associated with the corresponding one of the second plurality of write lines.

8. The write circuit according to claim 1, further comprising a plurality of coupling elements, each of the coupling elements being connected in series with a given one of the first plurality of non-superconducting switch circuits in a corresponding one of the first plurality of write lines.

9. The write circuit according to claim 8, wherein each of at least a subset of the plurality of coupling elements comprises a transformer including a primary wire, connected in series with the given one of the first plurality of non-superconducting switch circuits, and a secondary wire configured to pass through or in close proximity to a corresponding one of the superconducting memory cells.

10. The write circuit according to claim 9, wherein the primary wire in each of the transformers is a non-superconducting wire and the secondary wire in each of the transformers is a superconducting wire.

11. The write circuit according to claim 1, wherein the control circuit comprises a shift register including an input port configured to receive an input data pattern to be applied to the shift register for controlling a write operation of the superconducting memory cells, wherein control signals for activating the first plurality of non-superconducting switch circuits are generated at respective outputs of the shift register.

12. The write circuit according to claim 1, wherein each of at least a subset of the plurality of superconducting memory cells comprises a magnetic Josephson junction.

13. The write circuit according to claim 1, wherein at least a given one of the first plurality of write lines is coupled to a true magnetic Josephson junction (MJJ) memory cell and a complement MJJ memory cell associated therewith, the true and complement MJJ memory cells being included in the plurality of superconducting memory cells, the given one of the first plurality of write lines being configured to convey the first write current across the true MJJ memory cell in a first direction and to convey the first write current across the complement MJJ memory cell in a second direction opposite the first direction.

14. The write circuit according to claim 1, wherein the write circuit is configurable for writing state into a single one of the plurality of superconducting memory cells at a given time.

15. The write circuit according to claim 2, further comprising:

a first radio frequency (RF) superconducting quantum interference device (SQUID) operably connected in series with a corresponding one of the first plurality of non-superconducting switch circuits;

a second RF SQUID operably connected in series with a corresponding one of the second plurality of non-superconducting switch circuits;

a first Josephson transmission line (JTL) including an input connected to the first RF SQUID and an output connected to at least a corresponding one of the plurality of superconducting memory cells; and a second JTL including an input connected to the second RF SQUID and an output connected to at least the corresponding one of the plurality of superconducting memory cells;

wherein the corresponding one of the first plurality of non-superconducting switch circuits and the first RF SQUID are connected between first and second terminals of a first write current source via first and second interconnections, respectively, and wherein the corresponding one of the second plurality of non-superconducting switch circuits and the second RF SQUID are connected between first and second terminals of a second write current source via third and fourth interconnections.

16. The write circuit according to claim 15, wherein at least one of the first or second RF SQUIDs comprises:

a transformer, the transformer including a primary coupling wire connected in series with the corresponding one of the first or second plurality of non-superconducting switch circuits, and a secondary coupling wire; and a Josephson junction, the Josephson junction including a first terminal connected to a first terminal of the secondary coupling wire of the transformer, and a second terminal connected to a second terminal of the secondary coupling wire of the transformer, wherein the first terminal of the Josephson junction is connected to the input of a corresponding one of the first or second JTLs.

17. The write circuit according to claim 1, wherein the write circuit comprises:

at least one first write circuit connected to the first plurality of write lines, the first write circuit including at least one superconducting switch circuit configured to selectively apply the first write current to at least a given one of the first plurality of write lines for writing state into one or more corresponding memory cells of the plurality of superconducting memory cells associated with the given one of the first plurality of write lines in response to the first control signal; and at least one second write circuit connected to a second plurality of write lines, each of the second plurality of write lines being configured to convey a second write line current, the second write circuit including at least one non-superconducting switch circuit configured to selectively apply the second write current to at least a given one of the second plurality of write lines for selecting one or more corresponding memory cells of the plurality of superconducting memory cells associated with the given one of the second plurality of write lines in response to at least a second control signal.

18. A write circuit for selectively writing state into a plurality of superconducting memory cells in a random-access memory, the write circuit comprising:

a first non-superconducting write circuit, the first non-superconducting write circuit being connected to one or more first write lines, each of the first write lines being configured to convey a first write current, the first non-superconducting write circuit including at least a first non-superconducting switch circuit configured to selectively apply the first write current to at least a given one of the first write lines for writing state into one or more corresponding memory cells of the plurality of superconducting memory cells associated with the given one of the first write lines in response to first non-superconducting control signal;

a second non-superconducting write circuit, the second non-superconducting write circuit being connected to one or more second write lines, each of the second write lines being configured to convey a second write current, the second write circuit including at least a second non-superconducting switch circuit configured to selectively apply the second write current to at least a given one of the second write lines for selecting one or more corresponding memory cells of the plurality of superconducting memory cells associated with the given one of the second write lines in response to a second non-superconducting control signal;

a conversion circuit, the conversion circuit being configured to receive a superconducting encoded write address and/or a superconducting data signal, and to generate the first and/or second non-superconducting control signals as a function of the superconducting encoded write address and/or the superconducting data signal.

19. The write circuit according to claim 1, further comprising one or more superconducting loops, each of the one or more superconducting loops comprising:

a Josephson junction;

an inductor; and a superconducting memory cell of the plurality of superconducting memory cells, the superconducting memory cell, the inductor and the Josephson junction being connected together in series to form the superconducting loop.

20. A method for writing state into a plurality of memory circuits, each of the memory circuits including a plurality of superconducting memory cells, the method comprising:

providing at least one non-superconducting control signal for selecting at least one memory circuit of the plurality of memory circuits for a write operation;

sourcing at least one current for writing one or more memory cells of the plurality of superconducting memory cells in the selected at least one memory circuit to a prescribed logic state;

reading a stored state of the one or more memory cells of the plurality of superconducting memory cells in the selected at least one memory circuit using superconducting circuits in the at least one memory circuit;

transferring the state of the one or more memory cells of the plurality of superconducting memory cells read from the selected at least one memory circuit to an evaluation circuit;

verifying that the stored state of the one or more memory cells read from the selected at least one memory circuit is the same as the prescribed logic state intended to be written into the one or more memory cells.

21. The write circuit according to claim 1, wherein the control circuit is configured to control writing state of the plurality of superconducting memory cells into respective superconducting loops of the superconducting memory cells by induction or coupled flux quantum injection.

22. The write circuit according to claim 1, wherein each of the plurality of superconducting memory cells is associated with one or more non-superconducting switch circuits among the first plurality of non-superconducting switch circuits.

* * * * *